United States Patent
Shen et al.

(10) Patent No.: US 12,027,368 B2
(45) Date of Patent: Jul. 2, 2024

(54) METHOD FOR FABRICATING SEMICONDUCTOR DEVICE

(71) Applicant: TAIWAN SEMICONDUCTOR MANUFACTURING COMPANY, LTD., Hsinchu (TW)

(72) Inventors: Yu-Tien Shen, Tainan (TW); Chih-Kai Yang, Taipei (TW); Hsiang-Ming Chang, Hsinchu (TW); Chun-Yen Chang, Hsinchu (TW); Ya-Hui Chang, Hsinchu (TW); Wei-Ting Chien, Hsinchu (TW); Chia-Cheng Chen, Hsinchu (TW); Liang-Yin Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 102 days.

(21) Appl. No.: 17/397,482

(22) Filed: Aug. 9, 2021

(65) Prior Publication Data
US 2022/0344153 A1  Oct. 27, 2022

Related U.S. Application Data

(60) Provisional application No. 63/178,950, filed on Apr. 23, 2021.

(51) Int. Cl.
| | |
|---|---|
| H01L 21/027 | (2006.01) |
| H01L 21/02 | (2006.01) |
| H01L 21/28 | (2006.01) |
| H01L 21/3213 | (2006.01) |
| H01L 29/66 | (2006.01) |

(52) U.S. Cl.
CPC .... *H01L 21/0274* (2013.01); *H01L 21/02359* (2013.01); *H01L 21/28088* (2013.01); *H01L 21/32133* (2013.01); *H01L 21/32139* (2013.01); *H01L 29/66545* (2013.01)

(58) Field of Classification Search
CPC ............... H01L 21/823437–823456; H01L 21/823828–82385; H01L 21/0274; H01L 21/02359; H01L 21/28088; H01L 21/32133; H01L 21/32139; H01L 29/66545

See application file for complete search history.

(56) References Cited

U.S. PATENT DOCUMENTS

| | | | | |
|---|---|---|---|---|
| 2007/0259498 A1* | 11/2007 | Chang | .............. | H01L 29/66553 |
| | | | | 257/E21.429 |
| 2008/0029483 A1* | 2/2008 | Ventzek | .............. | H01L 21/0273 |
| | | | | 156/345.35 |
| 2008/0160756 A1* | 7/2008 | Han | .................. | H01L 21/31116 |
| | | | | 257/E21.495 |

(Continued)

*Primary Examiner* — Monica D Harrison
*Assistant Examiner* — Andre C Stevenson
(74) *Attorney, Agent, or Firm* — Maschoff Brennan

(57) ABSTRACT

A method for forming a semiconductor device is provided. The method for forming a semiconductor device is provided. The method includes coating a photoresist film over a target layer; performing a lithography process to pattern the photoresist film into a photoresist layer; performing a directional ion bombardment process to the photoresist layer, such that a carbon atomic concentration in the photoresist layer is increased; and etching the target layer using the photoresist layer as an etch mask.

20 Claims, 72 Drawing Sheets

(56) References Cited

U.S. PATENT DOCUMENTS

2008/0302760 A1* 12/2008 Park ................... H01L 29/78
216/17
2012/0028434 A1* 2/2012 Lee ................ H01L 29/66606
438/694
2012/0217590 A1* 8/2012 Babich ............. H01L 29/4966
257/410

* cited by examiner

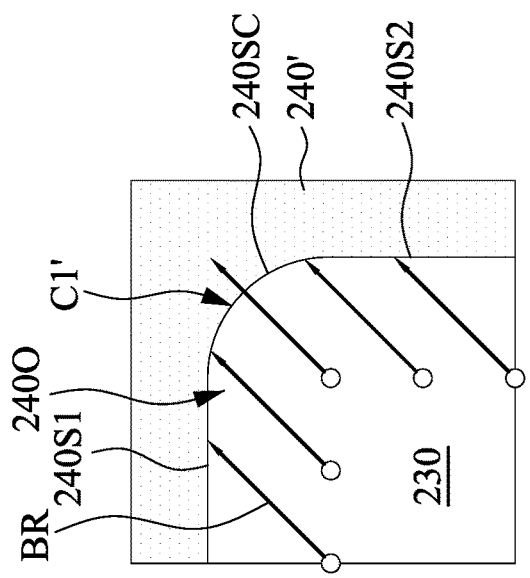
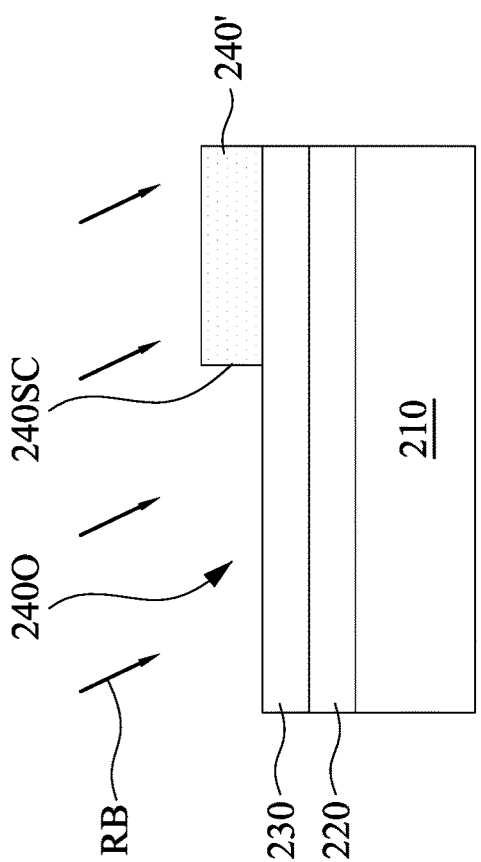
Fig. 5A
Fig. 5B

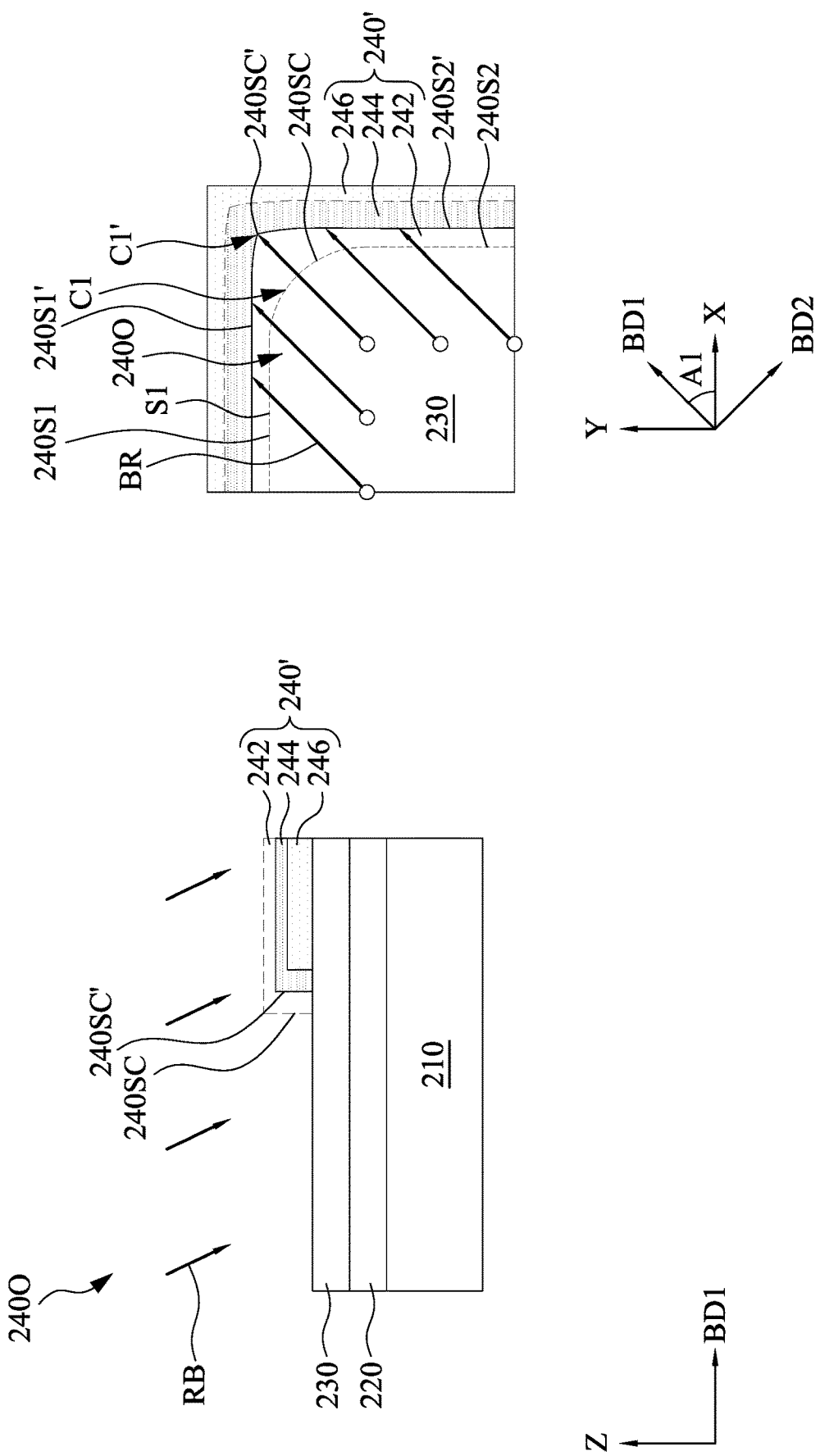

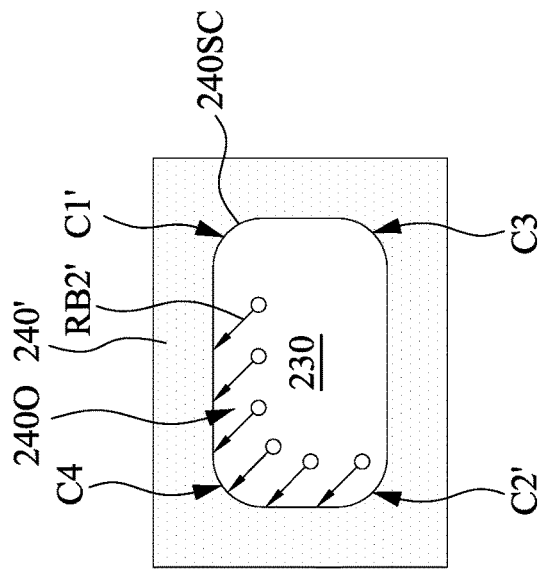
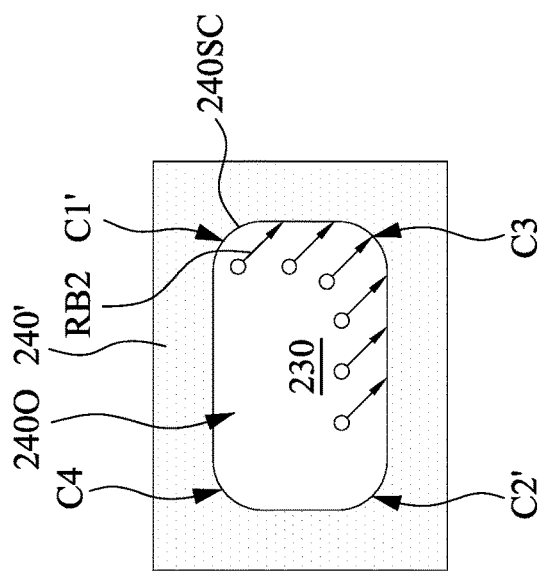
Fig. 17
Fig. 16

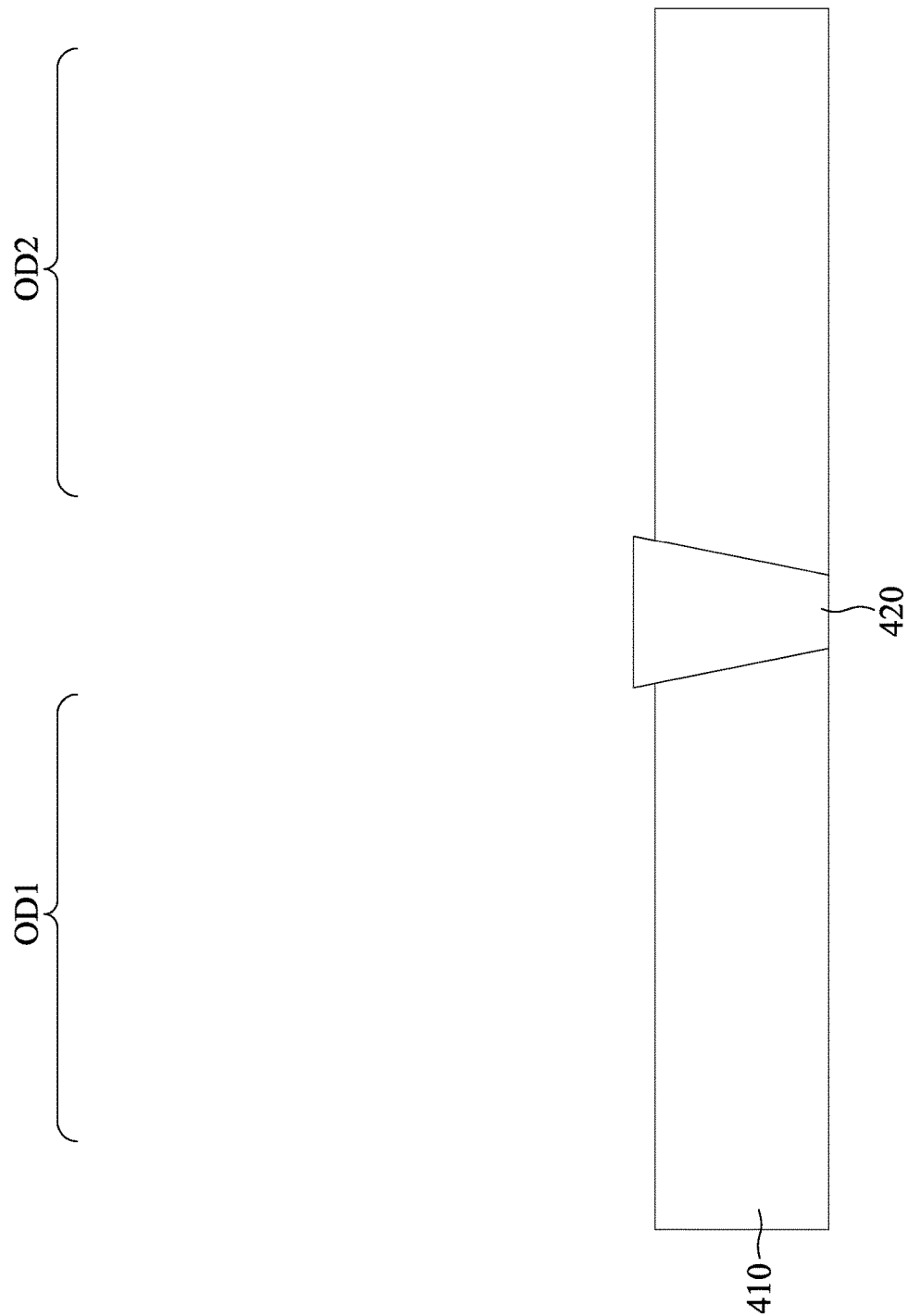

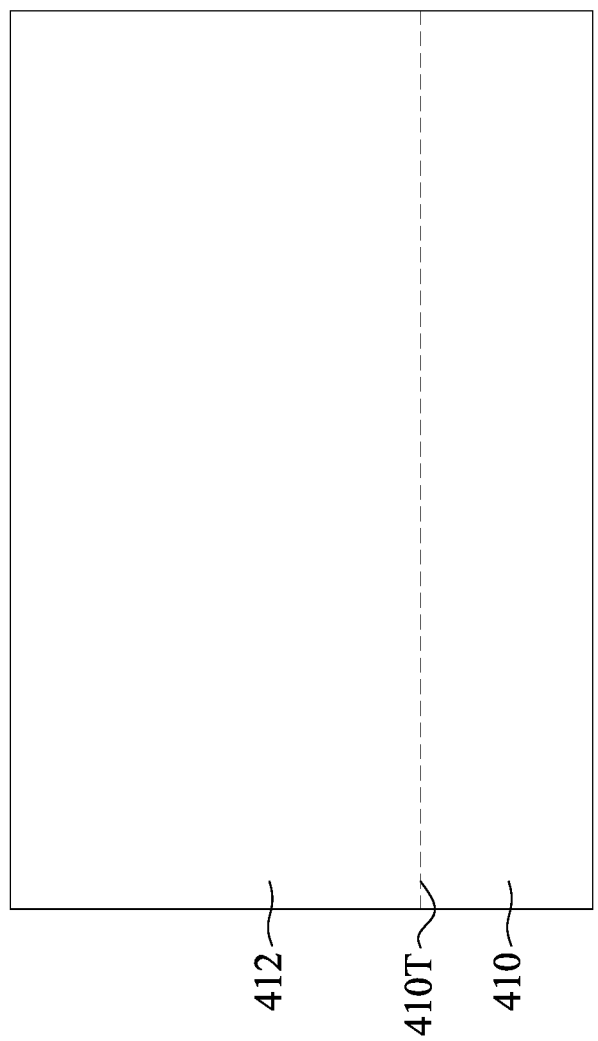

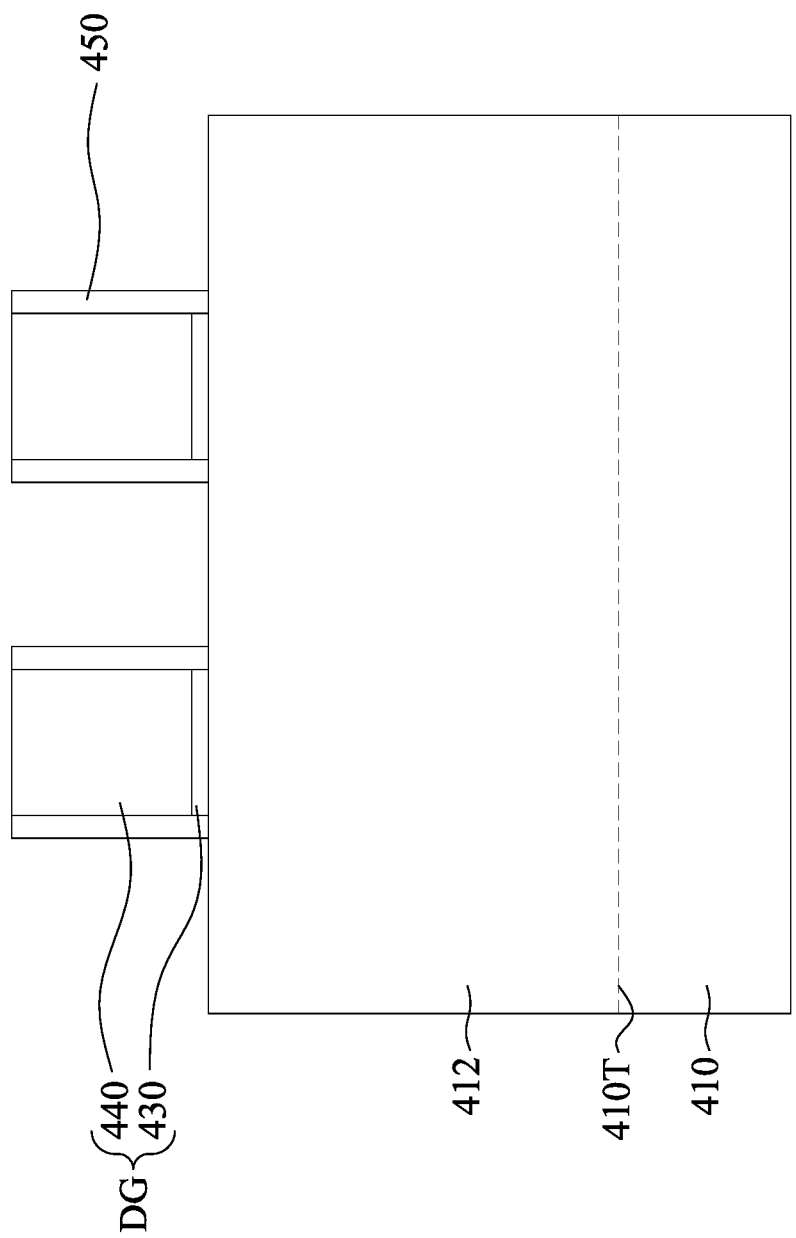

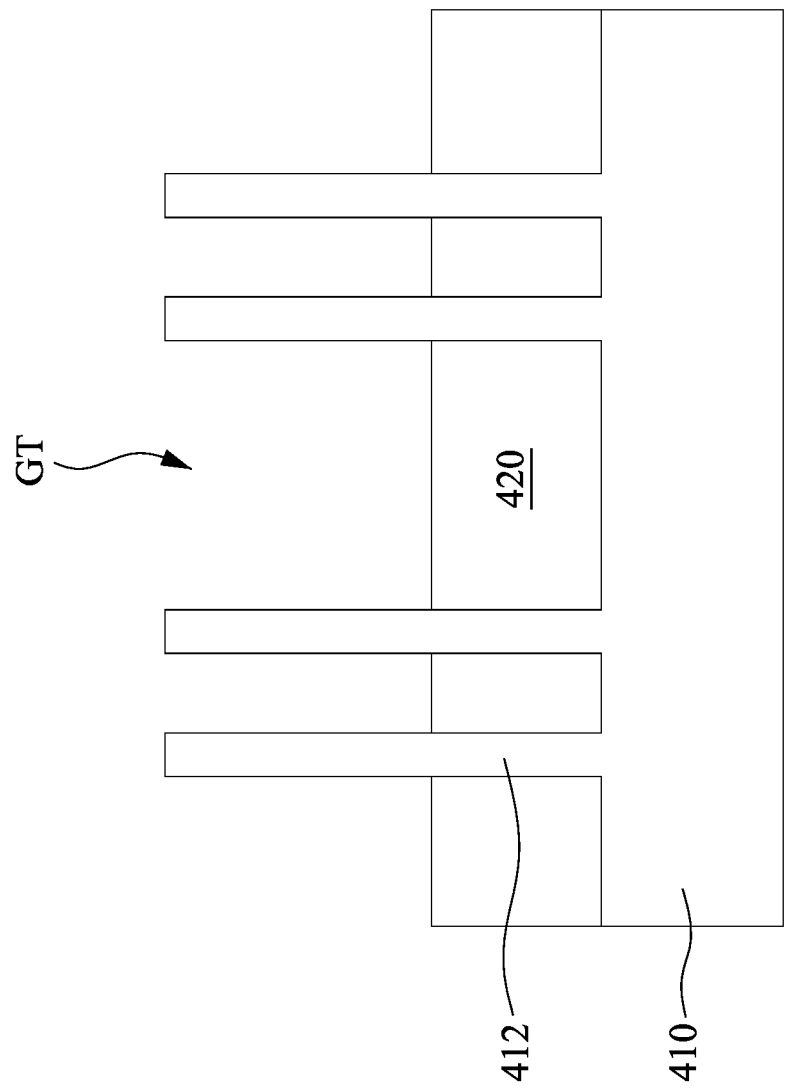

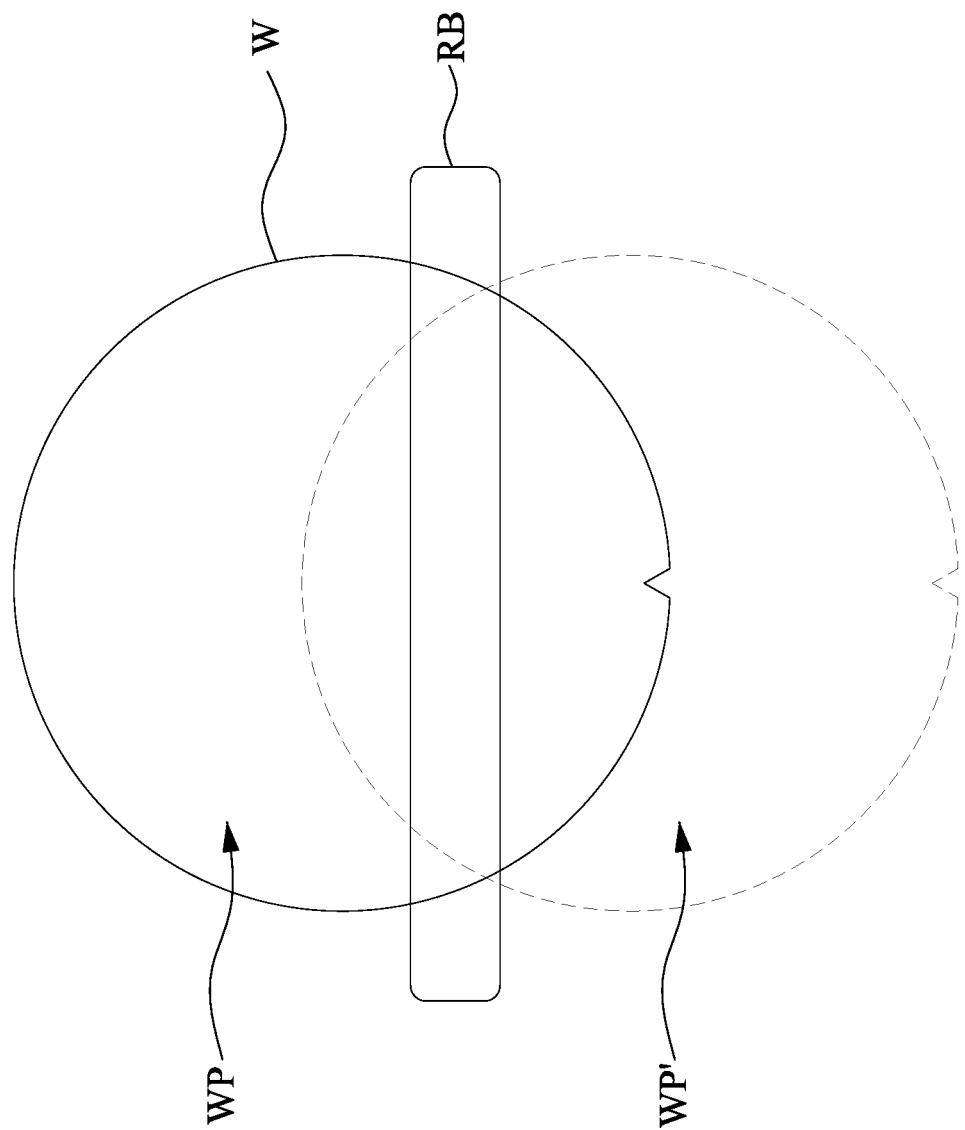

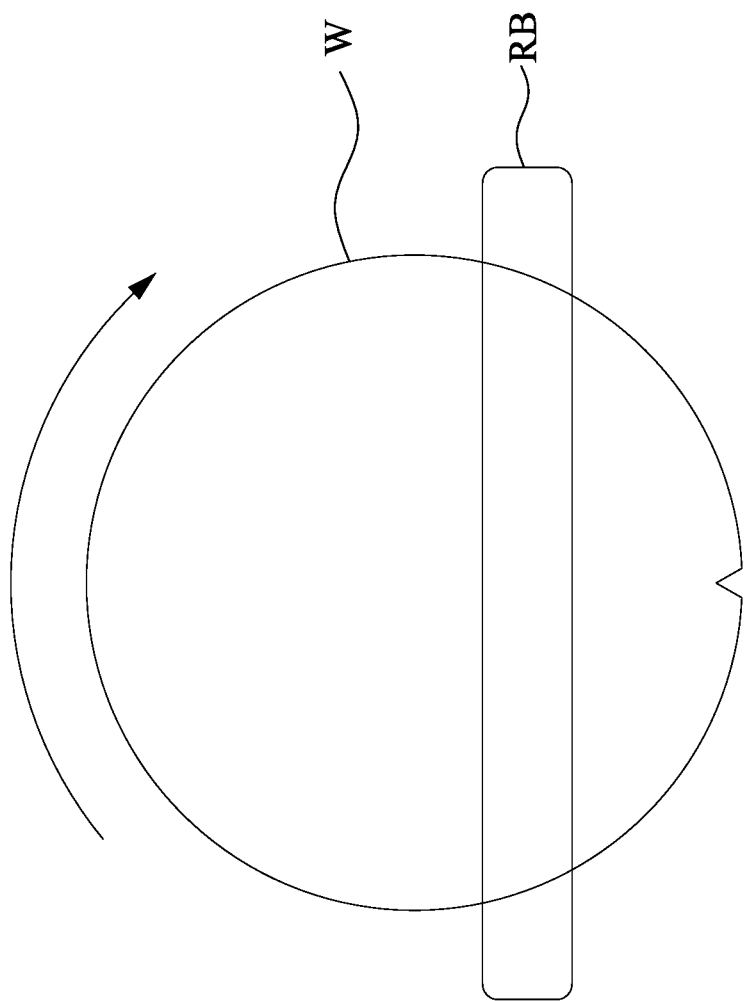
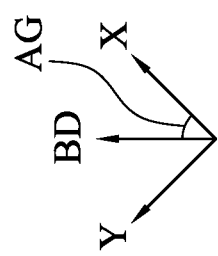
Fig. 44D

METHOD FOR FABRICATING SEMICONDUCTOR DEVICE

PRIORITY CLAIM AND CROSS-REFERENCE

This application claims priority to U.S. Provisional Application Ser. No. 63/178,950, filed Apr. 23, 2021, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-9B illustrate a method for manufacturing a semiconductor device at various stages in accordance with some embodiments of the present disclosure.

FIGS. 14-18 illustrate top views of a photoresist material at various stages of a method for manufacturing a semiconductor device in accordance with some embodiments of the present disclosure.

FIGS. 20A-33B illustrate a method for manufacturing a semiconductor device at various stages in accordance with some embodiments of the present disclosure.

FIGS. 44A-44D illustrating a semiconductor fabrication apparatus according to some embodiments of the present disclosure.

DETAILED DESCRIPTION

Figure 1:
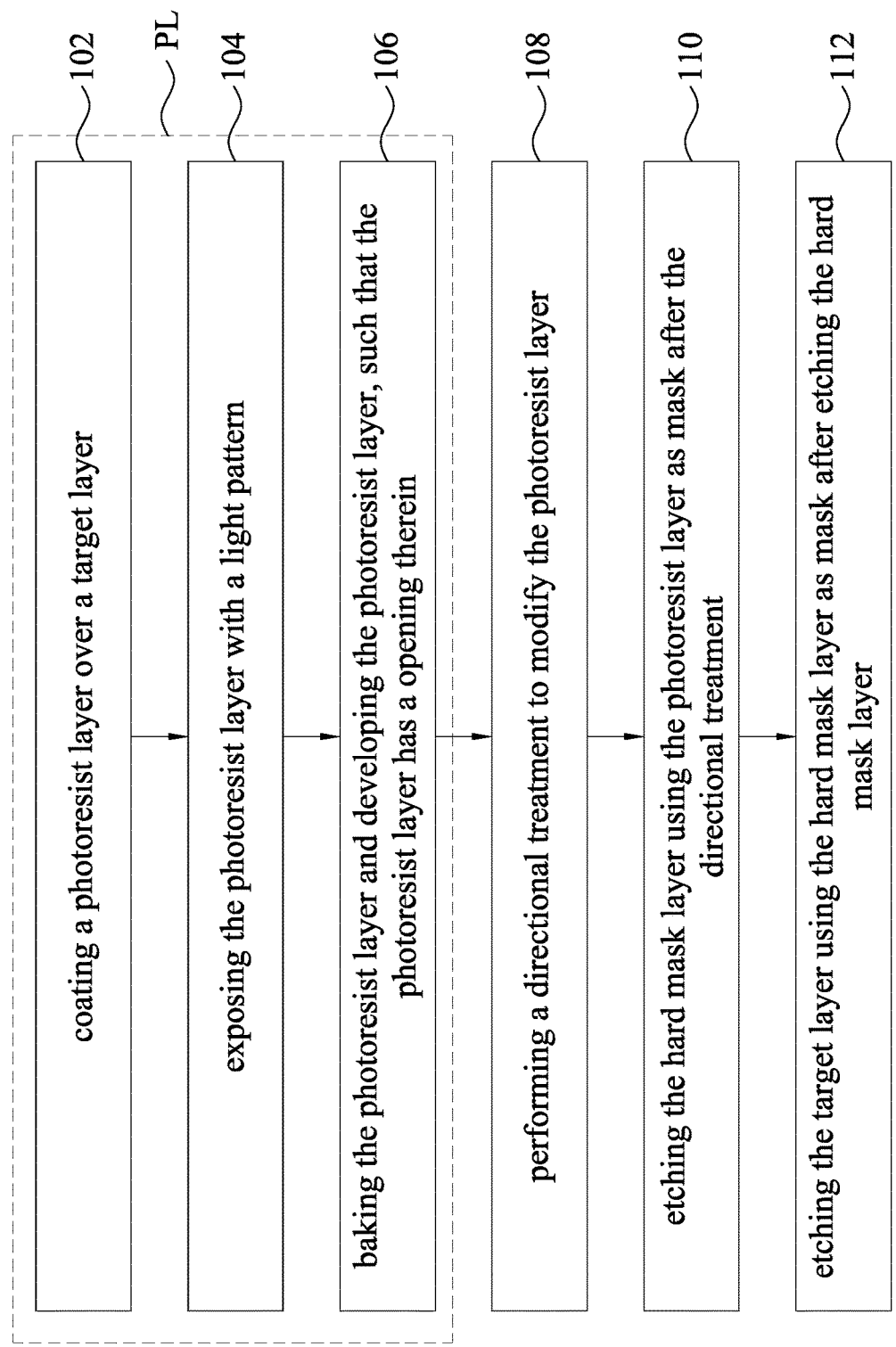
FIG. 1 is a flow chart of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Pattern corner rounding has become more prominent issue in smaller process nodes. Pattern corner rounding is the phenomenon that right angles in a target pattern become rounded during photolithography (e.g., photoresist pattern) and etching processes (e.g., hard mask patterns). For example, the photolithography may use an optical system with low pass filter, thereby producing blurred light pattern, which in turn may result in rounded corners in the photoresist pattern. Following etching processing that uses the photoresist as an etch mask will transfer the pattern, and result in rounded corners in the hard mask pattern. This issue directly affects the process window and critical dimension (CD) variation control during semiconductor manufacturing. Hence, various methods have been proposed to reduce pattern corner rounding. In some cases, a light pattern in a lithography process may be adjusted to overshoot the photoresist pattern observed in an after-development inspection (ADI) for compensating the corner rounding in the hard mask pattern observed in after-hard-mask open inspection (AMI) or other underlying layer pattern observed in after-etch inspection (AEI), but this adjusting to the light pattern may degrade the lithography window.

In some embodiments, a directional treatment is performed after a lithography process for modifying a photoresist pattern, thereby reducing pattern corner rounding without degrading the lithography window. The directional treatment can also harden the photoresist pattern, which in turn improves an etch selectivity between the photoresist pattern and underlying layers. The directional treatment can also push edges of the photoresist pattern, such that the modified photoresist pattern has more sharpened corners. In some embodiments, the directional treatment is achieved by a directional ion bombardment process with suitable ion species (e.g., Ar, Si, etc.), a suitable energy, a suitable dosage, and a suitable incident angle for hardening the photoresist pattern and pushing edges thereof.

FIG. 1 is a flow chart of a method 100 for manufacturing a semiconductor device at various stages in accordance with some embodiments of the present disclosure. FIGS. 2-9B illustrate a method for manufacturing a semiconductor device at various stages in accordance with some embodiments of the present disclosure. The method 100 may include steps 102-112. A lithography process PL including steps 102-106 is performed to form a patterned photoresist layer having an opening therein. For example, at step 102, a photoresist layer is coated over a target layer. At step 104, the photoresist layer is exposed with a light pattern. At step 106, the photoresist layer is developed, and then baked. At step 108, a directional treatment is performed to harden a portion of the photoresist layer adjacent to the opening after the lithography process PL. At step 110, the hard mask layer is etched using the photoresist layer as mask after the directional treatment. At step 112, the target layer is etched using the hard mask layer as mask after etching the hard mask layer. It is understood that additional steps may be provided before, during, and after the steps 102-112 shown by FIG. 1, and some of the steps described below can be replaced or eliminated for additional embodiments of the method. The order of the operations/processes may be interchangeable.

Figure 2:
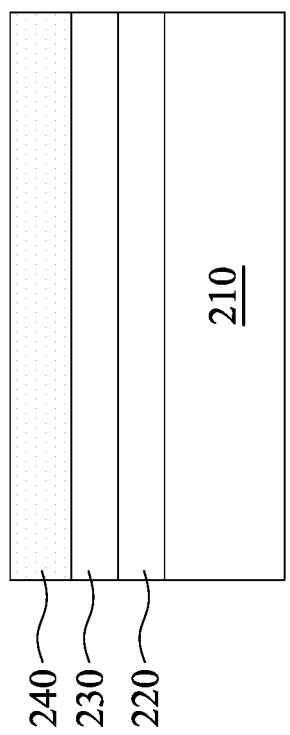

Referring to FIGS. 1 and 2, the method 100 begins at step 102, where a photoresist layer 240 is coated over a target layer 220. In some embodiments, the target layer 220 may be one or more layers of a conductive material and/or dielectric material deposited over a substrate 210. In some embodiments, a hard mask layer 230 is deposited over the target layer 220, and then the photoresist layer 240 is coated over the hard mask layer 230. In some embodiments, the hard mask layer 230 is also a target layer because it is to be patterned by using the photoresist layer 240 as a patterning mask.

In some embodiments, the substrate 210 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 210 may include an epitaxial layer (epi-layer), which may be strained for performance enhancement, and/or may include a silicon-on-insulator (SOI) structure.

In some embodiments, the target layer 220 includes a dielectric material, such as silicon oxide, silicon nitride, SiON, SiOC, SiOCN, SiCN, aluminum based dielectric material, low-k material, organic material, or any other dielectric material used in a semiconductor device fabrication. A dielectric target layer 220 can serve as, for example, an interlayer dielectric (ILD) layer or intermetal dielectric (IMD) layer in an integrated circuit (IC) structure. In other embodiments, the target layer 220 includes a conductive material, such as polysilicon and metallic materials. The metallic materials include W, Cu, Ti, Ta, Ag, Al, AlCu, TiAl, TiN, TaN, TiAlN, TiAlC, TaC, TaCN, TaSiN, Mo, Mn, Co, Pd, Ni, Re, Ir, Ru, Pt, and/or Zr, or alloys thereof (e.g., silicide), in some embodiments. A conductive target layer 220 can serve to form, for example, metal gates, metal lines, or metal vias. The target layer 220 can be formed by physical vapor deposition (PVD), chemical vapor deposition (CVD), or atomic layer deposition (ALD), although any acceptable process may be utilized. In some alternative embodiments, the target layer 220 may be a portion of the substrate 210.

The hard mask layer 230 may include a dielectric material, such as silicon oxide, silicon nitride, SiON, SiOC, SiOCN, SiCN, aluminum based dielectric material, low-k material, organic material, or any other dielectric material used in a semiconductor device fabrication. In some embodiments, the hard mask layer 230 includes a material different from that of the target layer 220, thereby having a different etch selectivity from that of the target layer 220.

In some embodiments, the photoresist layer 240 is spin-coated over the hard mask layer 230. In some embodiments, a bottom antireflective coating (BARC) layer is formed on the hard mask layer 230 before coating the photoresist layer 240.

Figure 10:
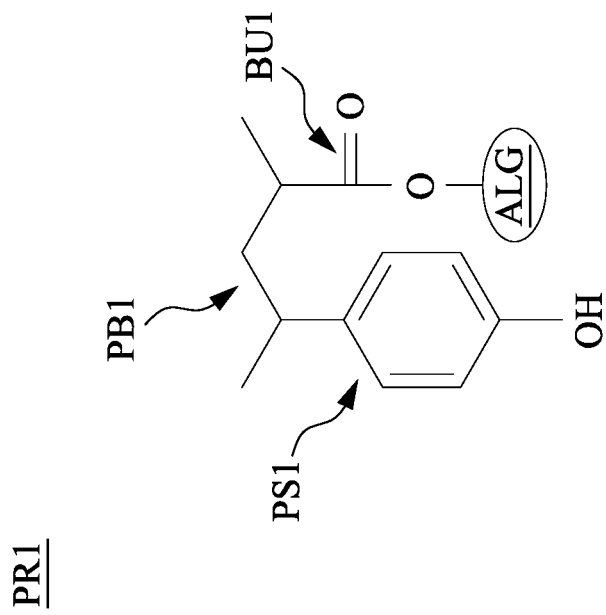
FIG. 10 is a chemical structure of a polymer resin in a photoresist material according to some embodiments of the present disclosure.

In some embodiments, the photoresist layer 240 includes a polymer resin, a photoactive compound (PAC) and a solvent. In some embodiments, the polymer resin includes a hydrocarbon structure that contains one or more groups that will decompose (e.g., acid labile groups (ALG)) or otherwise react when mixed with acids, bases, or free radicals generated by the PACs. In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like. An exemplary structure of the polymer resin is illustrated in FIG. 10.

Figure 11:
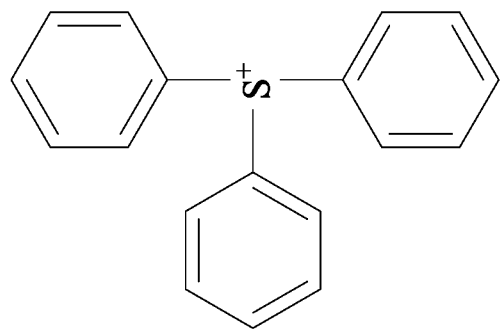
FIG. 11 is a chemical structure of a photoacid generator in a photoresist material according to some embodiments of the present disclosure.

The PACs are photoactive components, such as photoacid generators (PAG), photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. In some embodiments, the sensitivity of the photo resist is adjusted to the aforementioned range by adjusting an amount (concentration) of the PAC, selecting a specific type of PAC and/or increasing the number of photo active units coupled to the base structure. An exemplary PAG structure of the PAC is illustrated in FIG. 11.

In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

The photoresist layer 240 may be a positive photoresist or a negative photoresist. For the positive photoresist, the portion of the photoresist that is exposed to light becomes soluble to the photoresist developer, and the unexposed portion of the photoresist remains insoluble to the photoresist developer. For the negative photoresist, the portion of the photoresist that is exposed to light becomes insoluble to the photoresist developer, and the unexposed portion of the photoresist is dissolved by the photoresist developer.

Figure 3:
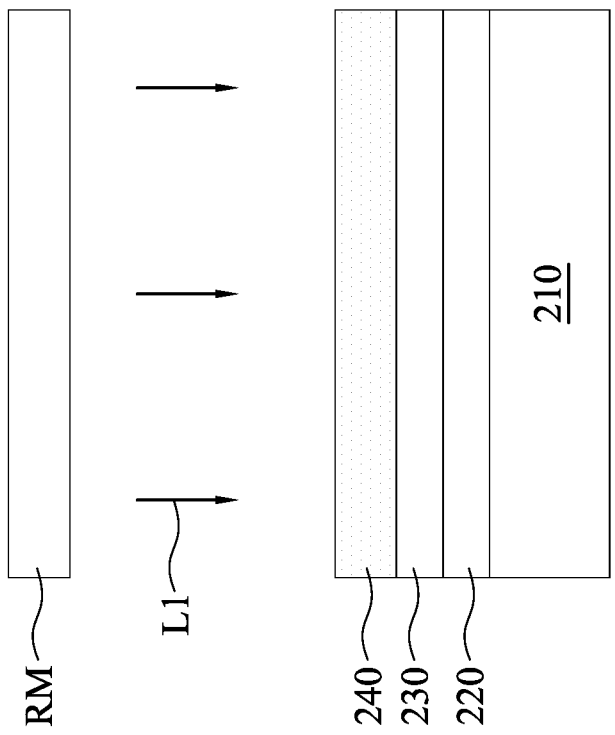

Reference is made to FIGS. 1 and 3. The method 100 proceeds to step 104, where the photoresist layer 240 (referring to FIG. 2) is exposed with a light pattern L1. A reticle RM may be used for provide a pattern to light, thereby generating the light pattern L1. In some embodiments, before the exposure to the light pattern L1, the photoresist layer 240 (referring to FIG. 2) is subjected to a pre-baking process, to reduce the solvent.

Figure 4B:
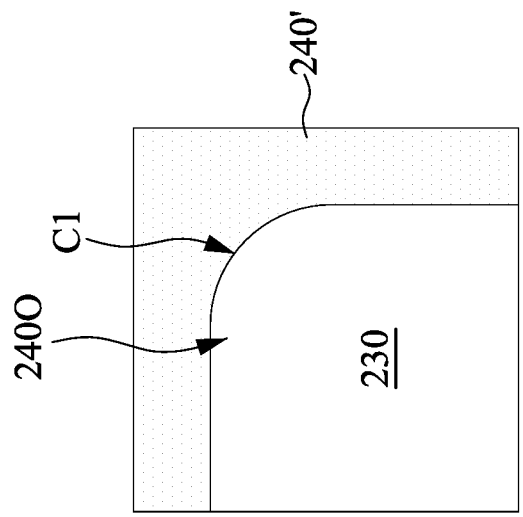
Figure 4A:
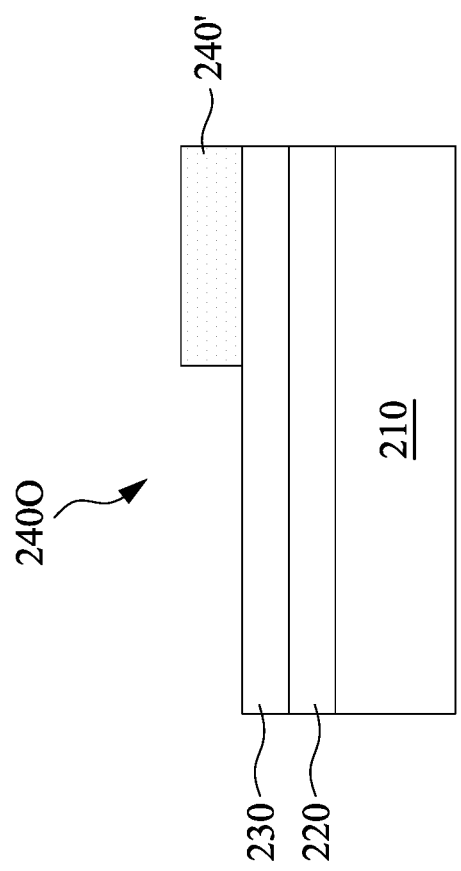

Reference is made to FIGS. 1 and 4A and 4B. FIG. 4B is a top view of the semiconductor device of FIG. 4A. The method 100 proceeds to step 106, after the exposure, the exposed photoresist layer 240 (referring to FIG. 3) is subjected to a post exposure baking (PEB) process and then to a developing process, thereby forming a patterned photoresist layer 240'. In some embodiments, the patterned photoresist layer 240' may have an opening 240O therethrough. In some embodiments, a post baking process is performed after the development of the exposed photoresist layer 240 (referring to FIG. 3). In some embodiment, the pre-baking and/or post-baking process may be employed to maximize the changes in the chemical properties of the exposed portion of the photoresist relative to unexposed portions of the photoresist.

The photolithography process PL including steps 102-106 forms the patterned photoresist layer 240', so that some regions of the hard mask layer 230 are exposed by the patterned photoresist layer 240' (e.g., through the opening 240O). In some embodiment, after the development processes, an after-development inspection (ADI) is performed to inspect a profile of the patterned photoresist layer 240', as shown in FIG. 4B.

In some cases, since the photolithography may use an optical system with low pass filter, the light pattern L1 (referring to FIG. 3) may blur, such that the resultant patterned photoresist layer 240' may have rounded corners after the post baking process. For example, as shown in FIG. 4B, the opening 240O of the patterned photoresist layer 240' has a rounded corner C1 after the post baking process. This rounded corner C1 may be observed in the ADI step. In some cases, with the rounded corner C1 of the patterned photoresist layer 240', subsequent etching processes may result in rounded corners in the underlying hard mask layer 230 and the target layer 220.

Reference is made to FIG. 1 and FIGS. 5A and 5B. FIG. 5B is a top view of the semiconductor device of FIG. 5A. The method 100 proceeds to step 108, where a directional treatment is performed to modify the photoresist layer 240', thereby reshaping the rounded corners of the photoresist layer 240' to have a sharper and less rounded profile, which in turn will reduce rounded corners in the hard mask layer 230 and the target layer 220 in subsequent etching processes. The directional treatment may be a directional ion bombardment process, using a beam RB with suitable species (e.g., Ar, Si, etc.). In some embodiments, the beam RB may comprise ions (e.g., Ar+) and/or neutral atoms (e.g., Ar), where the directions of the ions and/or atoms are represented by the arrows as illustrated along the direction BD1 when view from top, as illustrated in FIG. 5B.

In some embodiments of the present disclosure, the beam RB is incident onto a rounded sidewall 240SC at the rounded corner C1 of the opening 240O. For example, as illustrated in FIG. 5B, the opening 240O has a first sidewall 240S1 extending along the direction X, a second sidewall 240S2 extending along the direction Y perpendicular to the direction X, and a rounded sidewall 240SC connecting the first sidewall 240S1 to the second sidewall 240S2. The direction BD1 of the beam RB is tilted with respect to the directions X and Y. In other words, the direction BD1 may intersect directions X and Y when view from above. For example, an angle A1 between the direction BD1 of the beam RB and the direction X is in a range from about 40 degrees to about 50 degrees. For example, the angle A1 is about 45 degrees. If the angle A1 between the direction BD1 of the beam RB and the direction X is less than about 40 degrees or greater than about 50 degrees, due to shadow effect, the beam RB may not effectively hit the sidewall 240SC at the corner C1, which in turn will not effectively reduce the corner rounding profile into a sharper and less rounded profile.

Figure 5C:
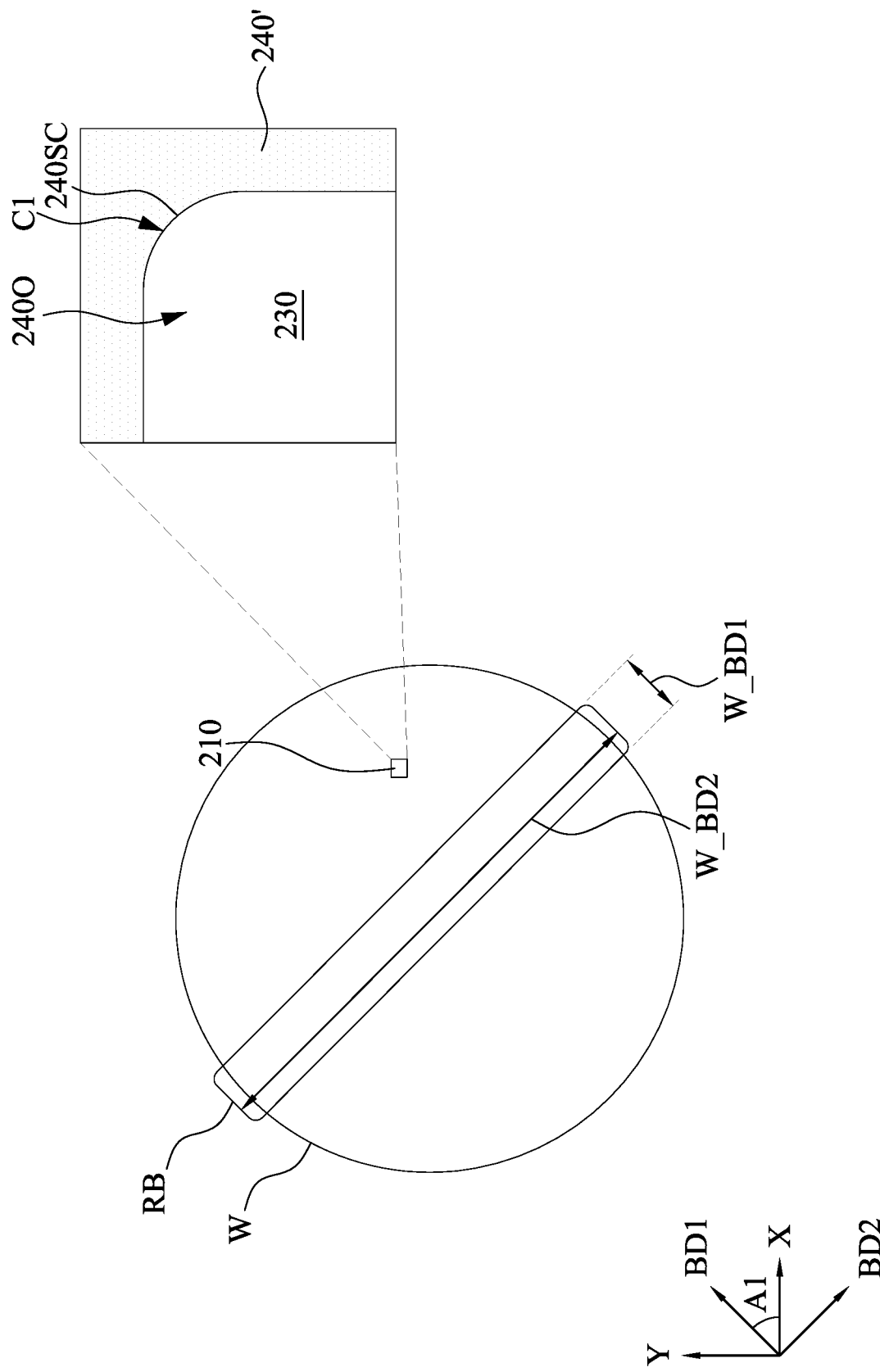

In some embodiments, the beam RB may have a ribbon-shaped and be referred to as a ribbon beam. FIG. 5C is a top view illustrating how the beam RB hits a wafer W having plural chips (e.g., plural substrate 210). For example, a width W_BD1 of the ribbon beam RB in the direction BD1 may be less than a width W_BD2 of the ribbon beam RB in a direction BD2 orthogonal to the direction BD1. In some embodiments, the width W_BD1 of the ribbon beam RB in the direction BD1 may be equal to or greater than a diameter of a wafer W, such that the ribbon beam RB may incident on rows/columns of chips (e.g., plural substrate 210) in the wafer W. In some alternative embodiments, the width W_BD1 of the ribbon beam RB in the direction BD1 may be less than the diameter of the wafer W.

In some embodiments, the directional ion bombardment process is performed with an ion bombardment energy ranging from about 0.6 keV to about 40 keV. If the ion bombardment energy is less than about 0.6 keV, the ribbon beam RB may not be generated. If the ion bombardment energy is greater than about 40 keV, the ribbon beam RB may damage the underlying layer (e.g., the hard mask layer 230), and result in undesired results in subsequent etching process. In some embodiments, the directional ion bombardment process is performed with a dosage ranging from about 6E14/cm$^2$ to about 10E15/cm$^2$. If the dosage is less than about 6E14/cm$^2$, the ribbon beam RB may not be generated. If the dosage is greater than about 10E15/cm$^2$, the ribbon beam RB may damage the underlying layer (e.g., the hard mask layer 230), and result in undesired patterns in the target layer 220 in the subsequent etching processes. In some embodiments, the directional ion bombardment process is performed at a tilted angle with respect to a normal direction (e.g., direction Z in FIG. 5A) in a range from about 0 degree to about 80 degrees, for example about 0 degree to about 60 degrees. In some embodiments, the tilted angle is greater than 0 degree and less than or equal to 80 degrees.

Reference is made to FIGS. 6A and 6B, which illustrate an interim stage during the bombardment. FIG. 6B is a top view of the semiconductor device of FIG. 6A. In some embodiments, the directional bombardment treatment may bombard exposed surfaces of the photoresist layer 240', which in turn will harden the photoresist layer 240'. For example, a portion 244 of the photoresist layer 240' near the portion 242 exposed in the opening 240O may be hardened. For example, the directional bombardment treatment may increase a number of carbon-carbon bonds (i.e., C-C bonds) in the portion 244 of the photoresist layer 240', thereby hardening the portion 244 of the photoresist layer 240'. For example, a final number of C-C bonds in the portion 244 of the photoresist layer 240' after the bombardment process is greater than an original number of C-C bonds in the photoresist layer 240' prior to the bombardment process (e.g., the photoresist layer 240' in FIGS. 4A and 4B). In some embodiments, due to shadow effect, a portion 246 of the photoresist layer 240' away from the exposed surfaces of the photoresist layer 240 (e.g., away from the opening 240O and away from the top surface of the photoresist layer 240') may remain substantially unchanged after the directional bombardment treatment. That is, the portion 246 of the photoresist layer 240' may be free of being bombarded by the directional bombardment treatment, and the not substantially changed by the directional bombardment treatment. For example, a number of C-C bonds in the portion 246 of the photoresist layer 240' is less than a number of C-C bonds in the portion 244 of the photoresist layer 240' after the directional bombardment treatment. This is because the directional bombardment leads to no or negligible increase in a number of C-C bonds in the portion 246 but a significant increase in a number of C-C bonds in the portion 244.

The bombardment may remove a portion of the photoresist layer 240' adjacent to the exposed surfaces of the photoresist layer 240'. Furthermore, in some embodiments, the directional bombardment treatment may also sputter off a portion of photoresist layer 240' adjacent to the exposed surfaces of the photoresist layer 240'. For example, the portion 242 of the photoresist layer 240' adjacent to the opening 240O and a top surface of the photoresist layer 240' may be removed by compressing and sputtering the photoresist layer 240' during the directional bombardment treatment.

By compressing and sputtering the photoresist layer 240', edges of the opening 240O in the photoresist layer 240' are pushed away from a center of the opening 240O. For example, the sidewalls 240S1, 240S2, and 240SC are pushed away from the center of the opening 240O to become the sidewalls 240S1', 240S2', and 240SC'. In some embodiments, due to shadowing effect, while the direction BD1 of the beam RB is controlled such that the beam RB can effectively hit on the rounded sidewall 240SC/240SC', a distance difference between the rounded sidewalls 240SC and 240SC' is greater than a distance difference between the X-directional sidewalls 240S1 and 240S1' (i.e., sidewall extending linearly in X-direction), and the distance difference between the rounded sidewalls 240SC and 240SC' is also greater than a distance difference between the Y-direction sidewalls 240S2 and 240S2' (i.e., sidewall extending linearly in Y-direction). Therefore, the corner C1' is sharpened to have a sharper and less rounded profile than the original corner C1.

Figure 7B:
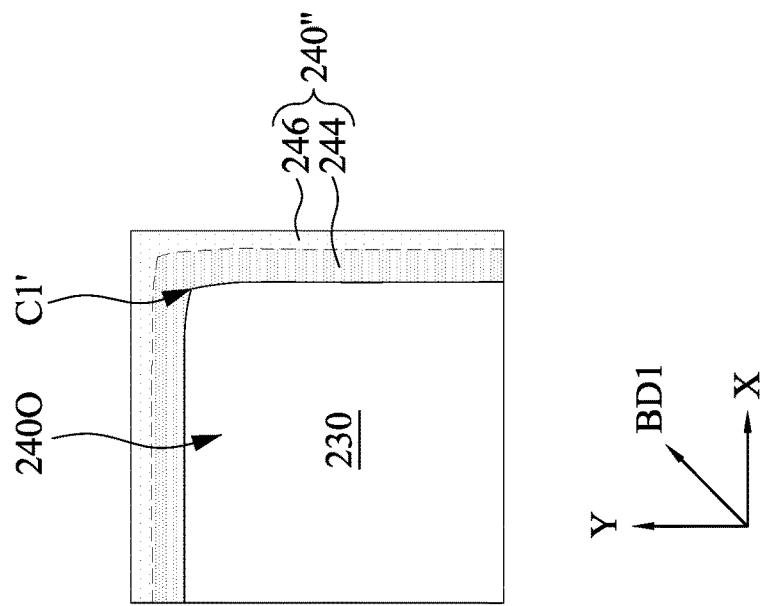
Figure 7A:
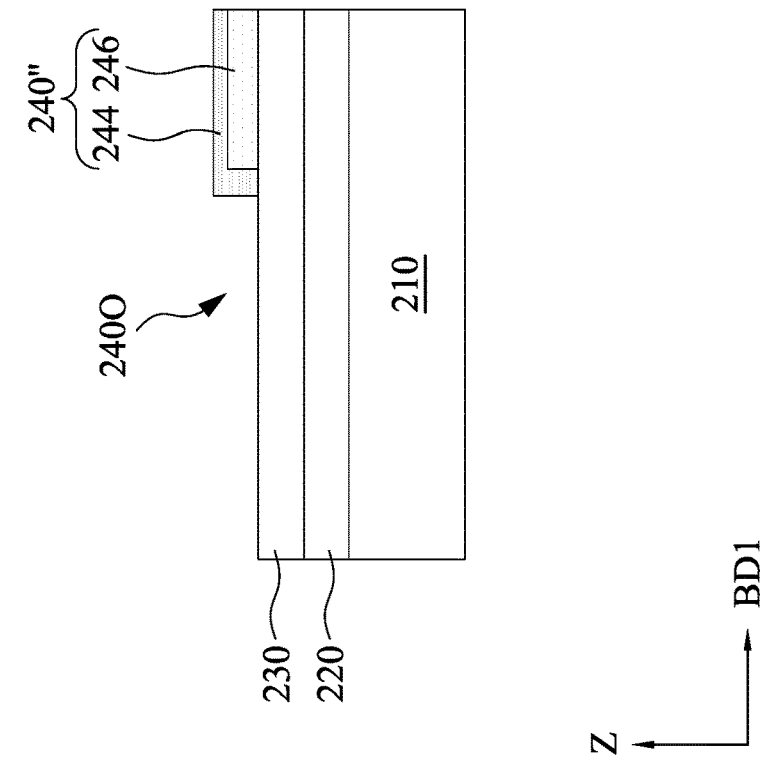

FIGS. 7A and 7B show the results after the directional treatment. FIG. 7B is a top view of the semiconductor device of FIG. 7A. After the directional treatment, the remaining photoresist layer 240' (referring to FIGS. 6A and 6B) is referred to as the modified photoresist layer 240". The modified photoresist layer 240" may have the hardened portion 244 exposed to the opening 240O and the non-hardened portion 246 not exposed to the opening 240O. The hardened portion 244 can improve etch selectivity in subsequent etching processes. Furthermore, as illustrated above, by removing the portion 242 of the photoresist layer 240' (referring to FIGS. 6A and 6B), as viewed from top, the directional treatment may outwardly push edges of the opening 240O in the photoresist layer 240' (referring to FIGS. 6A and 6B), such that the modified photoresist layer 240" may have a sharper and less rounded corner C1'. In some embodiments, after the directional treatment, a suitable inspection method is performed to inspect a top view profile of the photoresist layer 240", as shown in FIG. 7B.

Figure 8B:
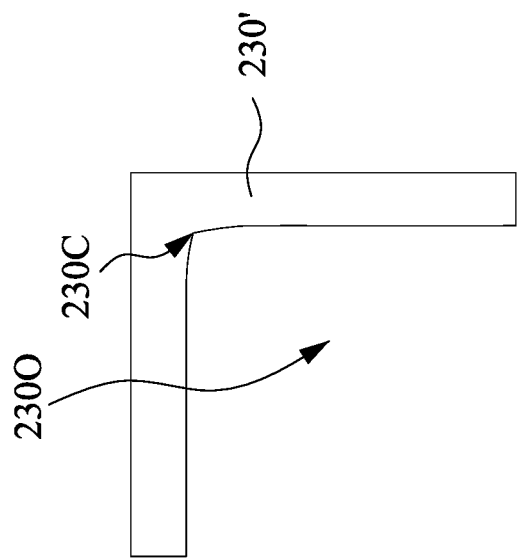
Figure 8A:
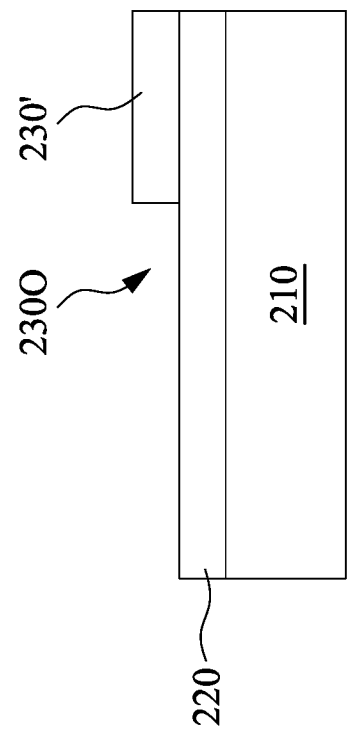

Reference is made to FIGS. 1 and 8A and 8B. FIG. 8B is a top view of the semiconductor device of FIG. 8A. The method 100 proceeds to step 110, where the hard mask layer 230 (referring to FIGS. 7A and 7B) is etched using the photoresist layer 240" (referring to FIGS. 7A and 7B) as an etch mask after the directional treatment. In the present embodiments, because the hardened portion 244 of the modified photoresist layer 240" has an improved etch selectivity, the etching process may not degrade the pattern. For example, in the etching process the hard mask layer 230 can inherit the pattern of the modified photoresist layer 240" with no or negligible pattern distortion. The etching process may remove portions of the hard mask layer 230 (referring to FIGS. 7A and 7B) exposed by the photoresist layer 240" (referring to FIGS. 7A and 7B), and the remaining portions of the hard mask layer 230 (referring to FIGS. 7A and 7B) covered by the photoresist layer 240" (referring to FIGS. 7A and 7B) may be referred to as a hard mask layer 230'. For example, the hard mask layer 230' has an opening 230O inheriting the pattern of the opening 240O of the photoresist layer 240" (referring to FIGS. 7A and 7B). In some embodiments, since the photoresist layer 240" have a sharpened corner C1' (referring to FIGS. 7A and 7B), the hard mask layer 230' may also have a sharpened corner 230C that is sharper and less rounded than original corners in photoresist opening. For example, in some embodiments the corner 230C of the hard mask layer 230' is sharper and less rounded than the original corner C1 of the photoresist layer 240' (referring to FIGS. 4A and 4B). After the patterning the hard mask layer 230 (referring to FIGS. 7A and 7B) to form the hard mask layer 230', the photoresist layer 240" (referring to FIGS. 7A and 7B) may be removed by suitable ashing or stripping methods. In some embodiments, after the patterning the hard mask layer 230 (referring to FIGS. 7A and 7B) to form the hard mask layer 230' and stripping the photoresist layer 240" (referring to FIGS. 7A and 7B), an after-hard-mask open inspection (AMI) is performed to inspect a top view profile of the patterned hard mask layer 230, as shown in FIG. 8B.

Figure 9B:
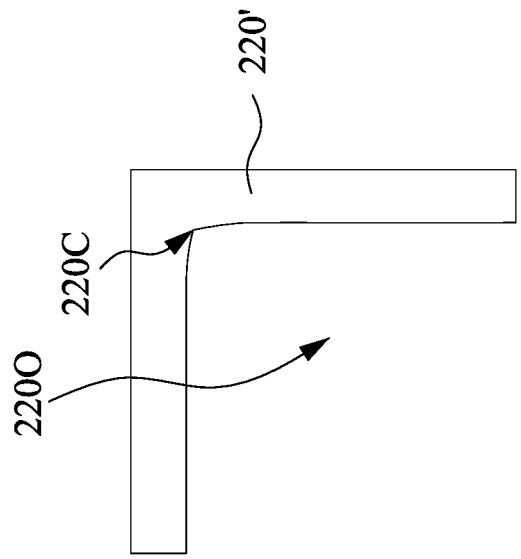
Figure 9A:
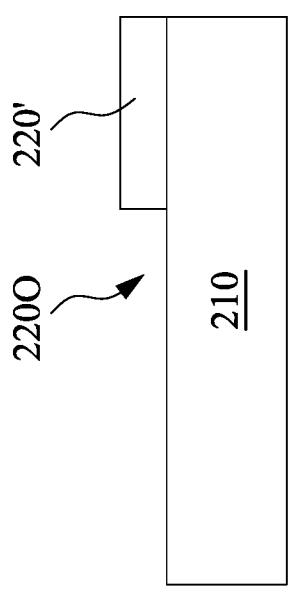

Reference is made to FIGS. 1 and 9A. The method 100 proceeds to step 112, where the target layer 220 (referring to FIGS. 8A and 8B) is patterned by an etching process using the hard mask layer 230' (referring to FIGS. 8A and 8B) as an etch mask. The etching process may remove portions of the target layer 220 (referring to FIGS. 8A and 8B) exposed by the hard mask layer 230' (referring to FIGS. 8A and 8B), and the remaining portions of the target layer 220 (referring to FIGS. 8A and 8B) covered by the hard mask layer 230' (referring to FIGS. 8A and 8B) may be referred to as a target layer 220'. For example, the target layer 220' has an opening 220O inheriting the profile of the opening 230O of the hard mask layer 230' (referring to FIGS. 8A and 8B). In some embodiments, since the hard mask layer 230' have a sharpened corner 230C (referring to FIGS. 8A and 8B), the target layer 220' may also have a sharpened corner 220C that is sharped and less rounded than original corners in photoresist opening. For example, in some embodiments the corner 220C of the target layer 220" is sharper and less rounded than the original corner C1 of the photoresist layer 240' (referring to FIG. 4A and 4B). After the patterning the target layer 220 (referring to FIGS. 8A and 8B) to form the target layer 220', the hard mask layer 230' (referring to FIG. 8A and 8B) may be removed by suitable etching methods. After the patterning the target layer 220 (referring to FIGS. 8A and 8B) to form the target layer 220' and removing the hard mask layer 230' (referring to FIGS. 8A and 8B), an after-etch inspection (AEI) is performed to inspect a top view profile of the patterned target layer 220', as shown in FIG. 9B.

FIG. 10 is a chemical structure of a polymer resin PR1 in a photoresist material (e.g., the photoresist layer 240 in FIG. 2) according to some embodiments of the present disclosure. In some embodiments, the polymer resin PR1 includes a polymer backbone PB1 and an acid labile group ALG bonded to the polymer backbone PB1. For example, herein, a branch unit BU1 bonds the acid labile group ALG to the polymer backbone PB1, and the branch unit BU1 has a C—O double bond. In some embodiments, the polymer resin PR1 may further include a sensitizer PS1 bonded to the polymer backbone PB1 to enhance the sensitivity of the photoresist. For example, the sensitizer PS1 may be a polyhydroxystyrene (PHS) group. Other kinds of polymer resins may be applicable to some embodiments of the present disclosure.

FIG. 11 is a chemical structure of a photoacid generator (PAG) in a photoresist material according to some embodiments of the present disclosure. In some embodiments, the PAG may become an acid after exposure to radiation. The acid may initiate the leaving of ALG of the polymer resin during the post-exposure bake (PEB) process. The leaving of the ALG may produce an acid for initiating leaving of subsequent ALG from the polymer resin. For a positive photoresist, when the ALG leaves the polymer resin of the resist, the branch unit of the polymer resin will be changed to carboxylic group that increases the polymer resin solubility to a positive tone developer; thus, allowing the irradiated area of the resist to be removed by a developer, while the non-irradiated area remains insoluble and becomes a masking element for subsequent processes. In the present embodiments, the illustrated PAG includes three phenyl rings bonded to a sulfur. Other kinds of PAG may be applicable to some embodiments of the present disclosure.

X-ray photoelectron spectroscopy (XPS) may be performed to obtain chemical information on in photoresist materials that have been directionally treated or have not been directionally treated. An example composition in the photoresist, measured by the XPS, includes atomic concentrations of Ar, C, O, F, S, N, and Si, which are shown is in Table 1 below. Atomic concentration values listed in Table 1 are only for illustrative purposes, and are not limiting.

In Condition #1, the photoresist material is not subjected to the directional bombardment treatment. In Condition #2, the photoresist material is bombarded by Ar beam with a suitable ion bombardment energy and a suitable dosage. For example, the ion bombardment energy is in a range from about 0.6 keV to about 40 keV, and the dosage is in a range from about 6E14 to about 10E15. In Condition #3, the photoresist material is bombarded by Ar beam with an ion bombardment energy same as that of Condition #2, and a dosage greater than that of Condition #2. In Table 1, the result of XPS is shown as atomic percentage (%) of Ar, C, O, F, S, N, Si in the photoresist materials of Condition #2/3 to that of the Condition #1.

In Condition #1, as the table shows, the argon atomic concentration (i.e., Ar atomic concentration) in the photoresist material is below the limit of XPS detection. In some embodiments, within the photoresist material, a carbon atomic concentration (i.e., C atomic concentration) is greater than an oxygen atomic concentration (i.e., O atomic concentration), the O atomic concentration is greater than a fluorine atomic concentration (i.e., F atomic concentration), and the F atomic concentration is greater than a sulfur atomic concentration (i.e., S atomic concentration). In some examples, the nitrogen atomic concentration (i.e., N atomic concentration) and a silicon atomic concentration (i.e., Si atomic concentration) in the photoresist material are below the limit of XPS detection.

Comparing Condition #2 with Condition #1, it can be observed that the directional bombardment causes a decrease in the O atomic concentration in the photoresist. This indicates that the directional bombardment treatment may break the C—O double bond (referring to FIG. 10) to form other single bonds (e.g., C—C bonds) in the photoresist, thereby releasing oxygen from the photoresist material, which in turn would decrease the O atomic concentration in the photoresist. Furthermore, the C atomic concentration increases as shown in Table 1, the XPS spectra in FIG. 12 indicates the number of C—C bonds is increased, and thus it is believed that the C—O double bond is broken in to C—C bonds due to the directional treatment.

Comparing Condition #3 with Condition #2, it can be observed that a greater dosage in the directional treatment can further cause an increase in the C atomic concentration and a decrease in the O atomic concentration.

In the Condition #1, #2, and #3, the Ar atomic concentrations in the photoresist materials are below the limit of XPS detection. That is, the directional treatment may leave no or negligible Ar atoms in the photoresist materials. Therefore, the argon in the beam would not be chemically reacted with the photoresist materials. Stated differently, the photoresist materials are chemically inert to the argon used in the directional bombardment. For example, the argon used in the directional bombardment may be neutralized,

TABLE 1

|  | Ar | C | O | F | S | N | Si |
|---|---|---|---|---|---|---|---|
| Condition#1 | Below the limit of detection | 100% | 100% | 100% | 100% | Below the limit of detection | Below the limit of detection |
| Condition#2 | Below the limit of detection | 110.4% | 86% | 0.08% | 1.4% | Trace | Below the limit of detection |
| Condition#3 | Below the limit of detection | 114.1% | 71.5% | 0.06% | 1.3% | Trace | Below the limit of detection | and therefore does not remain in the photoresist material after the directional bombardment.

Figure 12:
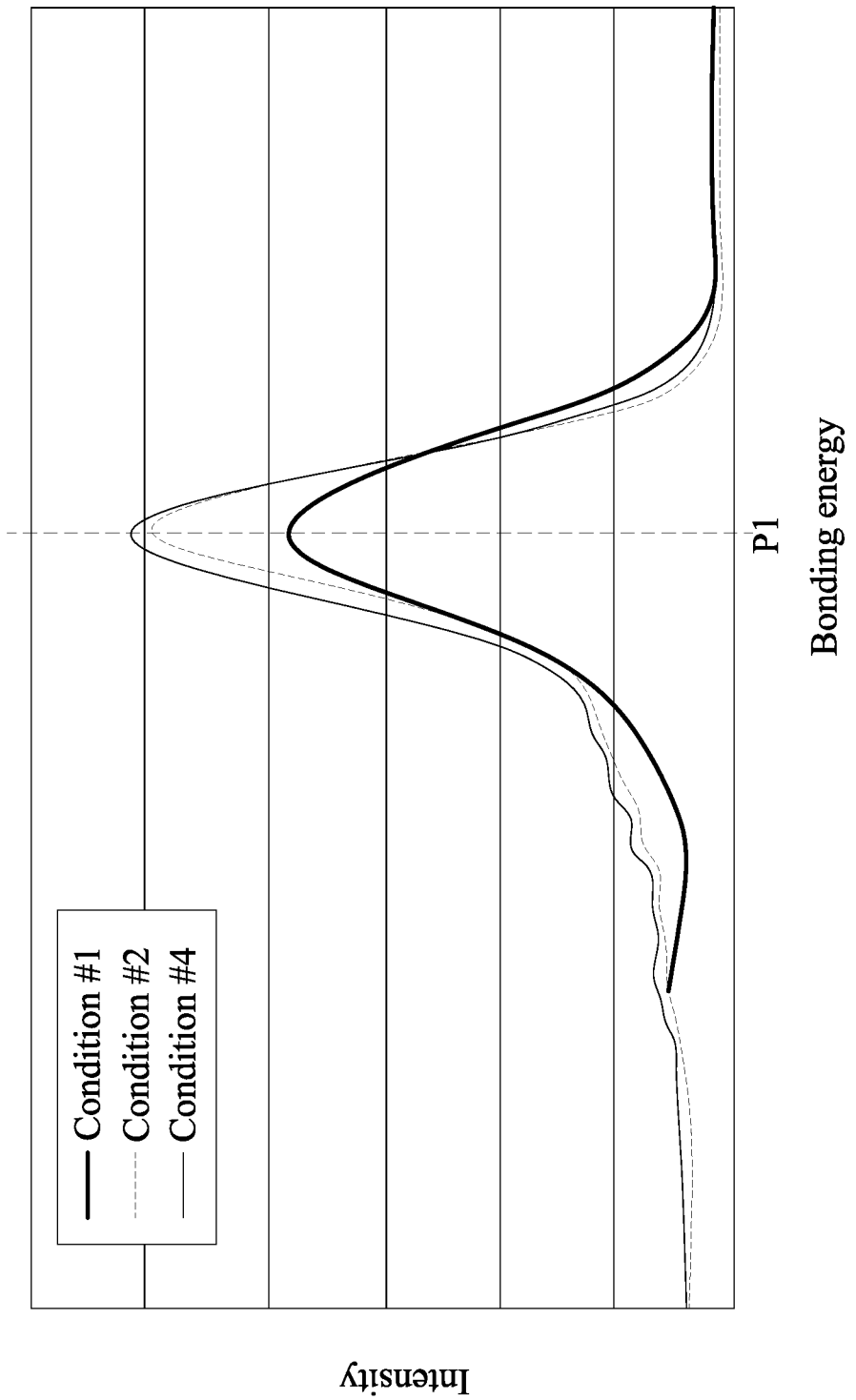
FIG. 12 is a graph illustrating X-ray photoelectron spectroscopy (XPS) spectra of different photoresist materials according to some embodiments of the present disclosure.

FIG. 12 is a graph illustrating XPS spectra of different photoresist materials for Carbon 1s (referred to as s-orbital of first shell) spectrum according to some embodiments of the present disclosure. In FIG. 12, the bonding energy (eV) is shown on the horizontal axis, and the intensity (counts) is shown on the vertical axis. As illustrated with respect to Table 1, in Condition #1, the photoresist material is not subjected to the directional bombardment treatment. As illustrated with respect to Table 1, in Condition #2, the photoresist material is bombarded by Ar beam with a suitable ion bombardment energy and a suitable dosage. In Condition #4, the photoresist material is bombarded by Si beam with an ion bombardment energy and a dosage both the same as that of Condition #2.

In Condition #1, as the graph shows, the photoresist material has a peak intensity at the bonding energy P1. Comparing Condition #2 or Condition #4 with Condition #1, it can be observed that the directional bombardment causes an increase in the peak intensity at the bonding energy P1. The bonding energy P1 may correspond to C—C bond and C—H bond.

Figure 13:
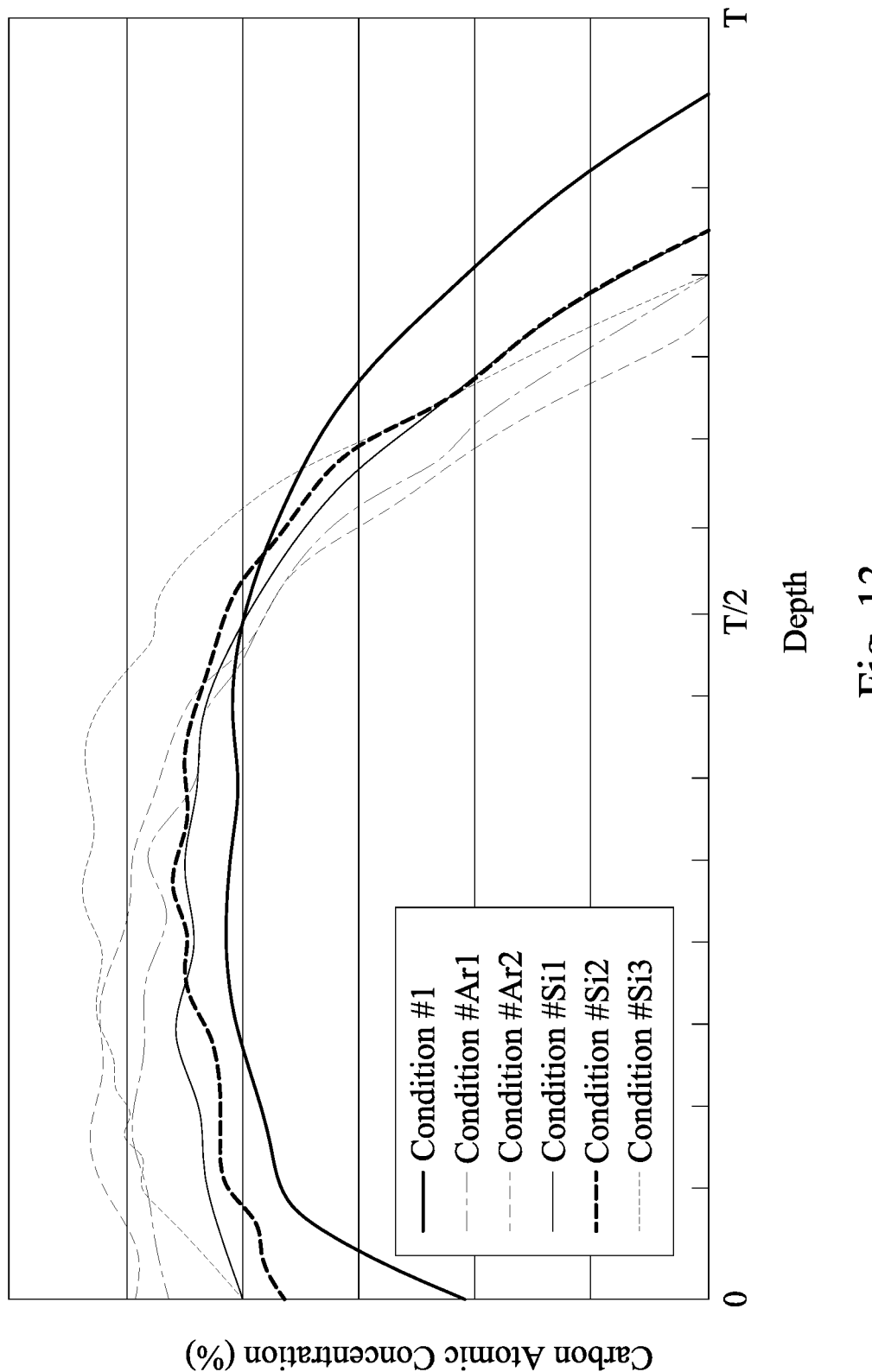
FIG. 13 is a carbon depth profile by XPS of the different photoresist materials according to some embodiments of the present disclosure.

FIG. 13 is a carbon depth profile by sputter XPS of the different photoresist materials according to some embodiments of the present disclosure. In FIG. 13, the depth profile (nm) is shown on the horizontal axis, and the C atomic concentration (%) is shown on the vertical axis. In Condition #1, the photoresist material is not subjected to the directional bombardment treatment. In Condition #Ar1 and #Ar2, the photoresist materials are bombarded by Ar beam, in which an ion bombardment energy of Condition #Ar2 is greater than an ion bombardment energy of Condition #Ar1. In Condition #Si1, #Si2, and #Si3, the photoresist materials are bombarded by Si beam, in which an ion bombardment energy of Condition #Si3 is greater than an ion bombardment energy of Condition #Si2, and the ion bombardment energy of Condition #Si2 is greater than an ion bombardment energy of Condition #Si1. In some examples, the ion bombardment energy of Condition #Si1 is the same as the ion bombardment energy of Condition #Ar1, and the ion bombardment energy of Condition #Si2 is the same as the ion bombardment energy of Condition #Ar2. In some examples, the ion bombardment energy of Condition #Si3 is the same as the ion bombardment energy of Condition #4 in FIG. 12.

In the examples, the photoresist materials have a thickness T. It is noted that the results measured between the depth zero to the depth T/2 (i.e., half the thickness T of the photoresist materials) are more reliable. The results measured at a depth greater than the depth T/2 may be interfered by other factors (e.g., signals from underlying substrate), and may be less reliable.

These conditions in FIG. 13 are measured by sputter XPS to obtain atomic concentrations (%) of C and O with a reliable depth of the photoresist material (e.g., between the depth zero to the depth T/2 in FIG. 13). The result of the XPS is in Table 2 below. In Table 2, the result of XPS is shown as ratios of the atomic concentrations (%) of C and O in the photoresist materials of Condition #Ar1/Ar2/Si1/Si2/Si3 to that of the Condition #1. Atomic concentration values listed in Table 2 are only for illustrative purposes, and are not limiting.

TABLE 2

|  | C | O |
|---|---|---|
| Condition#1 | 100% | 100% |
| Condition#Ar1 | 113% | 81% |
| Condition#Ar2 | 113% | 84% |
| Condition#Si1 | 107% | 88% |

TABLE 2-continued

|  | C | O |
|---|---|---|
| Condition#Si2 | 107% | 87% |
| Condition#Si3 | 109% | 85% |

In Condition #1, as the graph and table show, the photoresist material has a low C atomic concentration. Comparing Condition #Ar1, #Ar2, #Si1, #Si2, and #Si3, with Condition #1, the C atomic concentration increases from Conditions #Ar1 to Conditions #Si3, and the O atomic concentration decreases from Conditions #Ar1 to Conditions #Si3. This graph shows that, by the directional bombardment treatment, a number of C—O bonds in the photoresist layer decreases, and a number of C—C bonds in the photoresist layer increases. Furthermore, with stronger ion bombardment energy, the C atomic concentration increases more, and an O atomic concentration decreases more. This indicates that more C—C bonds and less C—O bonds remain in the photoresist material by increasing the ion bombardment energy, which in turn will make the photoresist material become harder and is more resistant to a subsequent etching process.

FIGS. 14-18 illustrate top views of a photoresist material at various stages of a method for manufacturing a semiconductor device in accordance with some embodiments of the present disclosure. Details of the present embodiments are similar to those illustrated in FIG. 1-9B, except that the directional treatment comprises a first directional treatment along the direction BD1, a second directional treatment along the direction BD1' opposite to the direction BD1, a third directional treatment along the direction BD2 orthogonal to the first direction, and a fourth directional treatment along the direction BD2' opposite to the direction BD2.

Figure 14:
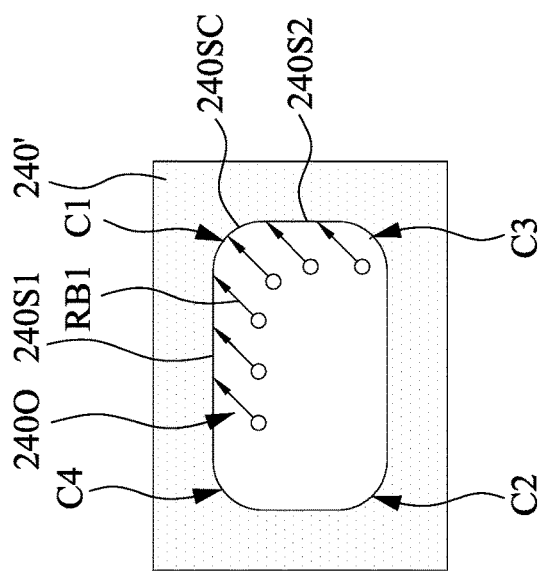

Reference is made to FIG. 14. After the lithography process PL in FIG. 1, a photoresist layer 240' has an opening 240O exposing the underlying hard mask layer 230, in which the opening 240O may include corners C1-C4, in which the corner C1 is diagonally opposite to the corner C2, and the corner C3 is diagonally opposite to the corner C4. As illustrated previously, the photoresist layer 240 have first linear sidewalls 240S1 extending along the direction X, the second linear sidewalls 240S2 extending along the direction Y perpendicular to the direction X, and the rounded sidewalls 240SC at the corners C1-C4 connecting the respective first sidewalls 240S1 to the respective second sidewall 240S2. In the present embodiments, the first directional treatment is performed to the corner C1. The first directional treatment may include a directional ion bombardment process using a beam RB1 with suitable species (e.g., Ar, Si, etc.). In some embodiments, the beam RB1 may comprise ions (e.g., $Ar^+$ and/or neutral atoms (e.g., Ar), where the directions of the ions and/or atoms are represented by the arrows as illustrated along the direction BD1 when viewed from above. In some embodiments, an angle A1 between the direction BD1 of the beam RB and the direction X is in a range from about 40 degrees to about 50 degrees. For example, the direction BD1 is about 45 degrees tilted with respect to the direction X. Through the configuration, in some embodiments, the beam RB1 is controlled to incident onto a rounded sidewall 240SC at the corner C1 of the opening 240O, while the corner C2-C4 of the opening 240O are not hit by the beam RB1 due to shadowing effect. In some embodiments, as illustrated previously, the beam RB1 may have a ribbon-shaped and be referred to as a ribbon beam. For example, in FIG. 14, a width of the ribbon beam RB1 in the direction BD1 may be less than a width of the ribbon beam RB1 in the direction BD2.

Figure 15:
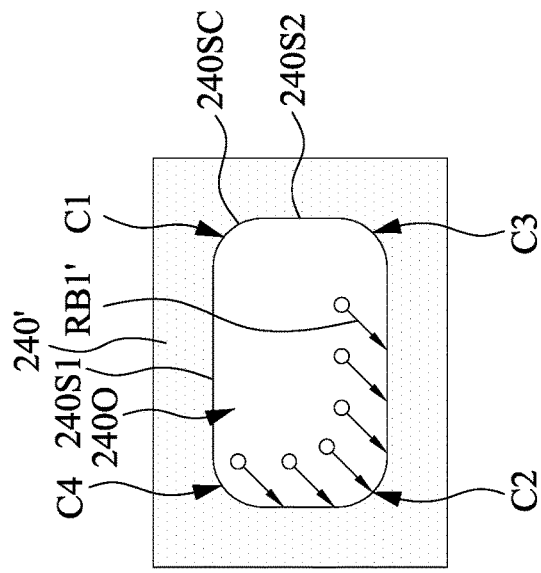

Reference is made to FIG. 15. After the first directional treatment to the corner C1, a second directional treatment may be performed to the corner C2 opposite to the corner C1. The second directional treatment may include a directional ion bombardment process using a beam RB1' with suitable species (e.g., Ar, Si, etc.). In some embodiments, the beam RB1' may comprise ions (e.g., Ar$^+$) and/or neutral atoms (e.g., Ar), where the directions of the ions and/or atoms are represented by the arrows as illustrated along the direction BD1' when viewed from above. In some embodiments, an angle A1' between the direction BD1' of the beam RB1' and the direction X is in a range from about 220 degrees to about 230 degrees. For example, the direction BD1' is about 225 degrees tilted with respect to the direction X. Through the configuration, in some embodiments, the beam RB1' is controlled to incident onto a sidewall 240SC at the corner C2 of the opening 240O, while the corner C1 and C3-C4 of the opening 240O are not hit by the beam RB1' due to shadowing effect. In some embodiments, as illustrated previously, the beam RB1' may have a ribbon-shaped and be referred to as a ribbon beam. For example, in FIG. 15, a width of the ribbon beam RB1' in the direction BD1' may be less than a width of the ribbon beam RB1 in the direction BD2.

Reference is made to FIG. 16. After the second directional treatment to the corner C2, a third directional treatment may be performed to the corner C3. The third directional treatment may include a directional ion bombardment process using a beam RB2 with suitable species (e.g., Ar, Si, etc.). In some embodiments, the beam RB2 may comprise ions (e.g., Ar$^+$) and/or neutral atoms (e.g., Ar), where the directions of the ions and/or atoms are represented by the arrows as illustrated along the direction BD2 when viewed from above. In some embodiments, an angle A2 between the direction BD2 of the beam RB2 and the direction X is in a range from about 310 degrees to about 320 degrees. For example, the direction BD2 is about 315 degrees tilted with respect to the direction X. Through the configuration, in some embodiments, the beam RB2 is controlled to incident onto a sidewall 240SC at the corner C3 of the opening 240O, while the corner C1-C2 and C4 of the opening 240O are not hit by the beam RB1 due to shadowing effect. In some embodiments, as illustrated previously, the beam RB2 may have a ribbon-shaped and be referred to as a ribbon beam. For example, in FIGS. 16, a width of the ribbon beam RB2 in the direction BD2 may be less than a width of the ribbon beam RB2 in the direction BD1/BD1'.

Reference is made to FIG. 17. After the third directional treatment to the corner C3, a fourth directional treatment may be performed to the corner C4. The fourth directional treatment may include a directional ion bombardment process using a beam RB2' with suitable species (e.g., Ar, Si, etc.). In some embodiments, the beam RB2' may comprise ions (e.g., Ar$^+$) and/or neutral atoms (e.g., Ar), where the directions of the ions and/or atoms are represented by the arrows as illustrated along the direction BD2' when viewed from above. In some embodiments, an angle A2' between the direction BD2' of the beam RB2' and the direction X is in a range from about 130 degrees to about 140 degrees. For example, the direction BD2' is about 135 degrees tilted with respect to the direction X. Through the configuration, in some embodiments, the beam RB2' is controlled to incident onto a sidewall 240SC at the corner C4 of the opening 240O, while the corner C1-C3 of the opening 240O are not hit by the beam RB1 due to shadowing effect. In some embodiments, as illustrated previously, the beam RB2' may have a ribbon-shaped and be referred to as a ribbon beam. For example, in FIGS. 17, a width of the ribbon beam RB2' in the direction BD2' may be less than a width of the ribbon beam RB2' in the direction BD1/BD1'.

Figure 18:
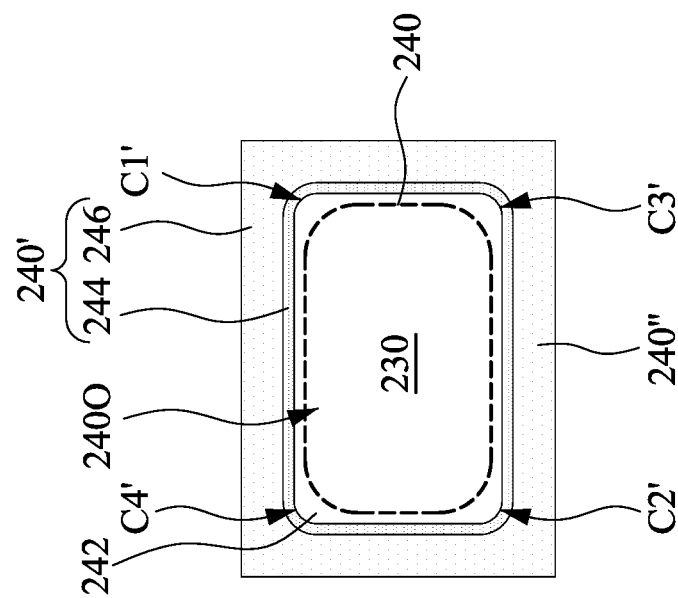

FIG. 18 shows the result after the first to fourth directional treatments. In some embodiments, the first to fourth directional treatments may at least partially harden the photoresist, such that the photoresist layer 240' may have a hardened portion 244 near and surrounding the opening 240O and a non-hardened portion 246 away from the opening 240O. In some embodiments, the first to fourth directional treatments may push edges of the opening 240O of the photoresist layer 240' away from a center of the opening 240O, such that the photoresist layer 240' may have more sharpened corners C1'-C4'. Other details of the present embodiments are similar to those mentioned in the embodiments of FIGS. 1-9B, and will not repeated herein.

Figure 19A:
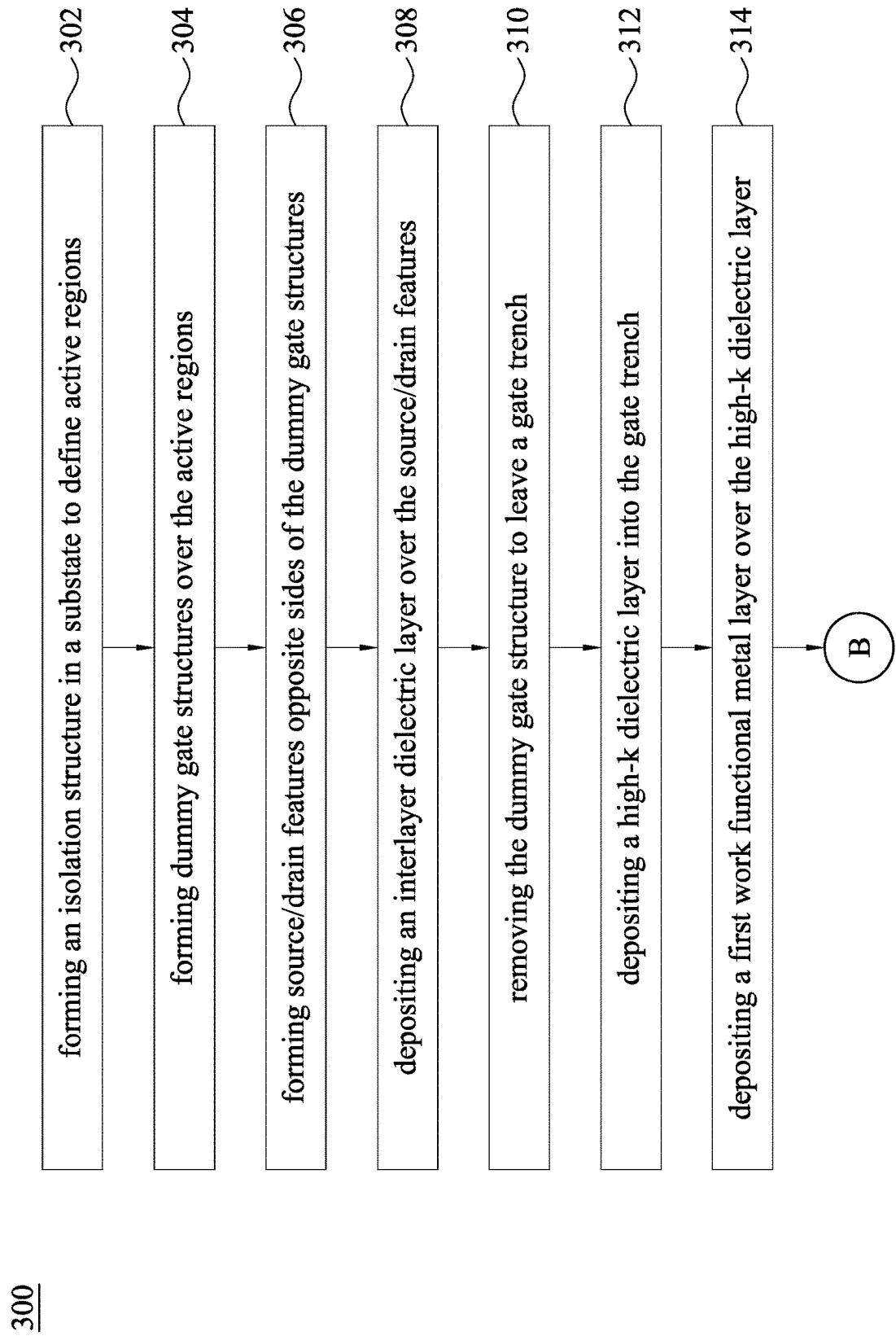
FIGS. 19A and 19B are flow charts of a method for manufacturing a semiconductor device at various stages in accordance with some embodiments of the present disclosure.
Figure 19B:
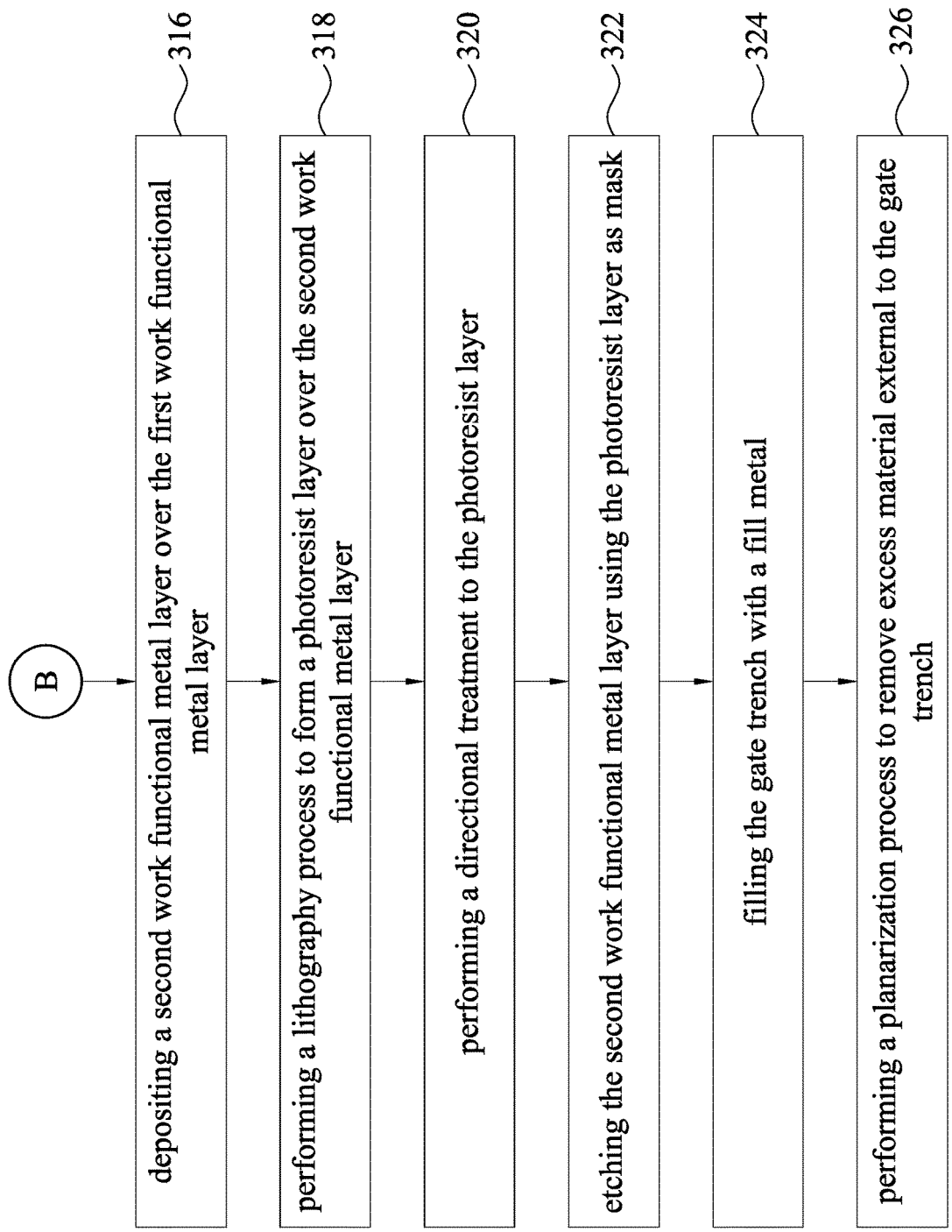

FIGS. 19A and 19B are flow charts of a method for manufacturing a semiconductor device at various stages in accordance with some embodiments of the present disclosure. FIGS. 20A-33B illustrate a method for manufacturing a semiconductor device at various stages in accordance with some embodiments of the present disclosure. The method 300 may include steps 302-326. At step 302, an isolation structure is formed in a substrate to define active regions. At step 304, dummy gate structures are formed over the active regions. At step 306, source/drain features are formed on opposite sides of the dummy gate structures. At step 308, an interlayer dielectric layer is deposited over the source/drain features. At step 310, the dummy gate structure is removed to leave a gate trench. At step 312, a high-k dielectric layer is deposited into the gate trench. At step 314, a first work functional metal layer is deposited over the high-k dielectric layer. At step 316, a second work functional metal layer is deposited over the first work functional metal layer. At step 318, a lithography process is performed to form a photoresist over the second work functional metal layer. At step 320, a directional treatment is performed to harden a portion of the photoresist. At step 322, the second work functional metal layer is etched using the photoresist as mask. At step 324, the gate trench is filled with a fill metal. At step 326, a planarization process is performed to remove excess material external to the gate trench. It is understood that additional steps may be provided before, during, and after the steps 302-326 shown by FIGS. 19A and 19B, and some of the steps described below can be replaced or eliminated for additional embodiments of the method. The order of the operations/processes may be interchangeable.

Figure 20A:
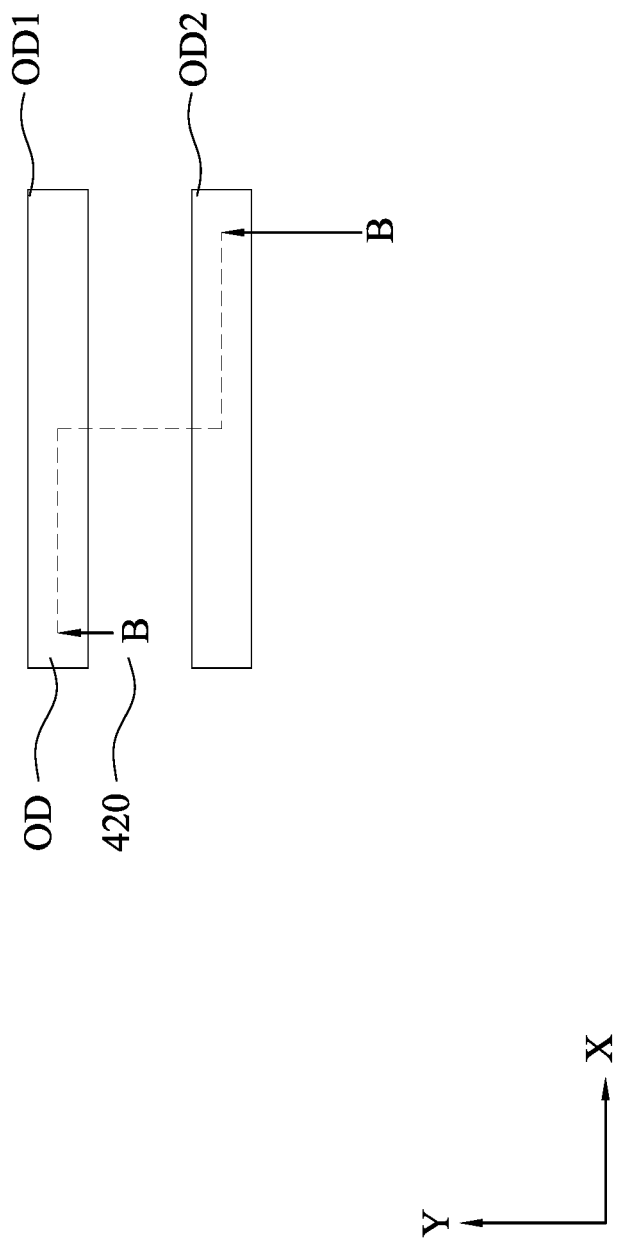

Reference is made to FIGS. 19A, 20A, and 20B. FIG. 20B is a cross-sectional view taken along line B-B in FIG. 20A. The method 300 begins at step 302, where isolation structures 420 are formed in a substrate 410 to define active regions OD. The substrate 410 may be a semiconductor substrate, such as a bulk semiconductor, a semiconductor-on-insulator (SOI) substrate, or the like. The substrate 410 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 410 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, isolation structure 420 may be formed using shallow trench isolation (STI) processes, for example, comprising the steps of etching trenches, and filling the trenches with a filling dielectric material. The filling dielectric material may be silicon oxide, for example. The isolation structure 420 may extend along the direction X, thereby spacing the active regions OD that extends along the same direction X from each other. Ion implantation may be performed to form well regions in the active regions OD. The active regions OD may include active region OD1 and OD2, and the well regions in the active regions OD1 and OD2 may be of different conductivity types in some embodiments. For example, the well region in the active regions OD1 is a p-type well region, and n-type transistors are formed over the active regions OD1. For example, the well region in the active regions OD2 is a n-type well region, and p-type transistors are formed over the active regions OD2.

In some embodiments, the isolation structure 420 has a top surface not lower than a top surface of the active region OD, which in turn allows for forming planar transistors over the active region OD. In some embodiments, the isolation structure 420 is further recessed (e.g., by an etch back process) to fall below the top surfaces of the active region OD, such that the active region OD protrudes above the top surface of the recessed isolation structure 420 to form fin-like structures (e.g., semiconductor fins), which in turn allows for forming fin-type field effect transistors (FinFETs) over the active region OD.

Figure 21A:
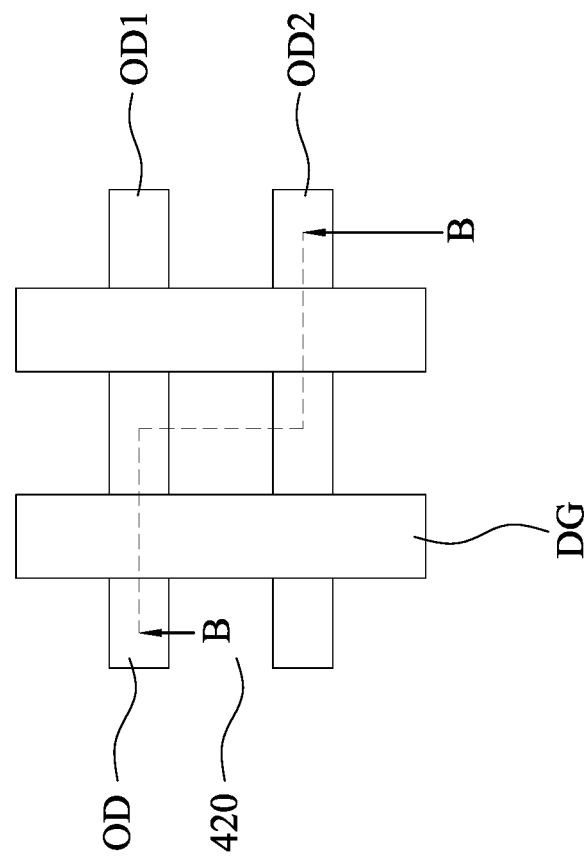
Figure 21B:
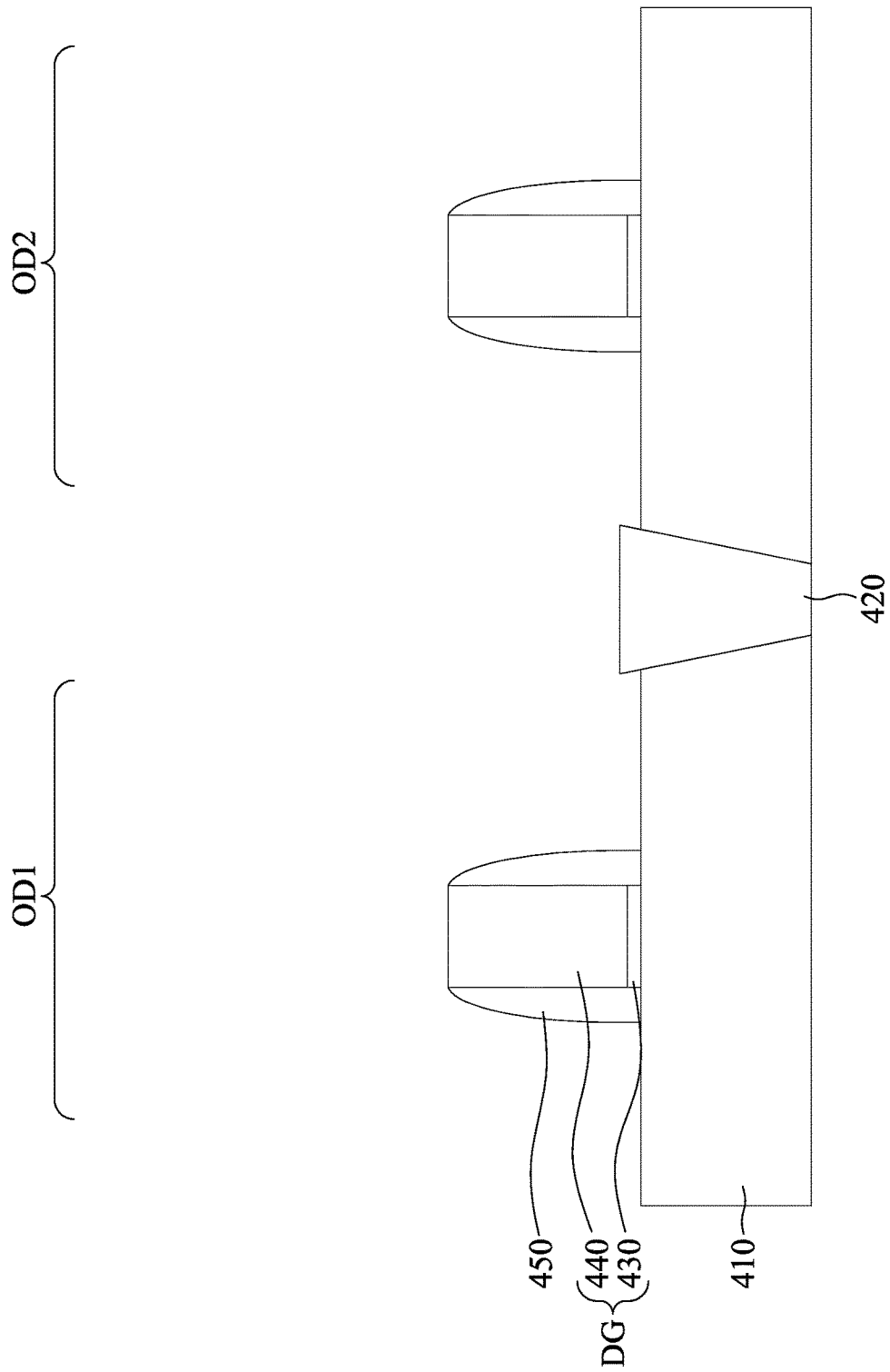

Reference is made to FIGS. 19A, 21A, and 21B. FIG. 21B is a cross-sectional view taken along line B-B in FIG. 21A. The method 300 proceeds to step 304, where dummy gate structures DG are formed over the active regions OD1 and OD2. Each of the dummy gate structures DG may include a gate dielectric 430 and a dummy gate electrode 440 over the gate dielectric 430. Formation of the dummy gate structures DG includes forming a gate dielectric layer over the active regions OD1 and OD2, depositing a dummy gate electrode layer over the gate dielectric layer, and patterning the gate dielectric layer and the dummy gate electrode layer into the gate dielectrics 430 and the dummy gate electrodes 440.

In some embodiments, the gate dielectric layer may be formed of a suitable dielectric material such as silicon oxide, silicon oxynitride, silicon nitride, an oxide, a nitrogen-containing oxide, aluminum oxide, lanthanum oxide, hafnium oxide, zirconium oxide, hafnium oxynitride, combinations thereof and/or the like. In some embodiments where the gate dielectric layer includes oxides, the gate dielectric layer may be formed by a thermal oxidation process, CVD, other suitable deposition methods, or the like. In some embodiments, the dummy gate electrode layer may include polycrystalline-silicon (poly-Si), poly-crystalline silicon-germanium (poly-SiGe), metallic nitrides, metallic silicides, metallic oxides, or metals. The dummy gate electrode layer may be deposited by CVD, physical vapor deposition (PVD), sputter deposition, or other techniques suitable for depositing conductive materials.

One or more etching processes are performed to pattern the gate dielectric layer and the dummy gate electrode layer into gate dielectrics 430 and dummy gate electrodes 440, which are collectively referred to as gate structures DG. The gate structures DG have substantially parallel longitudinal axes that are substantially perpendicular to longitudinal axes of the active regions OD. For example, the gate structures DG extends along the direction Y substantially perpendicular to the direction X that the active regions OD extends along. In some embodiments, portions of the active regions OD covered by the gate structure DG may be referred to as channel regions of the active regions OD, which will serve as transistor channels. In some embodiments, the gate structures DG will be replaced with a replacement gate structure using a "gate-last" or replacement-gate process, and thus the gate structures DG may be referred to as dummy gate structures.

In some embodiments, prior to the etching process, a patterned mask is formed over a portion of the dummy gate electrode layer. The patterned mask may be a hard mask for protecting the underlying dummy gate electrode layer and the gate dielectric layer against subsequent etching process. The patterned mask may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). The patterned mask may be removed after the etching.

In FIG. 21B, after the formation of the dummy gate structures DG, gate spacer 450 are formed on opposite sidewalls of the dummy gate structures DG. In some embodiments, the gate spacers 450 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 450 may include a single layer or multilayer structure made of different dielectric materials. The method of forming the gate spacers 450 includes blanket forming a dielectric layer on the substrate 410 using, for example, CVD, PVD or ALD, and then performing an etching process such as anisotropic etching to remove horizontal portions of the dielectric layer. The remaining portions of the dielectric layer on sidewalls of the dummy gate structures DG can serve as the gate spacers 450. In some embodiments, the gate spacers 450 may be used to offset subsequently formed doped regions, such as source/drain regions. The gate spacers 450 may further be used for designing or modifying the source/drain region profile.

Figure 22:
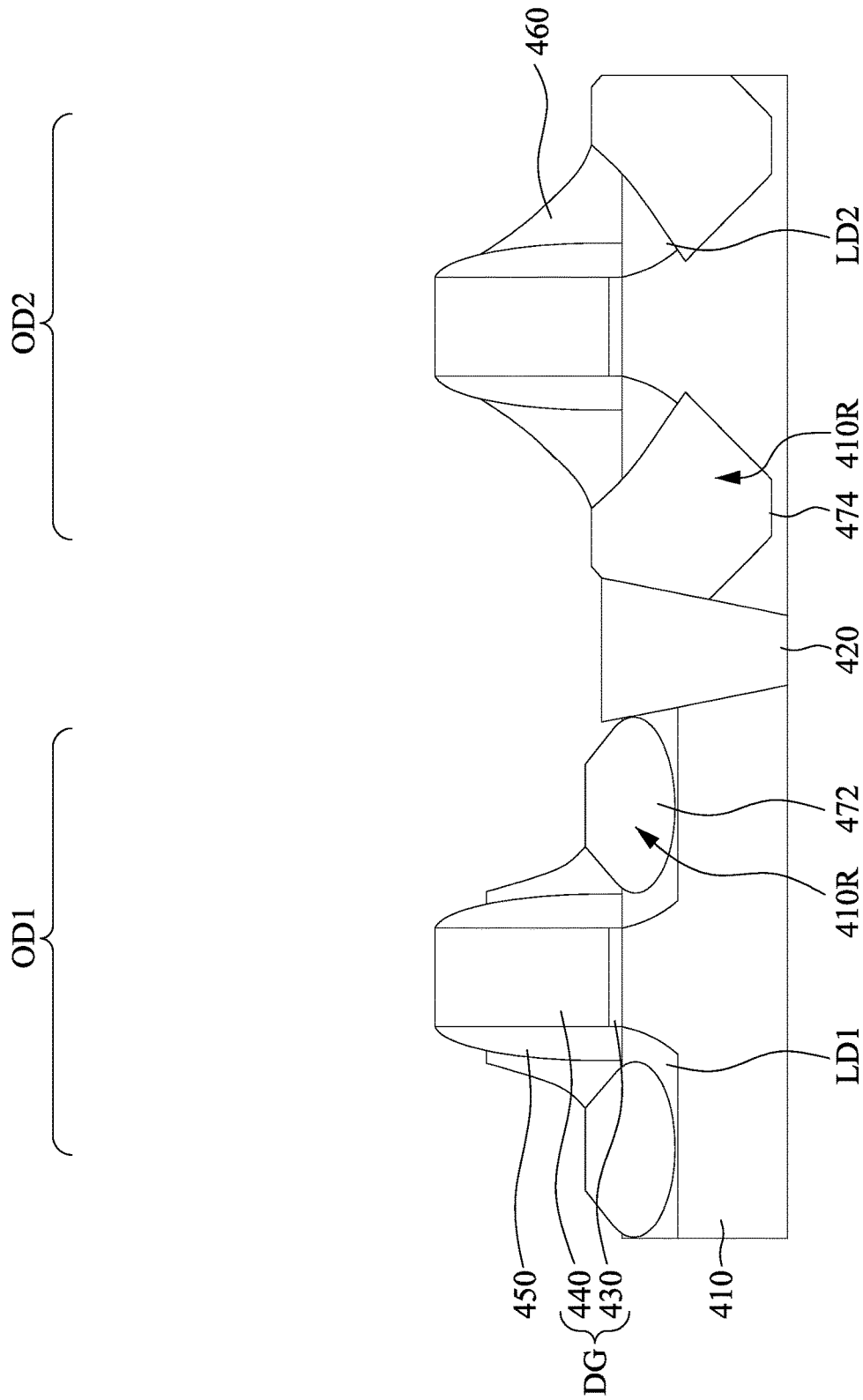

Reference is made to FIGS. 19A and 22. The method 300 proceeds to step 306, where source/drain features 472 and 474 are formed on opposite sides of the dummy gate structures DG. The source/drain features 472 and 474 may be formed using one or more epitaxy or epitaxial (epi) processes, such that Si features, SiGe features, silicon phosphate (SiP) features, silicon carbide (SiC) features and/or other suitable features can be epitaxially grown in a crystalline state. In some embodiments, depending on device requirement, materials of the source/drain features 472 and 474 may be different from each other. For example, in some embodiments where n-type transistors are to be formed over the active region OD1, SiP source/drain features 472 are formed in the active region OD1. For example, in some embodiments where p-type transistors are to be formed over the active region OD2, SiGe source/drain features 474 are formed in the active region OD2.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor substrate 410 (e.g., silicon, silicon germanium, silicon phosphate, or the like). The epitaxial source/drain features 472 and 474 may be in-situ doped. The doping species include p-type dopants, such as boron or $BF_2$; n-type dopants, such as phosphorus or arsenic; and/or other suitable dopants including combinations thereof. If the epitaxial source/drain features 472 and 474 are not in-situ doped, a second implantation process (i.e., a junction implant process) is performed to dope the epitaxial source/drain features 472 and 474. One or more annealing processes may be performed to activate the epitaxial source/drain features 472 and 474. The annealing processes include rapid thermal annealing (RTA) and/or laser annealing processes.

In some embodiments, prior to forming the source/drain features 472 and 474, plural implantation processes are performed to dope portions of the active regions OD1 and OD2 uncovered by the gate structure DG, thereby forming lightly doped regions LD1 and LD2 in the active regions OD1 and OD2. The lightly doped regions LD1 and LD2 in the active regions OD1 and OD2 might be of different conductivity types. For example, in some embodiments where n-type transistors are to be formed over the active region OD1, a n-type lightly doped region LD1 is formed in the active region OD1. For example, in some embodiments where p-type transistors are to be formed over the active region OD2, a p-type lightly doped region LD2 is formed in the active region OD2.

After forming the lightly doped regions LD1 and LD2, a dielectric layer 460 may be formed over the substrate 410, and the dielectric layer 460 is etched to expose portions of the active regions OD1 and OD2. In the present embodiments, the exposed portions of the active regions OD1 and OD2 may be recessed by suitable etching process, and then the source/drain features 472 and 474 are formed over the recessed portions of the active regions OD1 and OD2. For example, the recessing process forms recesses 410R in the active regions OD1 and OD2, and the source/drain features 472 and 474 are formed in the recesses 410R in the active regions OD1 and OD2, respectively. The dielectric layer 460 may include a material different from that of the gate spacers 450, such that an etch selectivity is shown between the dielectric layer 460 and the gate spacers 450 during the etching process. For example, etching the dielectric layer to expose portions of the active regions OD1 and OD2 may not substantially damage the gate spacers 450. The dielectric layer 460 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. In some embodiments, the dielectric layer 460 may also be referred to as a spacer.

Figure 23:
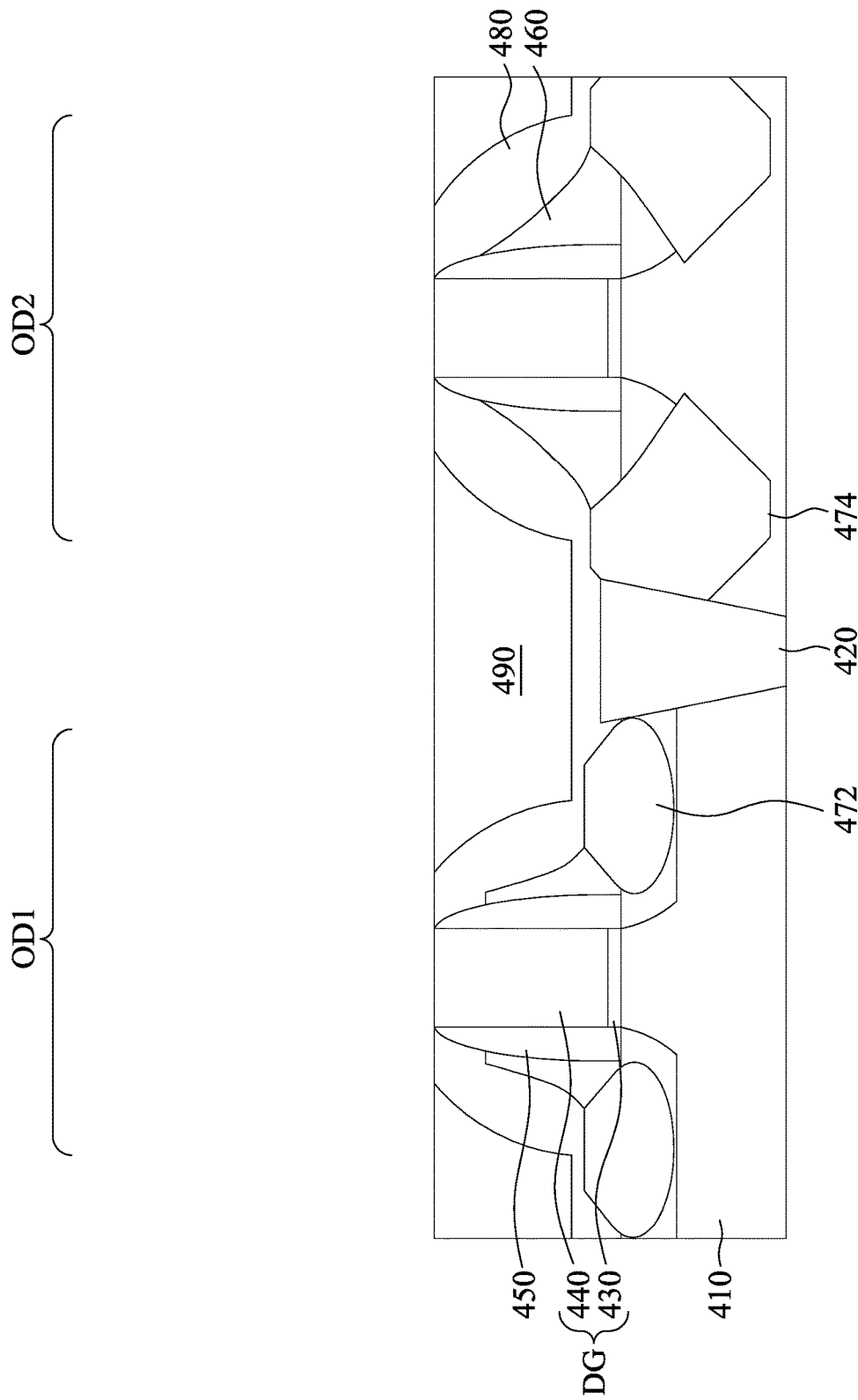

Reference is made to FIGS. 19A and 23. The method 300 proceeds to step 308, an interlayer dielectric (ILD) layer 490 is deposited over the structure shown in FIG. 22. The ILD layer 490 may cover the source/drain features 472 and 474. Afterwards, a chemical mechanical polish (CMP) process may be optionally performed to remove excessive material of the ILD layer 490 to expose the dummy gate structures DG. The CMP process may planarize a top surface of the ILD layer 490 with top surfaces of the gate structures DG, and the gate spacers 450. In some embodiments, the ILD layer 490 may include silicon oxide, silicon nitride, silicon oxynitride, tetraethoxysilane (TEOS) oxide, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 490 may be formed using, for example, CVD, ALD, spin-on-glass (SOG) or other suitable techniques.

In some embodiments, prior to depositing the ILD layer 490, a contact etch stop layer (CESL) 480 may be optionally blanket formed on the structure shown in FIG. 22, and then the ILD layer 490 is deposited over the CESL layer 480. That is, there is a CESL 480 between the epitaxial source/drain features 472/474 and the ILD layer 490. The CESL 480 may include a material different from the ILD layer 490. The CESL 480 may include silicon nitride, silicon oxynitride or other suitable materials. The CESL 480 can be formed using, for example, plasma enhanced CVD, low pressure CVD, ALD or other suitable techniques.

Figure 24A:
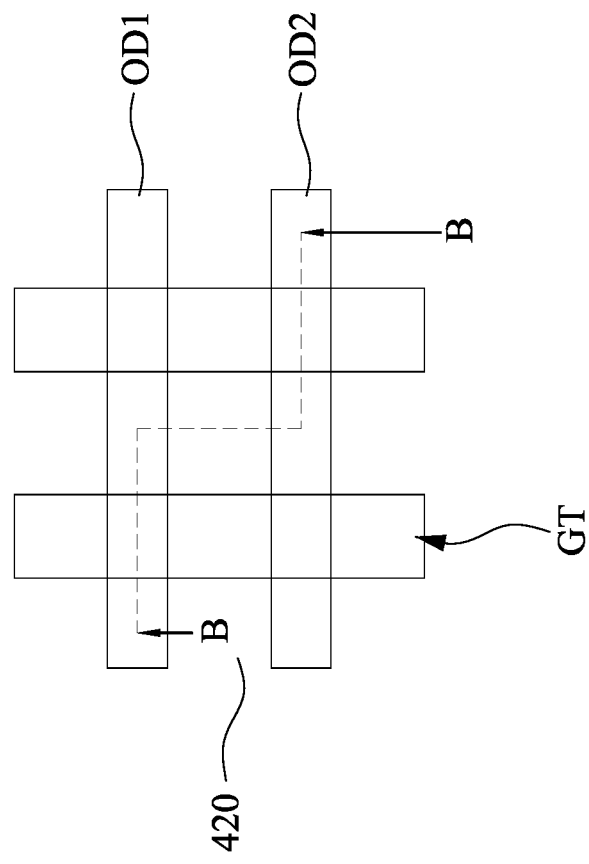
Figure 24B:
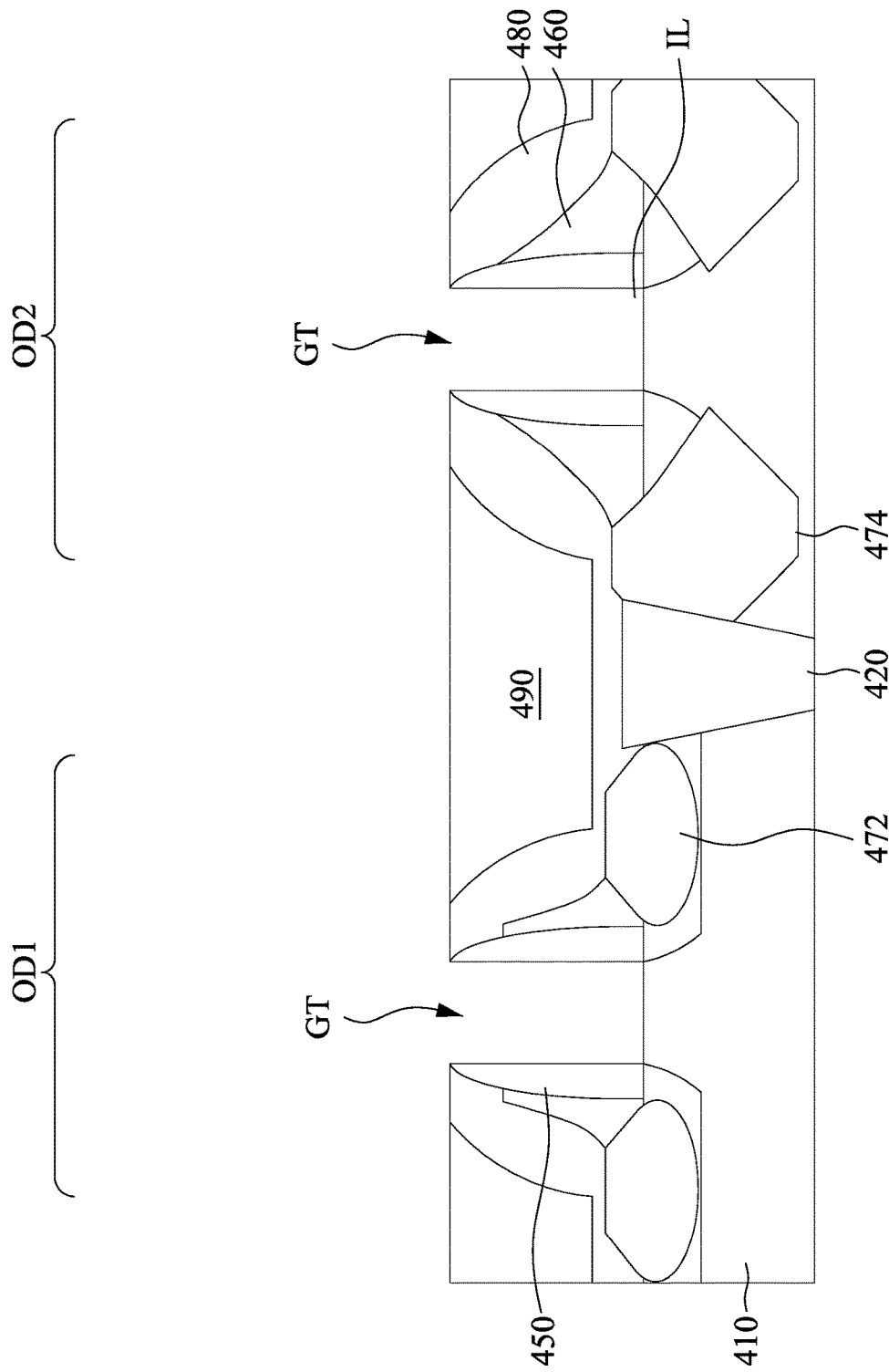

Reference is made to FIGS. 19A, 24A and 24B. FIG. 24B is a cross-sectional view taken along line B-B in FIG. 24A. The method 300 proceeds to step 310, where at least a portion of the dummy gate structure DG (referring to FIG. 23) is removed to leave a gate trench GT between the gate spacers 450. In the present embodiments, both the gate electrode 440 and the gate dielectric 430 of the gate structures DG (referring to FIG. 23) are removed to leave the gate trenches GT between the gate spacers 450. The removal of the dummy gate structure DG (referring to FIG. 23) may include one or more etching processes, such as dry etch, wet etch, or the combination thereof. The gate trenches GT may expose portions of the substrate 410. In some other embodiments, the gate electrode 440 of the gate structures DG (referring to FIG. 23) is removed to leave gate trenches GT between the gate spacers 450, and the gate dielectric 430 remains between the gate spacers 450.

Figure 25:
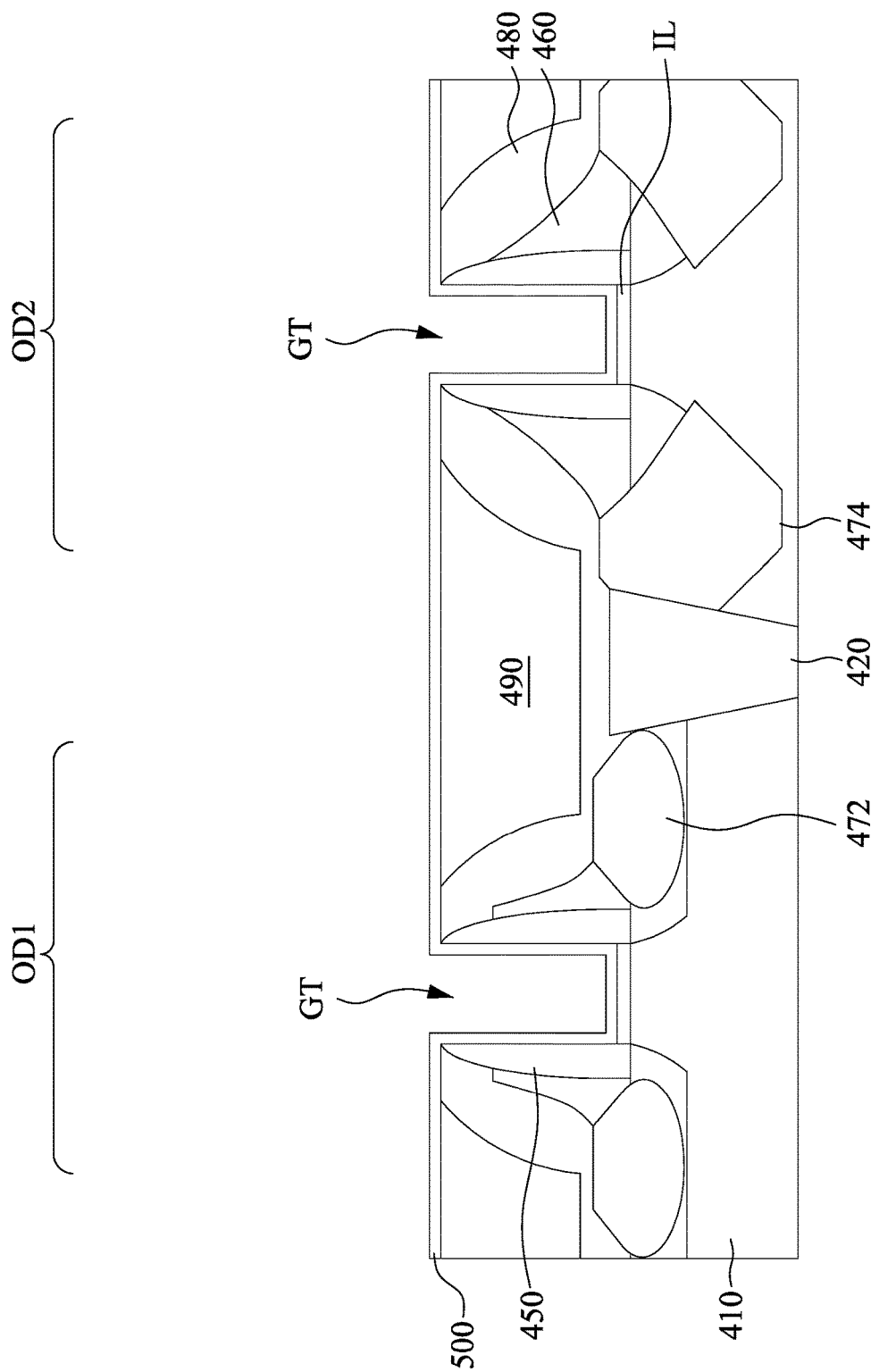

Reference is made to FIGS. 19A and 25. The method 300 proceeds to step 312, where a high-k dielectric layer 500 is deposited into the gate trench GT. The high-k dielectric layer 500 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In some embodiments, one layer of silicon oxide (e.g., interfacial layer IL) may be formed over the exposed portion of the substrate 410 by thermal oxidation process prior to the deposition of the high-k dielectric layer 500.

Figure 26:
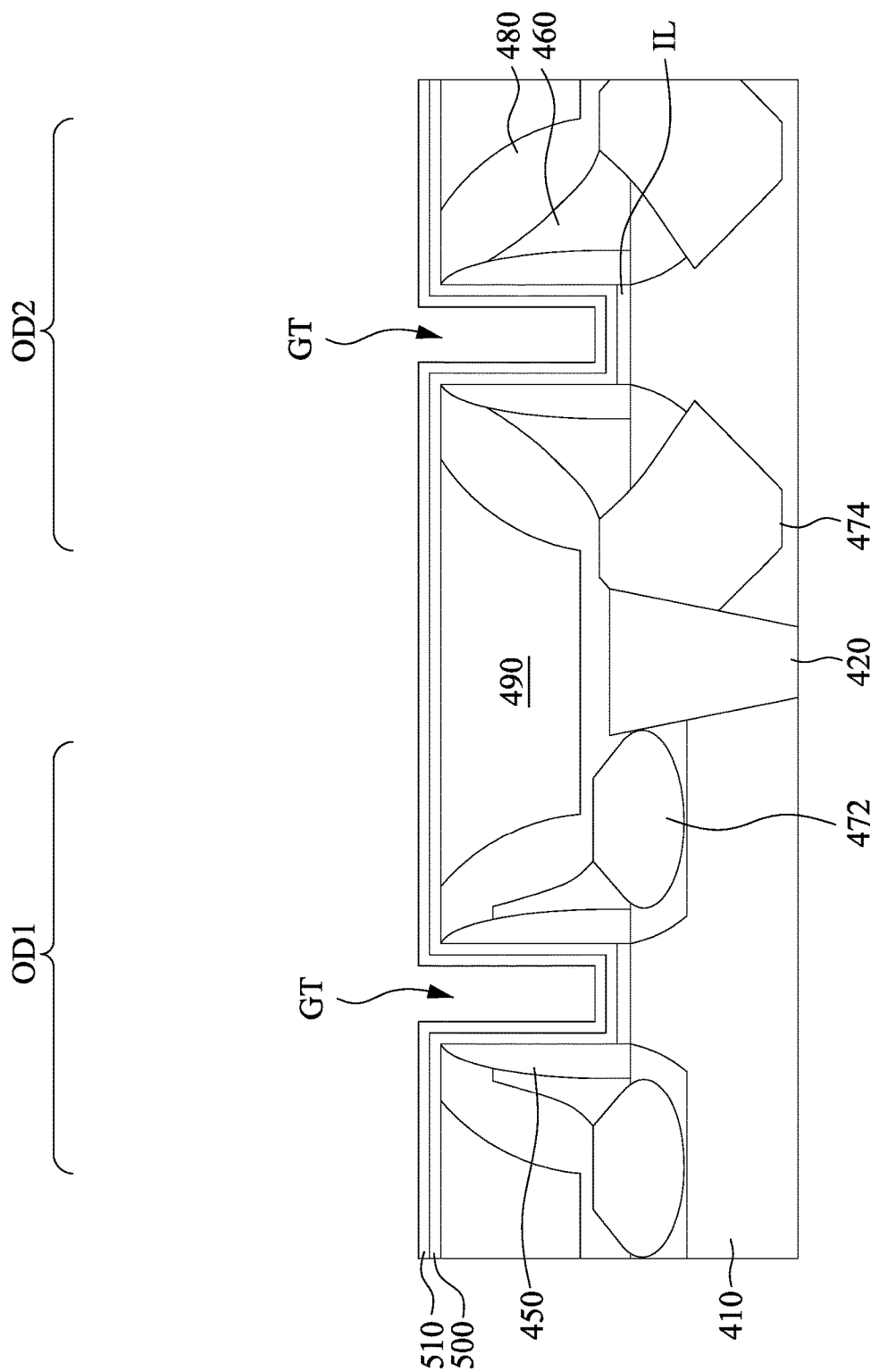

Reference is made to FIGS. 19A and 26. The method 300 proceeds to step 314, where a first work functional metal layer 510 is deposited into the gate trench GT and over the high-k dielectric layer 500. The first work functional metal layer 510 includes work function metals to provide a suitable work function for the conductive metal. In some embodiments, the first work functional metal layer 510 may include one or more n-type work function metals (N-metal).

The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the first work functional metal layer 510 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the first work functional metal layer 510 is formed by ALD process.

Figure 27:
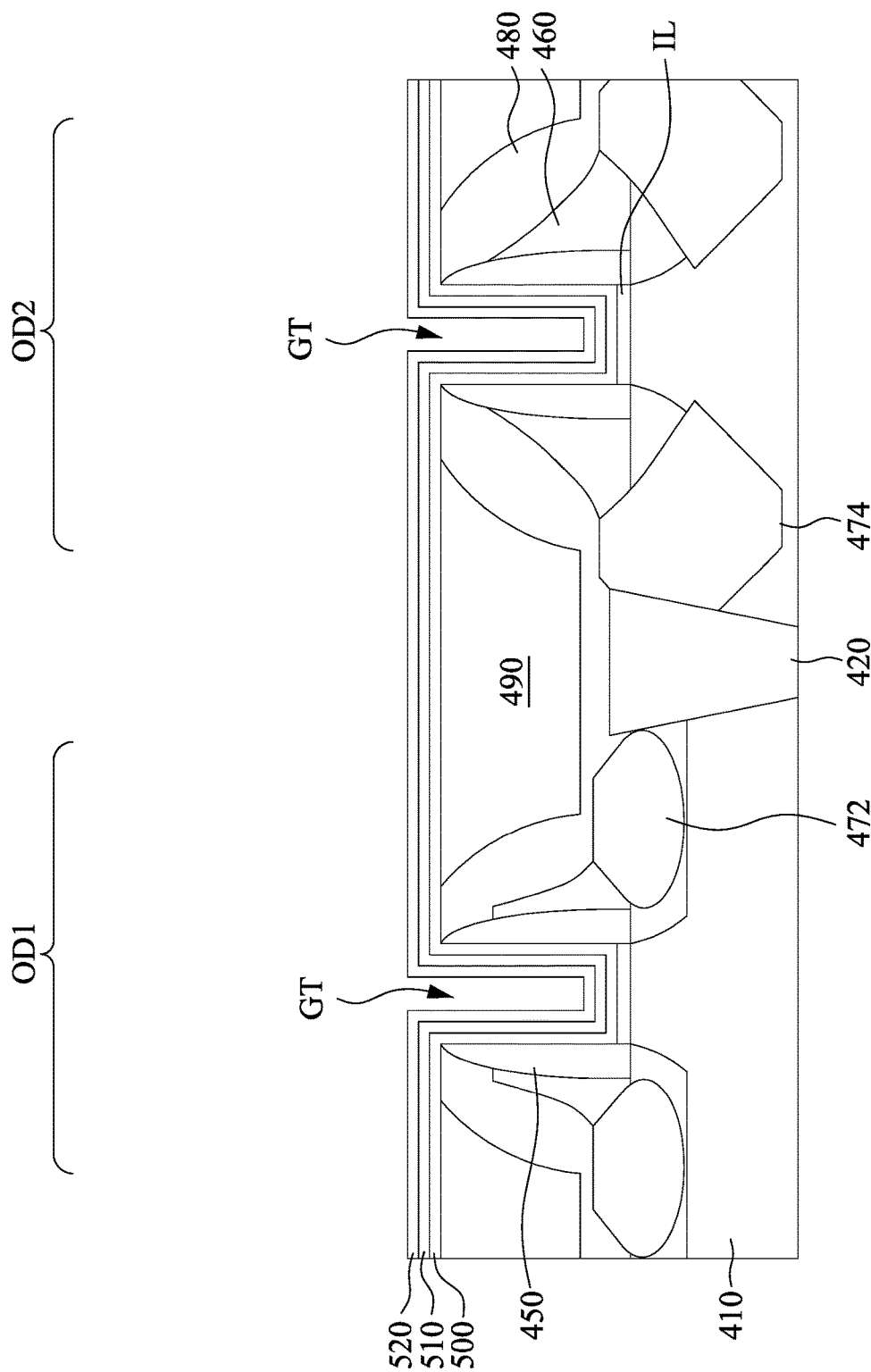

Reference is made to FIGS. 19B and 27. The method 300 proceeds to step 316, where a second work functional metal layer 520 is deposited into the gate trench GT and over the first work functional metal layer 510. The second work functional metal layer 520 includes work function metals to provide a suitable work function for the conductive metal. In some embodiments, a work function metal of the second work functional metal layer 520 is different from a work function metal of the first work functional metal layer 510. In some embodiments, the second work functional metal layer 520 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some alternative embodiments, the second work functional metal layer 520 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In some embodiments, the second work functional metal layer 520 is formed by ALD process.

Figure 28A:
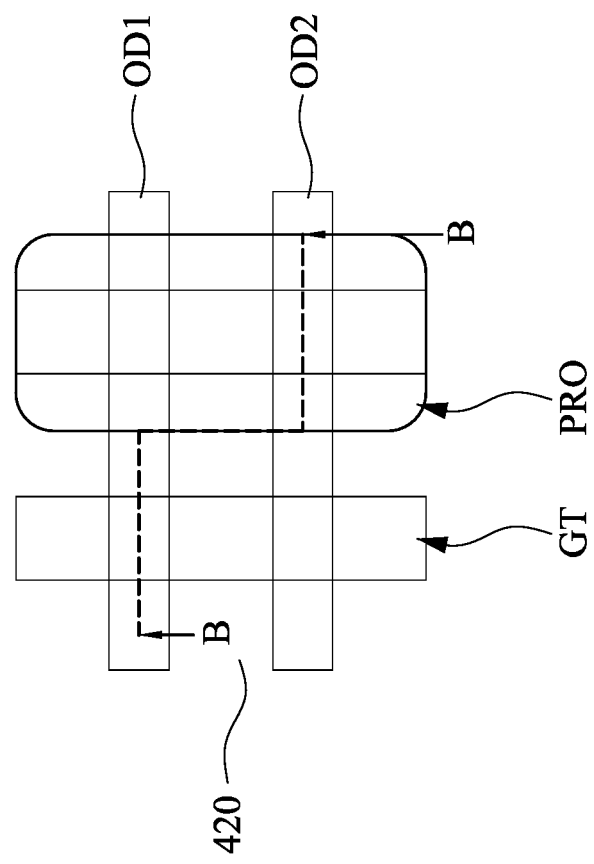
Figure 28B:
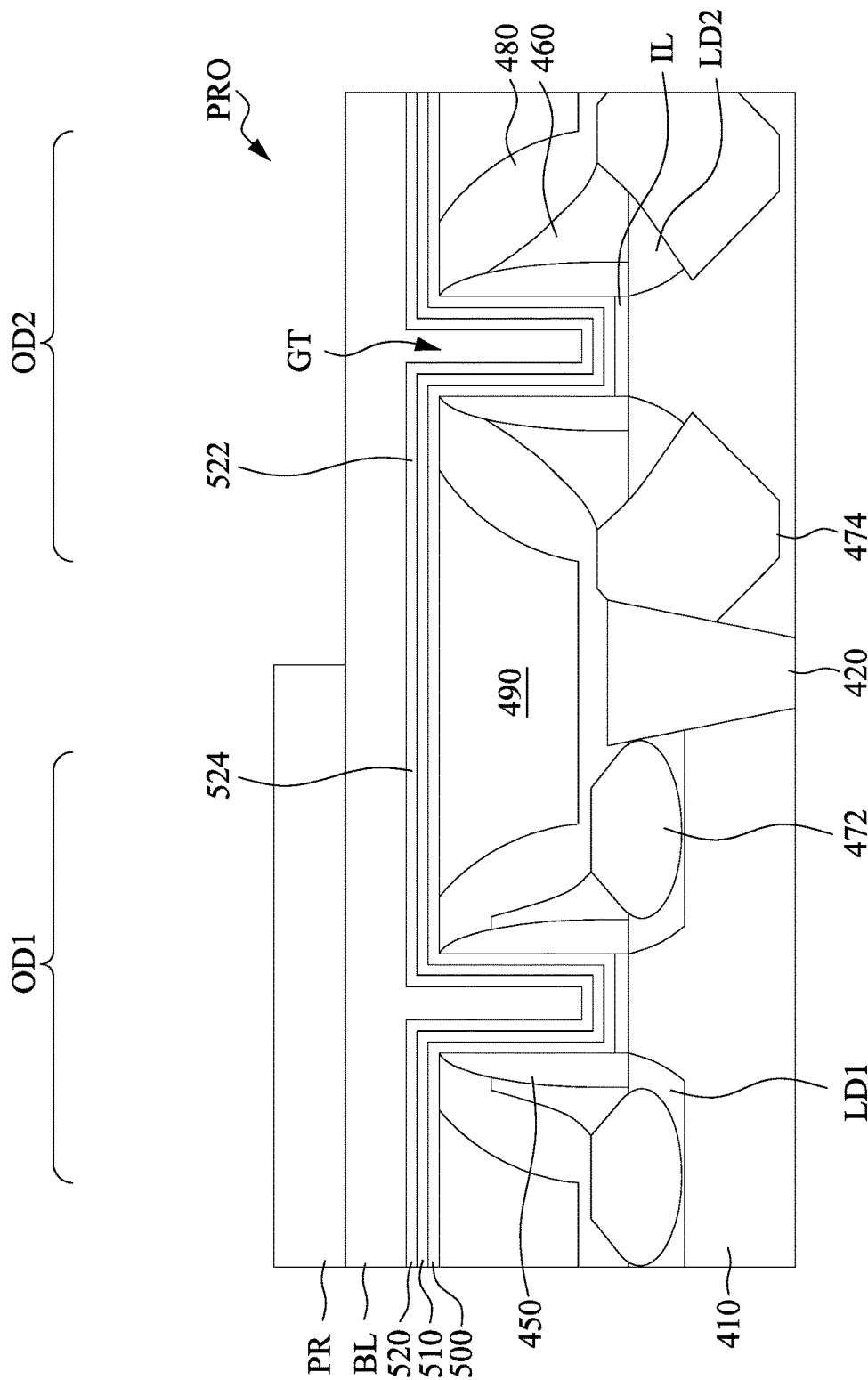

Reference is made to FIGS. 19B, and 28A to 28B. FIG. 28B is a cross-sectional view taken along line B-B in FIG. 28A. The method 300 proceeds to step 318, where a photolithography process is performed to form a photoresist layer PR over the second work functional metal layer 520. The photoresist layer PR may cover a portion 524 of the second work functional metal layer 520, and have an opening PRO over a portion 522 of the second work functional metal layer 520. Details of the photolithography process may be similar to those illustrated above in the embodiments of FIGS. 1-9B, and not repeated herein.

In some embodiments, prior to forming the photoresist layer PR, a bottom anti-reflection coating (BARC) layer BL is formed over the second work functional metal layer 520. The BARC layer BL may be formed of a nitride material, an organic material, an oxide material, the like, or the combination thereof. The BARC layer BL may be formed using suitable techniques such as CVD, the like, or the combination thereof. The BARC layer BL is used for enhancing pattern transfer to the underlying layers (e.g., the second work functional metal layer 520) during a patterning process.

Figure 29:
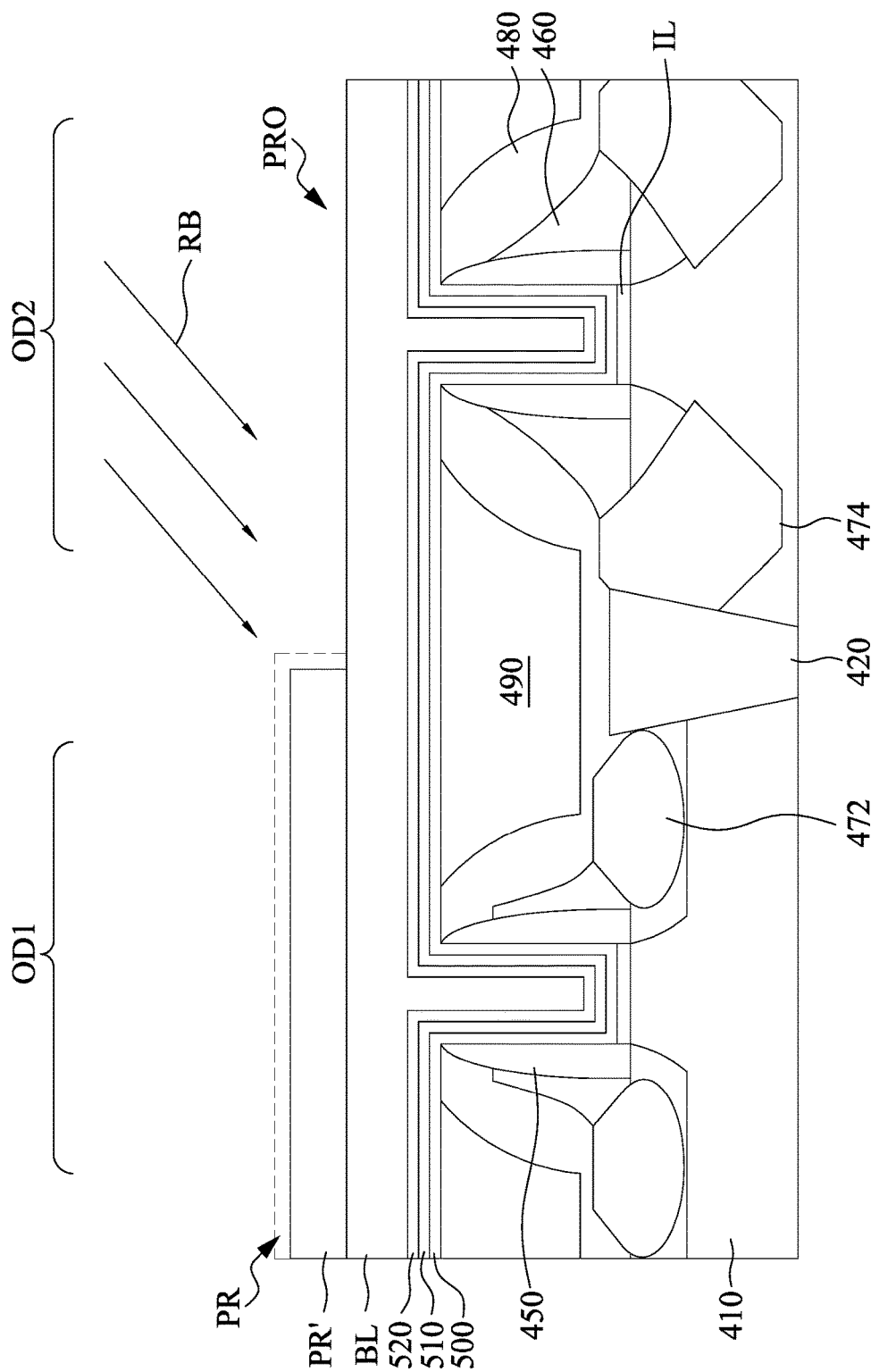

Reference is made to FIGS. 19B and 29. The method 300 proceeds to step 320, where a directional treatment is performed to the photoresist layer PR. As illustrated previously, the directional treatment may use the beam RB to bombard exposed surfaces of the photoresist layer PR, thereby compressing the photoresist layer PR, which in turn will harden the photoresist layer PR. In some embodiments, the directional treatment may also sputter off a portion of photoresist layer PR adjacent to the opening PRO. By compressing and sputtering the photoresist layer PR, a portion of the photoresist layer PR adjacent to the opening PRO and a top surface of the photoresist layer PR may be removed during the directional treatment. After the directional treatment, the remaining portion of the photoresist layer PR is referred to as photoresist layer PR'. Since a number of C—C bonds in the treated photoresist layer PR' is greater than that in the original photoresist layer PR, the treated photoresist layer PR' is more resistant to subsequent etching process (e.g., etching the BARC layer BL) than the photoresist layer PR. Also, the edge of the opening PRO in the photoresist layer PR' may are pushed away from a center of the opening PRO.

Figure 30:
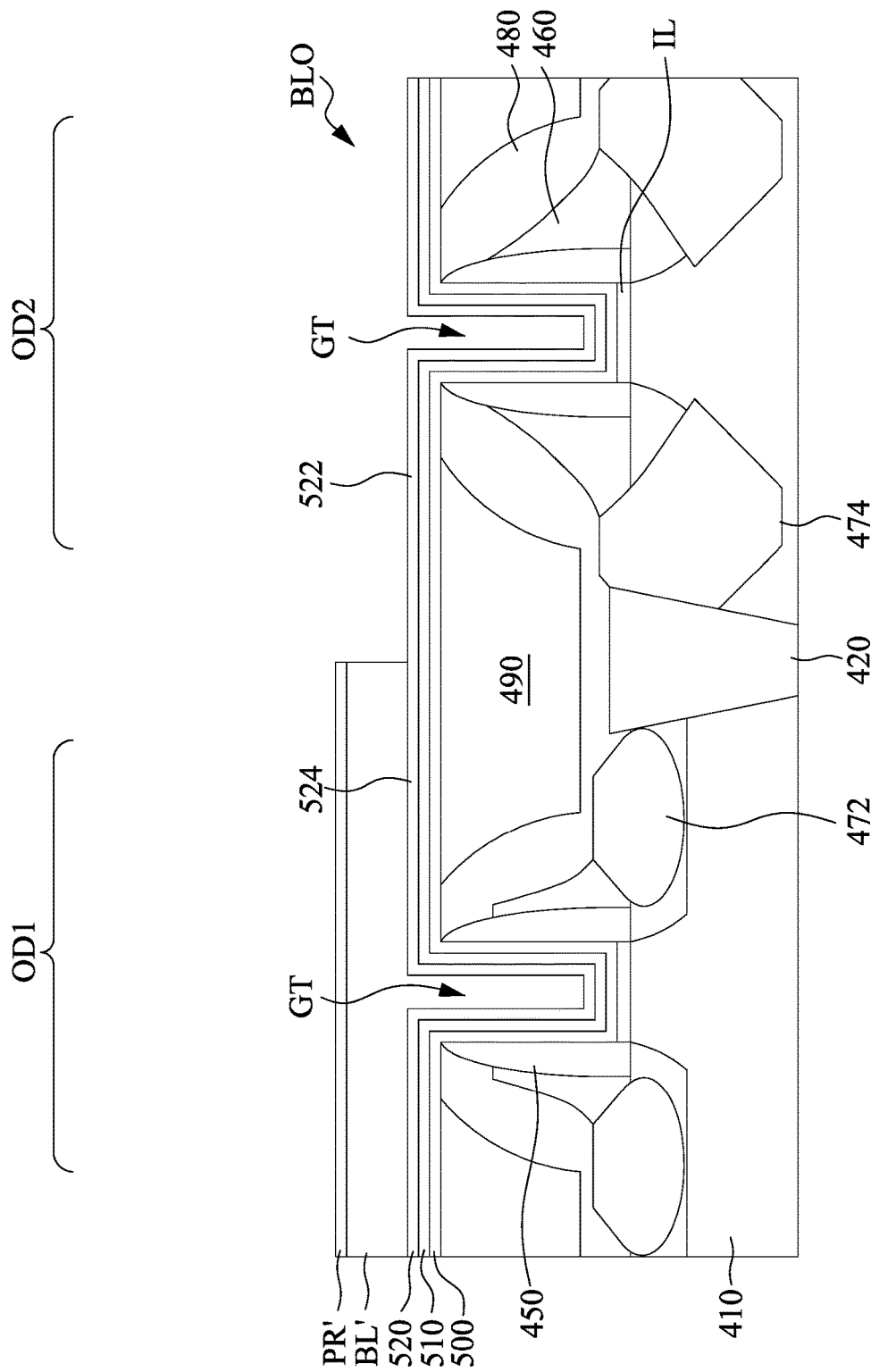

Reference is made to FIGS. 30. The BARC layer BL (referring to FIG. 29) is etched using the photoresist layer PR' as an etch mask. In some embodiments, the etching process include a dry etching process that uses suitable gas etchants. The photoresist layer PR' (referring to FIG. 29) may have a higher etch resistance to the gas etchants than that of the BARC layer BL (referring to FIG. 29). In this way, the etching process etches the BARC layer BL at a faster etch rate than etching the photoresist layer PR'. The dry etching process may remove a portion of the BARC layer BL (referring to FIG. 29) uncovered by the photoresist layer PR' (referring to FIG. 29), while a portion of the BARC layer BL (referring to FIG. 29) covered by the photoresist layer PR' (referring to FIG. 29) remains not removed. The remaining portion of the BARC layer BL (referring to FIG. 29) may be referred to as a BARC layer BL' hereinafter. In the present embodiments, the BARC layer BL' may have an opening BLO exposing the portion 522 of the second work functional metal layer 520 and covers the portion 524 of the second work functional metal layer 520. After etching the BARC layer BL (referring to FIG. 29), the remaining photoresist layer PR' (referring to FIG. 29) may be removed by a suitable ashing or stripping process. In some embodiments, the photoresist layer PR' may be completely consumed during patterning the BARC layer. In such embodiments, the photoresist ashing or stripping process may be omitted.

Figure 31:
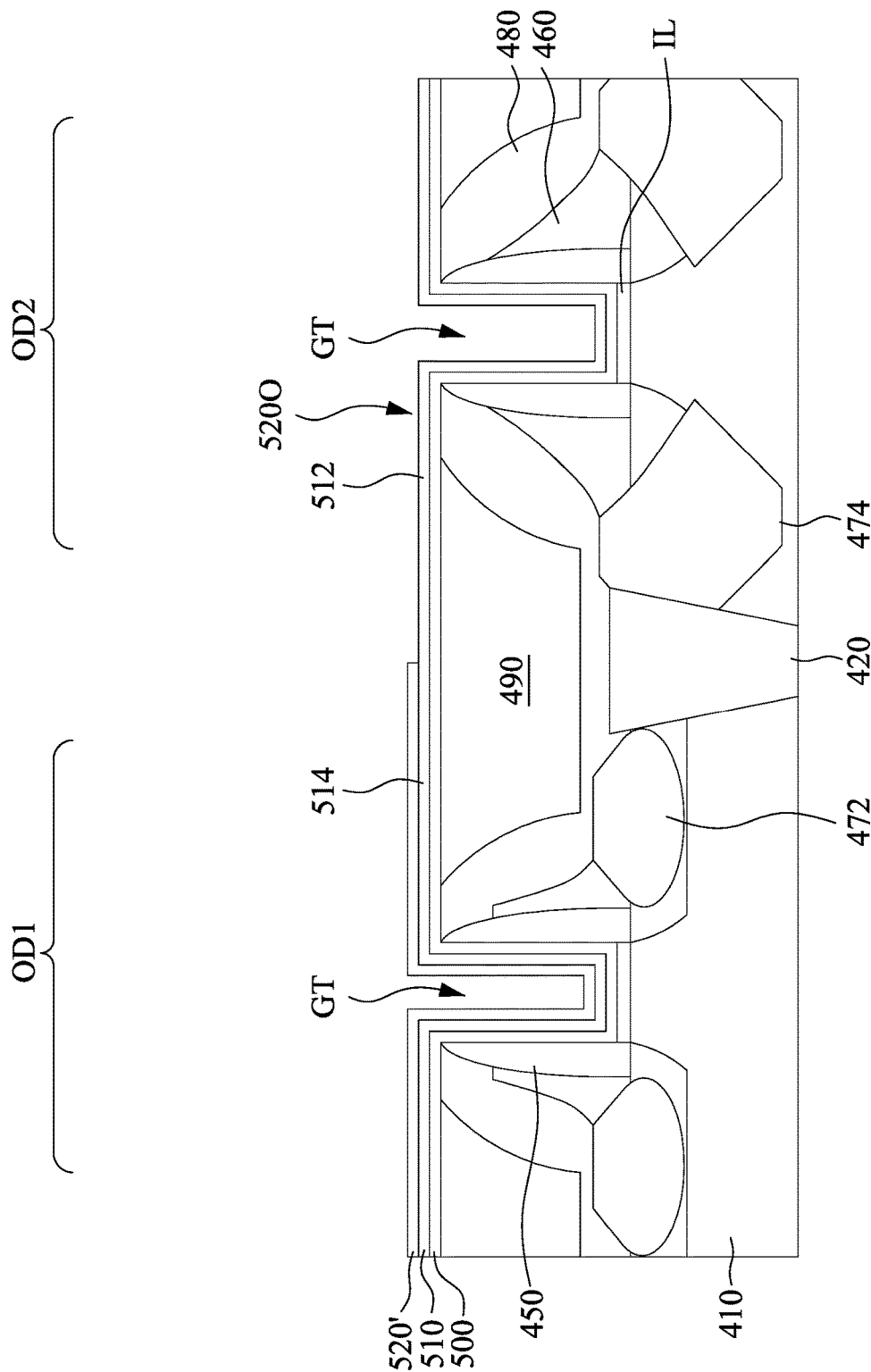

Reference is made to FIGS. 19B and 31. The method 300 proceeds to step 322, where the second work functional metal layer 520 is etched using the BARC layer BL' (referring to FIG. 30) as an etch mask. In some embodiments, the etching process include a wet etching process, a dry etching process, or the combination thereof. The BARC layer BL' (referring to FIG. 30) may have a higher etch resistance to etchants of the etching process than that of the second work functional metal layer 520. The etching process may remove the portion 522 of the second work functional metal layer 520 uncovered by the BARC layer BL' (referring to FIG. 30), while the portion 524 of the second work functional metal layer 520 covered by the BARC layer BL (referring to FIG. 30) is not removed. The remaining portion 524 of the second work functional metal layer 520 (referring to FIG. 30) may be referred to as a second work functional metal layer 520' hereinafter. In the present embodiments, the second work functional metal layer 520' may have an opening 520O exposing a portion 512 of the first work functional metal layer 510 over the region R2, and the second work functional metal layer 520' may cover a portion 514 of the first work functional metal layer 510. In some embodiments, the first work functional metal layer 510 may have a higher etch resistance to etchants of the etching process than that of the second work functional metal layer 520. That is, the etching process etches the second work functional metal layer 520 at a faster etch rate than etching the first work functional metal layer 510. Therefore, the first work functional metal layer 510 may have no or negligible loss in the etching process. After etching the second work functional metal layer 520, the BARC layer BL' (referring to FIG. 30) is removed by a suitable etching process.

Figure 32:
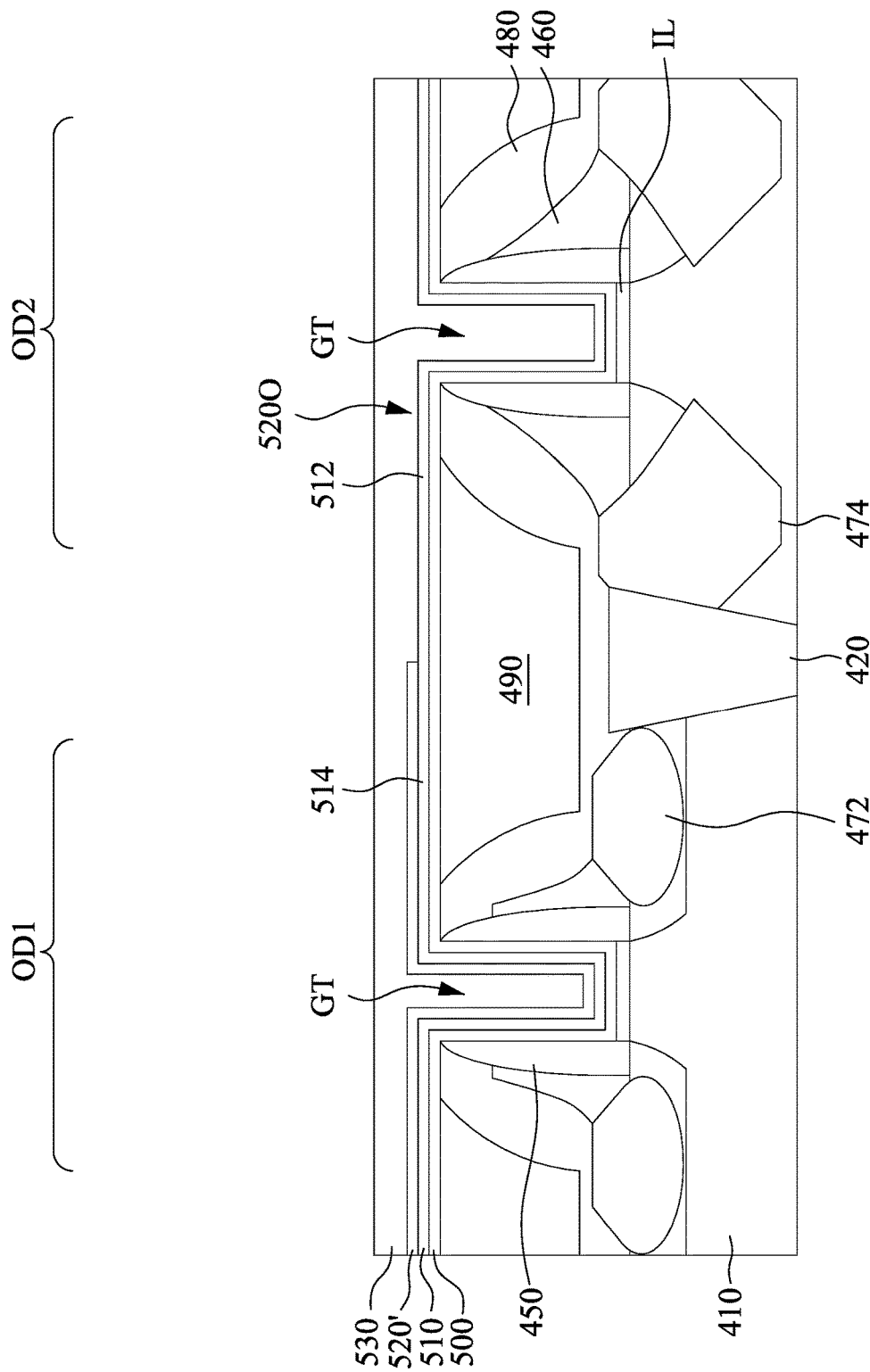

Reference is made to FIGS. 19B and 32. The method 300 proceeds to step 324, where the gate trench GT is filled with a fill metal 530. The fill metal 530 may include, for example, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, the fill metal 530 is formed by ALD, CVD, the like, or the combination thereof.

Figure 33A:
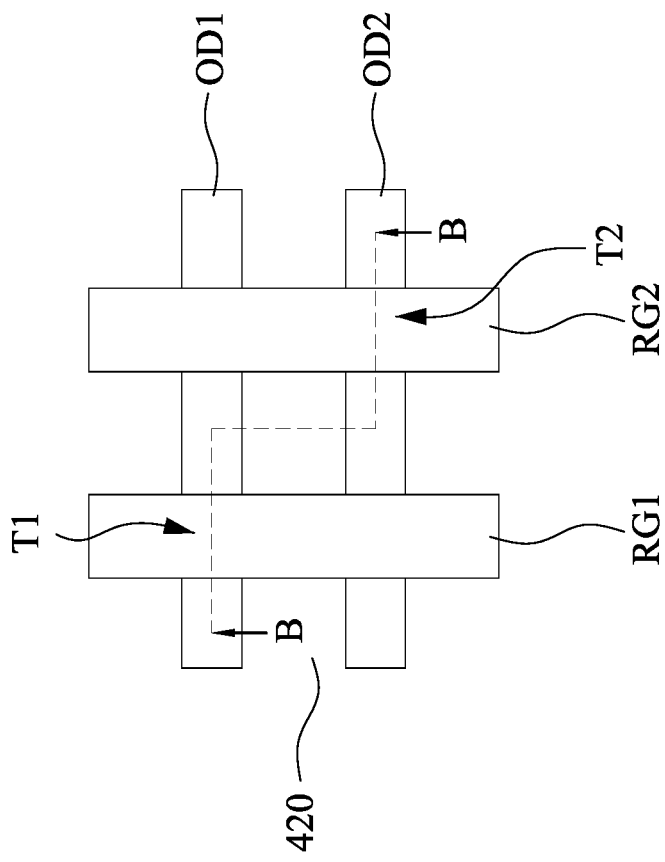
Figure 33B:
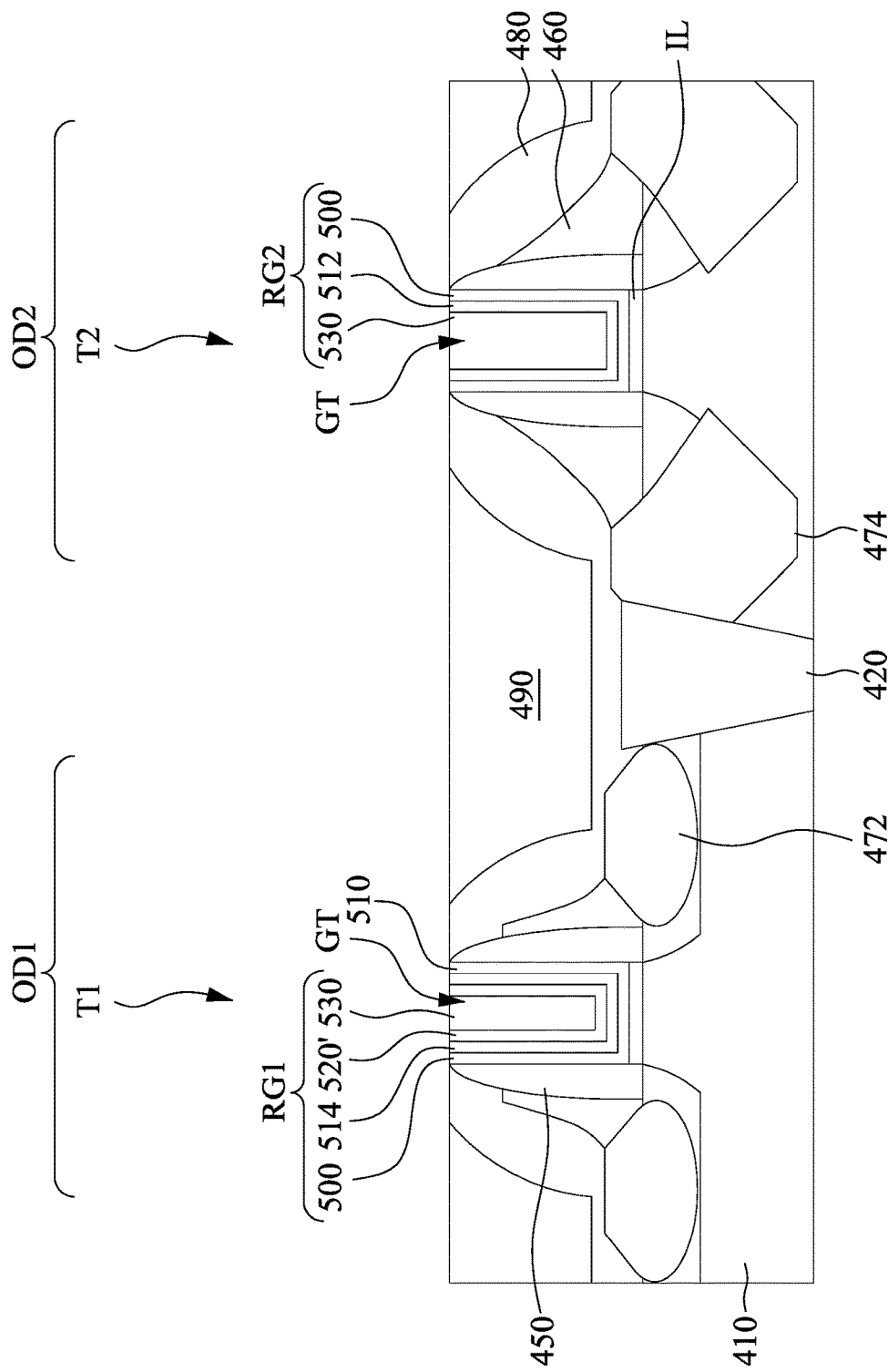

Reference is made to FIGS. 19B, 33A, and 33B. FIG. 33B is a cross-sectional view taken along line B-B in FIG. 33A. The method 300 proceeds to step 326, where a planarization process (e.g., CMP) is performed to remove excess material (e.g., the first and second work functional metal layers 510, 520, and the fill metal 530) external to the gate trenches GT. In FIG. 33B, in the left gate trench GT, the remaining portions of the gate dielectric layer (e.g., the layers IL and 500), the portion 514 of the first second work functional metal layer 510, the second work functional metal layer 520', and the fill metal 530 may be referred to as replacement gate structures RG1. In the right gate trench GT, the remaining portions of the gate dielectric layer (e.g., the layers IL and 500), the portion 512 of the first second work functional metal layer 510 and the fill metal 530 in the gate trenches GT may be referred to as replacement gate structures RG2.

By designing the replacement gate structures RG1 and RG2 having different work functional metal layers, the transistor devices T1 and T2 with different threshold voltages may be integrally formed. In the present embodiments, a threshold voltage of the transistor T2 having the replacement gate structures RG2 is greater than a threshold voltage of the transistor T1 having the replacement gate structures RG1. In some embodiments, a ratio of the threshold voltage of the transistor T2 to the threshold voltage of the transistor T1 is about 3:2. For example, the threshold voltage of the transistor T2 is about 1.5V, and the threshold voltage of the transistor T1 is about 1 V.

FIGS. 34A-43C illustrate a method for manufacturing a semiconductor device at various stages in accordance with some embodiments of the present disclosure. The present embodiments are similar to those of the embodiments of 20A-33B, except that the active regions OD are illustrated as semiconductor fins. Steps shown in FIGS. 19A and 19B may be applicable in the present embodiments. It is understood that additional steps may be provided before, during, and after the steps shown by FIGS. 34A-43C, and some of the steps described below can be replaced or eliminated for additional embodiments of the method. The order of the operations/processes may be interchangeable.

Figure 34A:
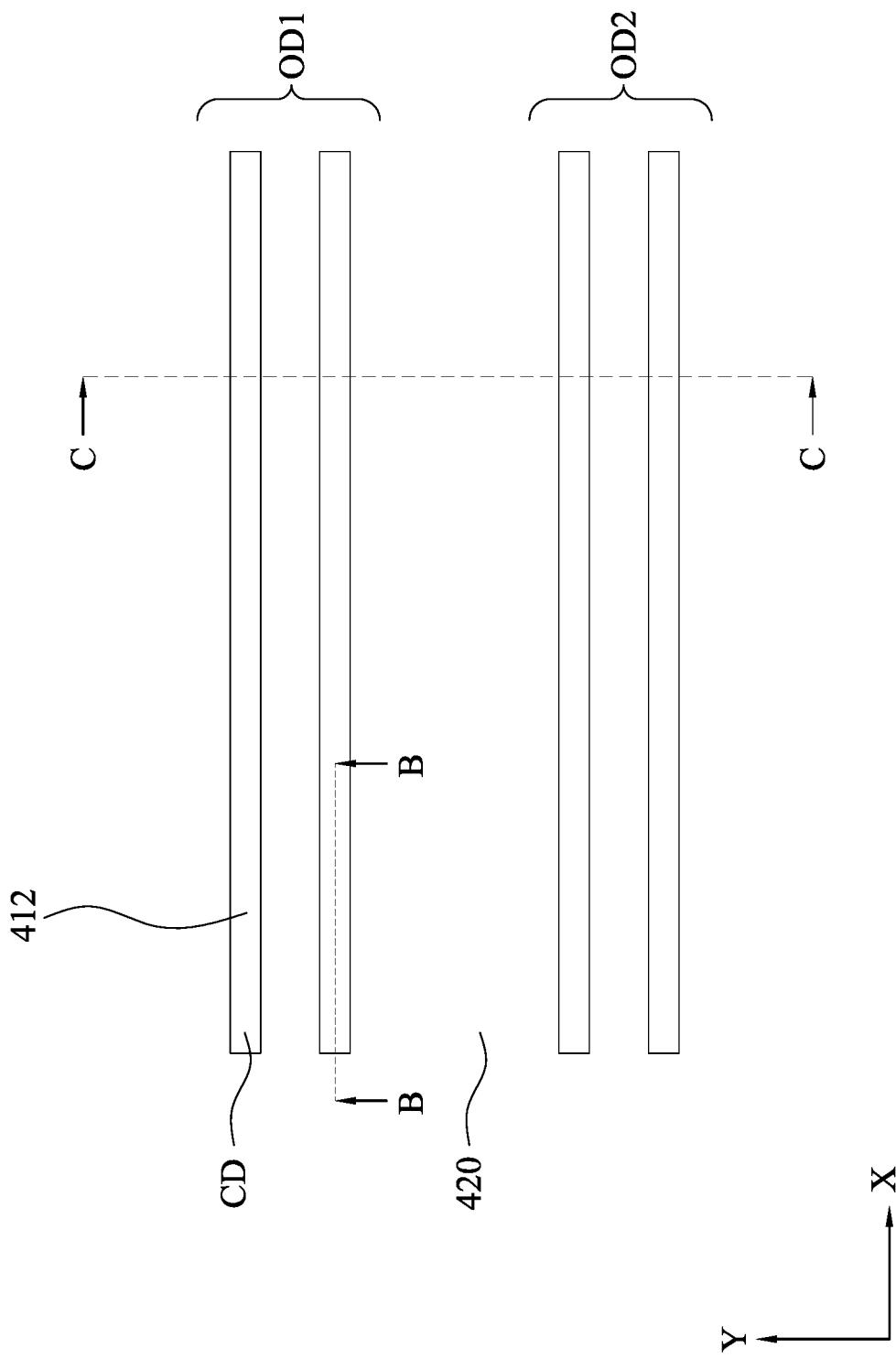
FIGS. 34A-43C illustrate a method for manufacturing a semiconductor device at various stages in accordance with some embodiments of the present disclosure.
Figure 34C:
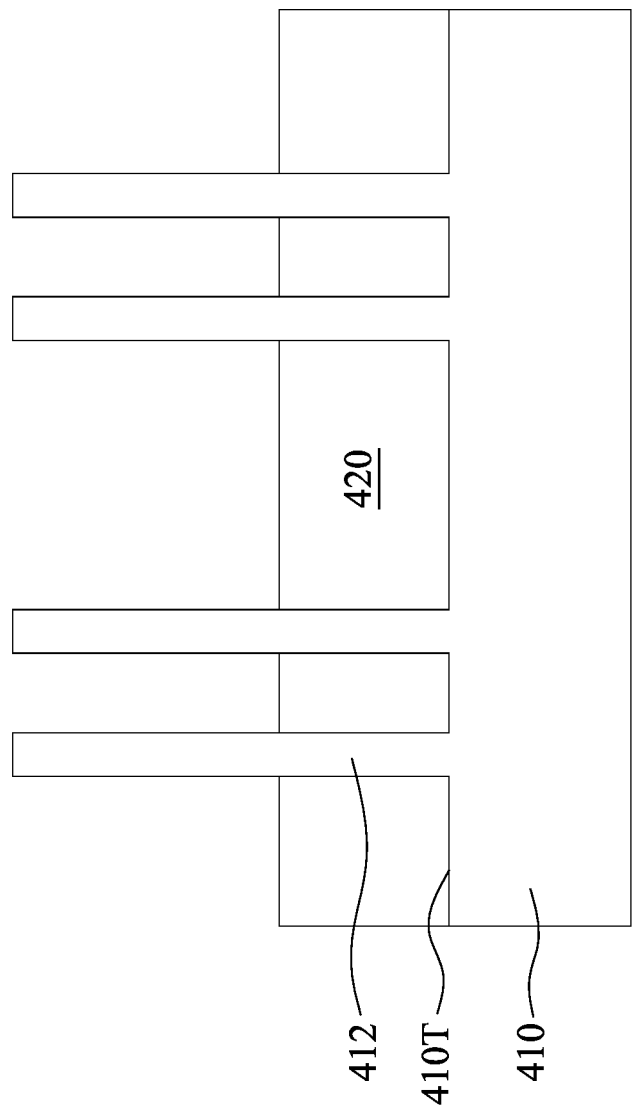

Reference is made to FIGS. 34A-34C. FIG. 34B is a cross-sectional view taken along line B-B in FIG. 34A. FIG. 34C is a cross-sectional view taken along line C-C in FIG. 34A. Isolation structures 420 are formed in a substrate 410 to define active regions OD. In some embodiments, isolation structure 420 may be formed using aforementioned shallow trench isolation (STI) processes. In the present embodiments, the isolation structure 420 is further recessed (e.g., by an etch back process) to fall below the top surfaces of the active region OD, such that the active region OD protrudes above the top surface of the recessed isolation structure 420 to form fin-like structures (e.g., semiconductor fins 412). For example, the semiconductor fins 412 protrudes from a top surface 410T of the substrate 410. The isolation structure 420 may space the active regions OD (e.g., semiconductor fins 412) from each other. Ion implantation may be performed to form well regions in the active regions OD, and the well regions in the active regions OD1 and OD2 may be of different conductivity types in some embodiments. For example, the well region in the active regions OD1 is a p-type well region, and n-type transistors are formed over the active regions OD1. For example, the well region in the active regions OD2 is a n-type well region, and p-type transistors are formed over the active regions OD2.

Figure 35A:
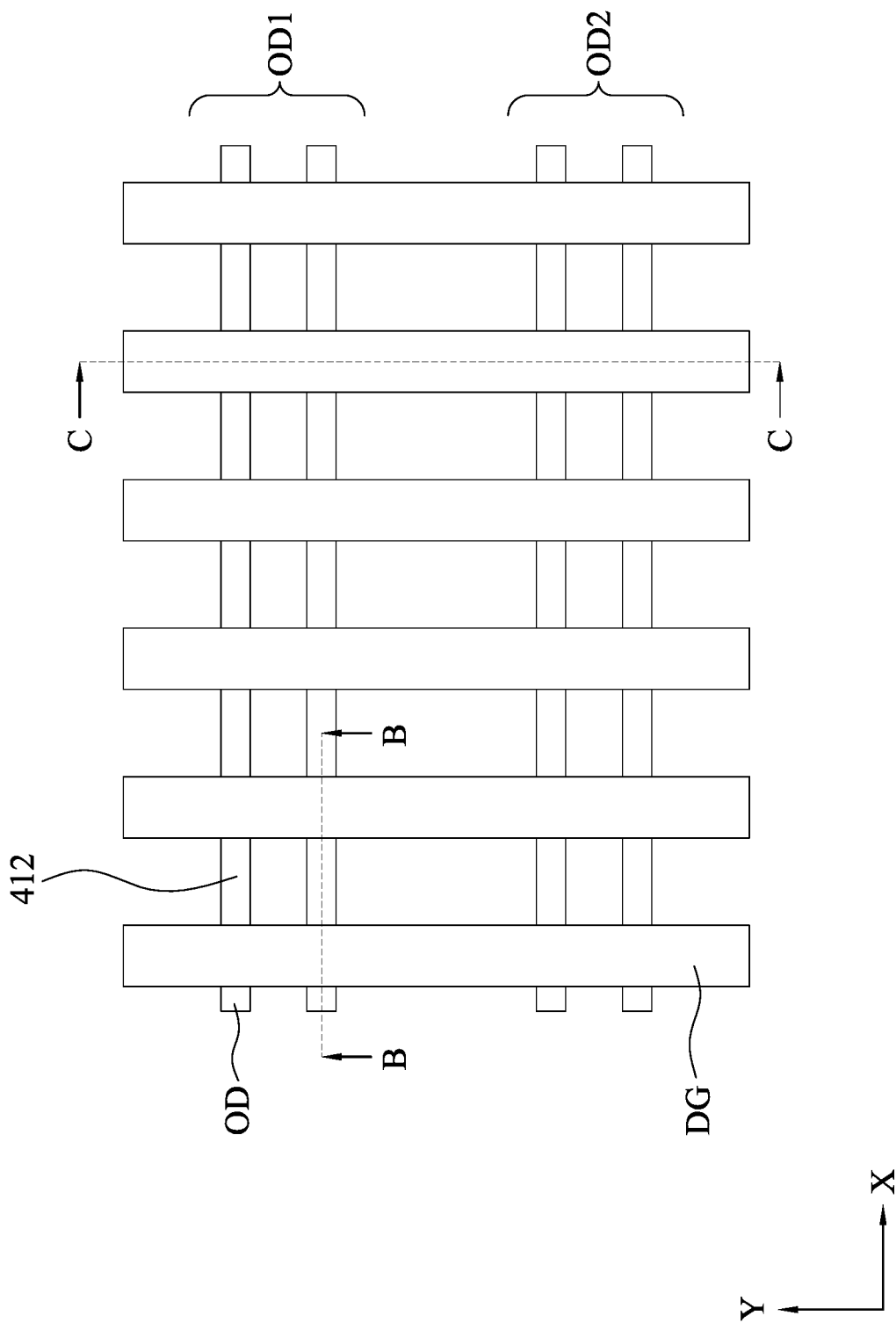
Figure 35C:
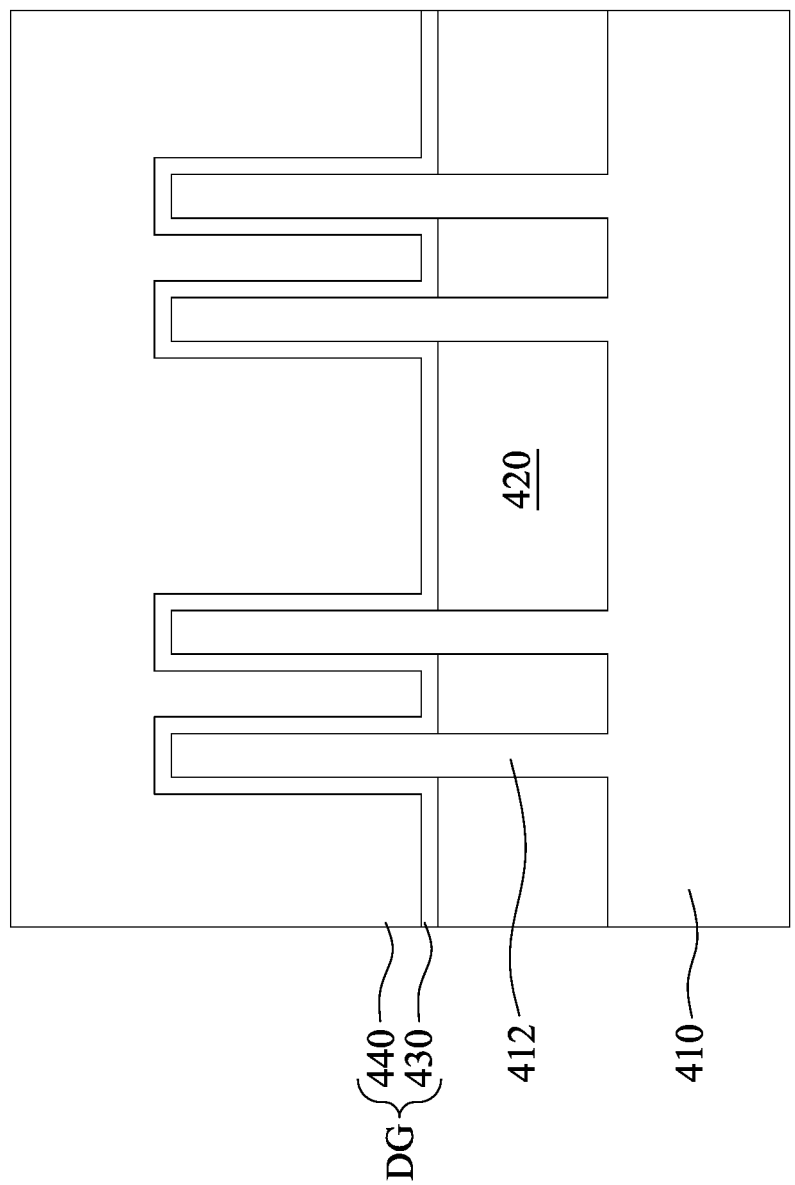

Reference is made to FIGS. 35A-35C. FIG. 35B is a cross-sectional view taken along line B-B in FIG. 35A. FIG. 35C is a cross-sectional view taken along line C-C in FIG. 35A. Dummy gate structures DG are formed over the semiconductor fins 412. The gate structures DG have substantially parallel longitudinal axes that are substantially perpendicular to longitudinal axes of the semiconductor fins 412. For example, the gate structures DG extends along the direction Y substantially perpendicular to the direction X that the semiconductor fins 412 extends along. Each of the dummy gate structures DG may include a gate dielectric 430 and a dummy gate electrode 440 over the gate dielectric 430. After the formation of the dummy gate structures DG, gate spacer 450 are formed on opposite sidewalls of the dummy gate structures DG.

Figure 36:
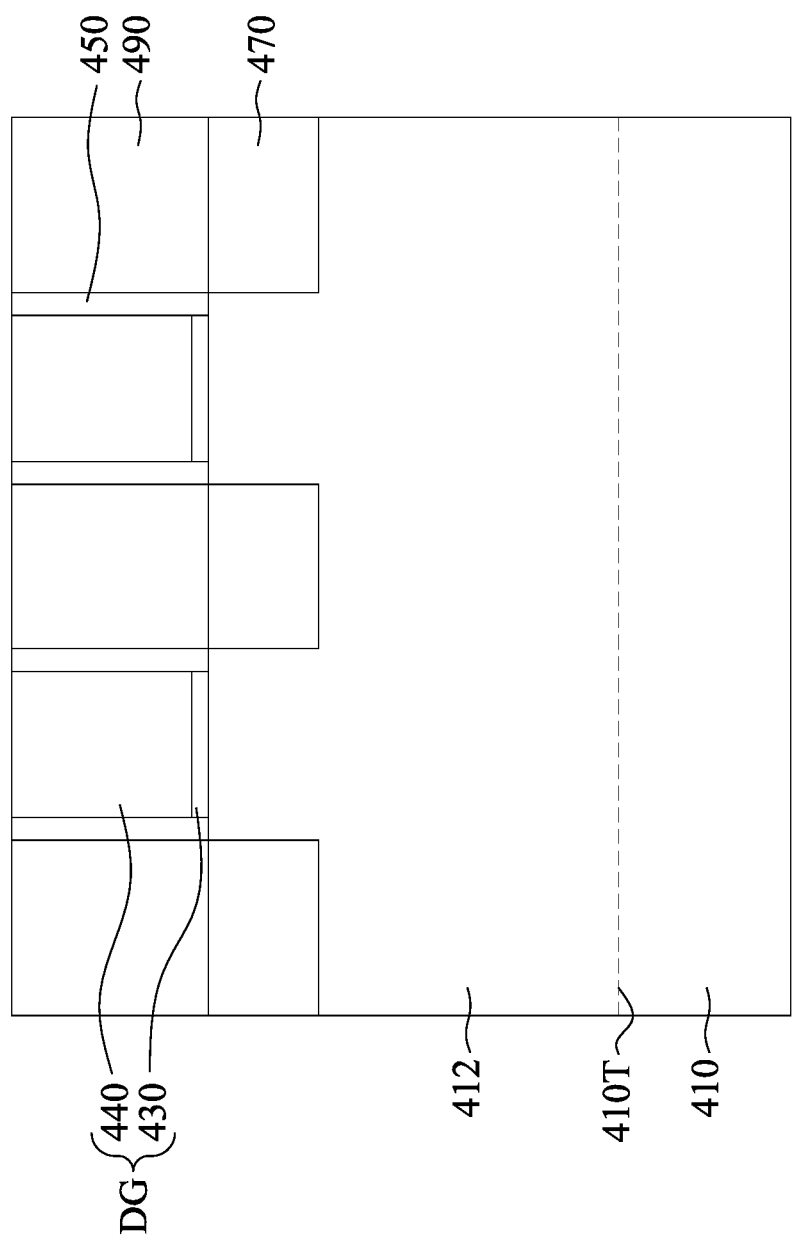

Reference is made to FIG. 36. Source/drain features 470 are formed on opposite sides of the dummy gate structures DG. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor substrate 410 (e.g., silicon, silicon germanium, silicon phosphate, or the like). The epitaxial source/drain features 470 may be in-situ doped. The doping species include p-type dopants, such as boron or BF2; n-type dopants, such as phosphorus or arsenic; and/or other suitable dopants including combinations thereof. If the epitaxial source/drain features 470 are not in-situ doped, a second implantation process (i.e., a junction implant process) is performed to dope the epitaxial source/drain features 472 and 474. One or more annealing processes may be performed to activate the epitaxial source/drain features 470. The annealing processes include rapid thermal annealing (RTA) and/or laser annealing processes.

Subsequently, an ILD layer 490 is deposited to cover the source/drain features 470, followed by a planarization process (e.g., CMP process). The CMP process may be optionally performed to remove excessive material of the ILD layer 490 to expose the dummy gate structures DG. The CMP process may planarize a top surface of the ILD layer 490 with top surfaces of the gate structures DG, and the gate spacers 450.

Figure 37A:
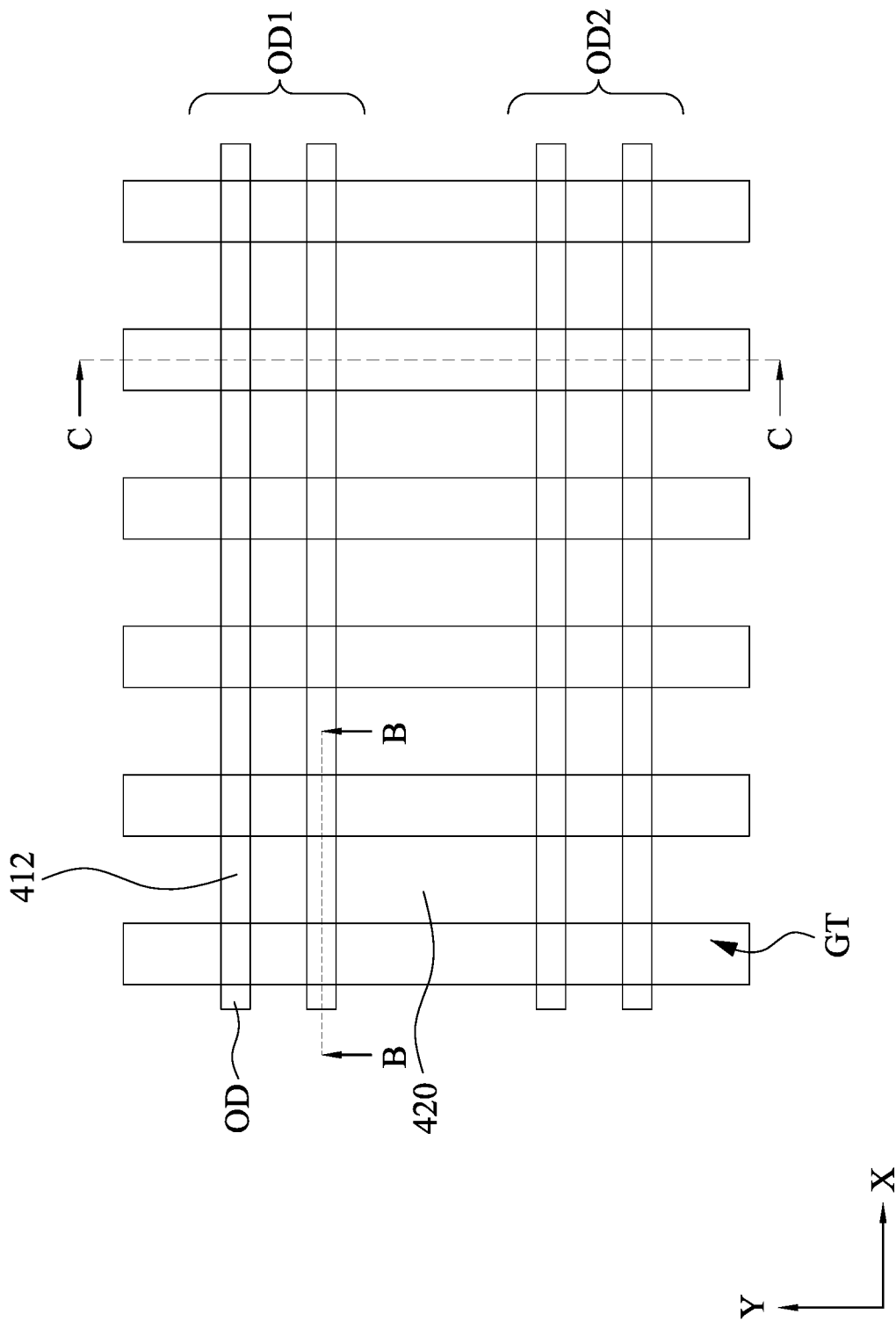
Figure 37B:
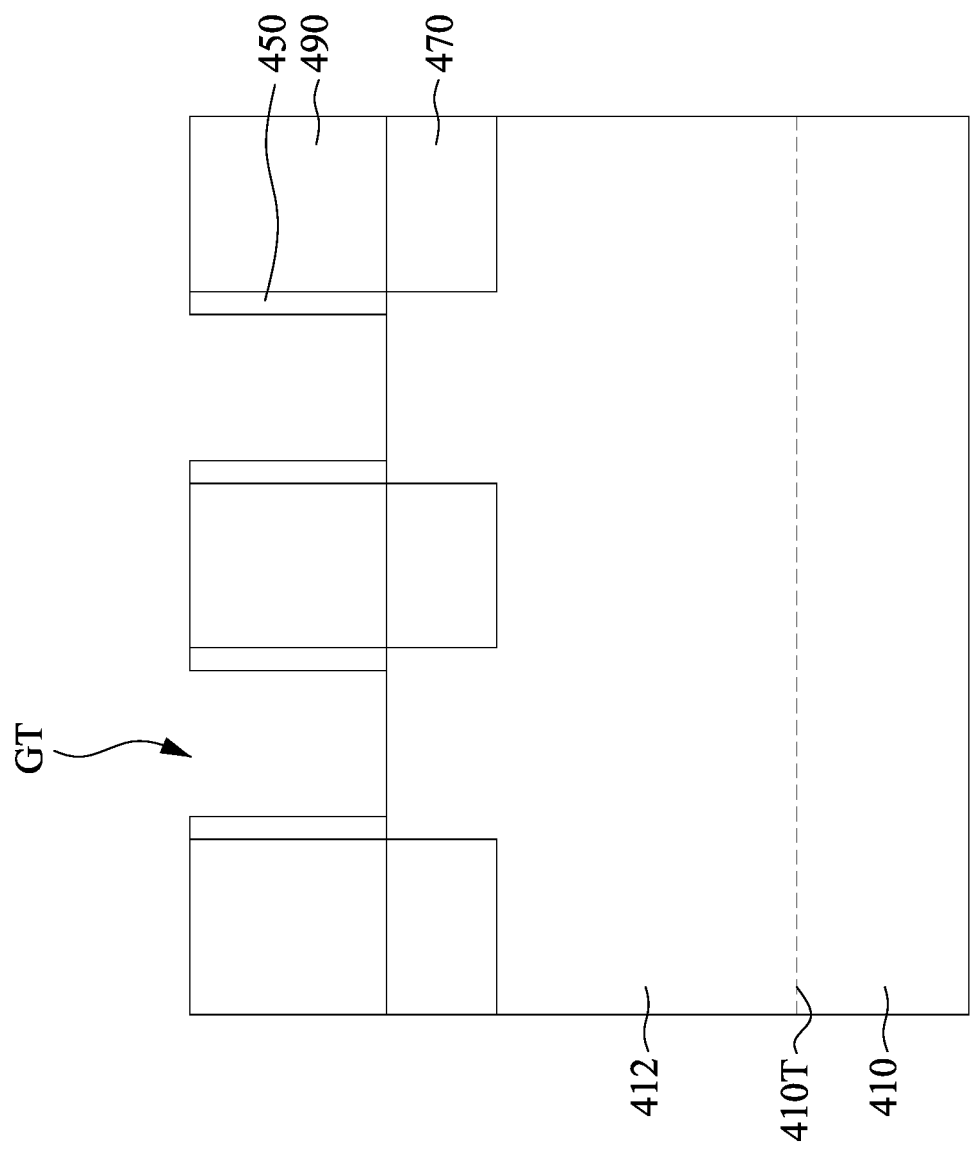

Reference is made to FIGS. 37A-37C. FIG. 37B is a cross-sectional view taken along line B-B in FIG. 37A. FIG. 37C is a cross-sectional view taken along line C-C in FIG.

37A. The dummy gate structure DG (referring to FIG. 23) is removed to leave a gate trench GT between the gate spacers 450.

Figure 38A:
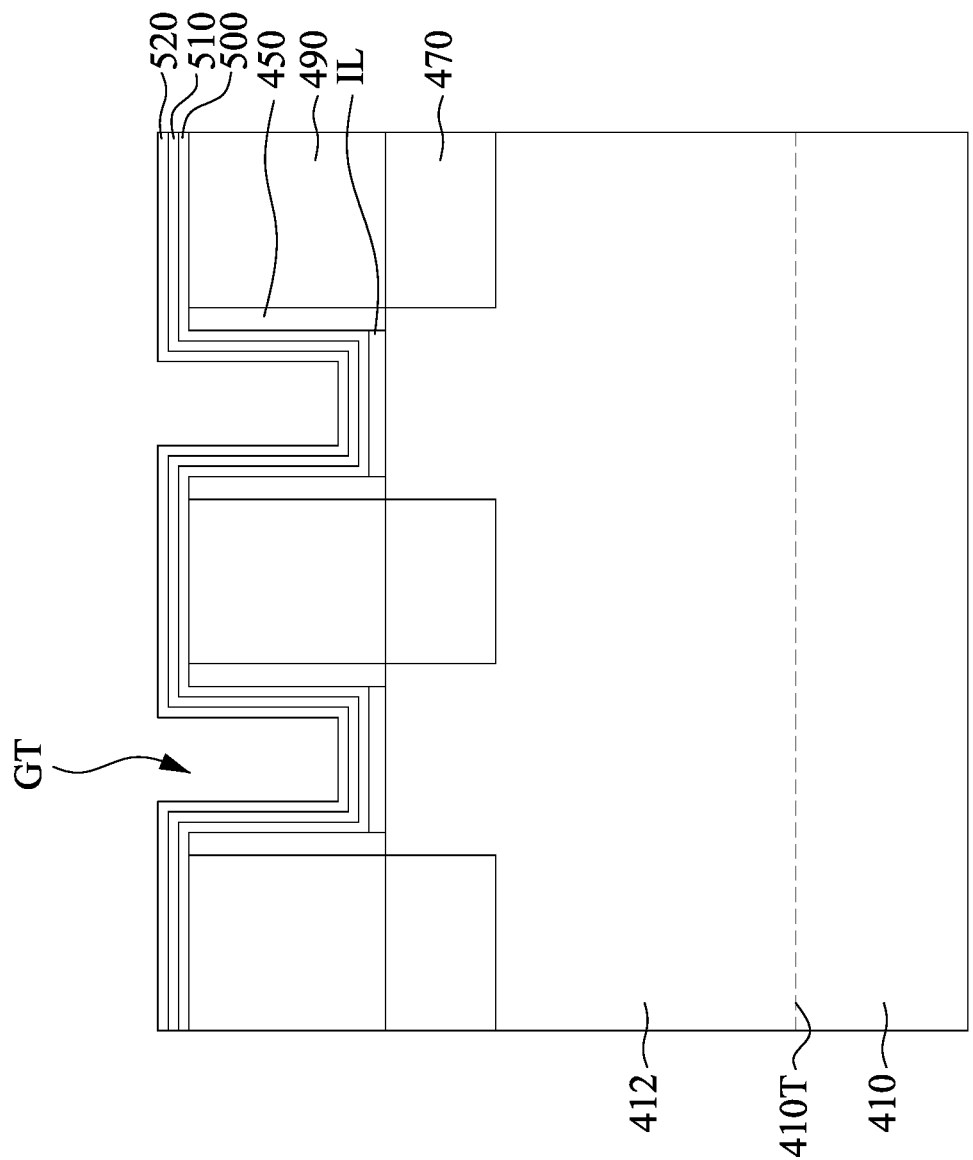
Figure 38B:
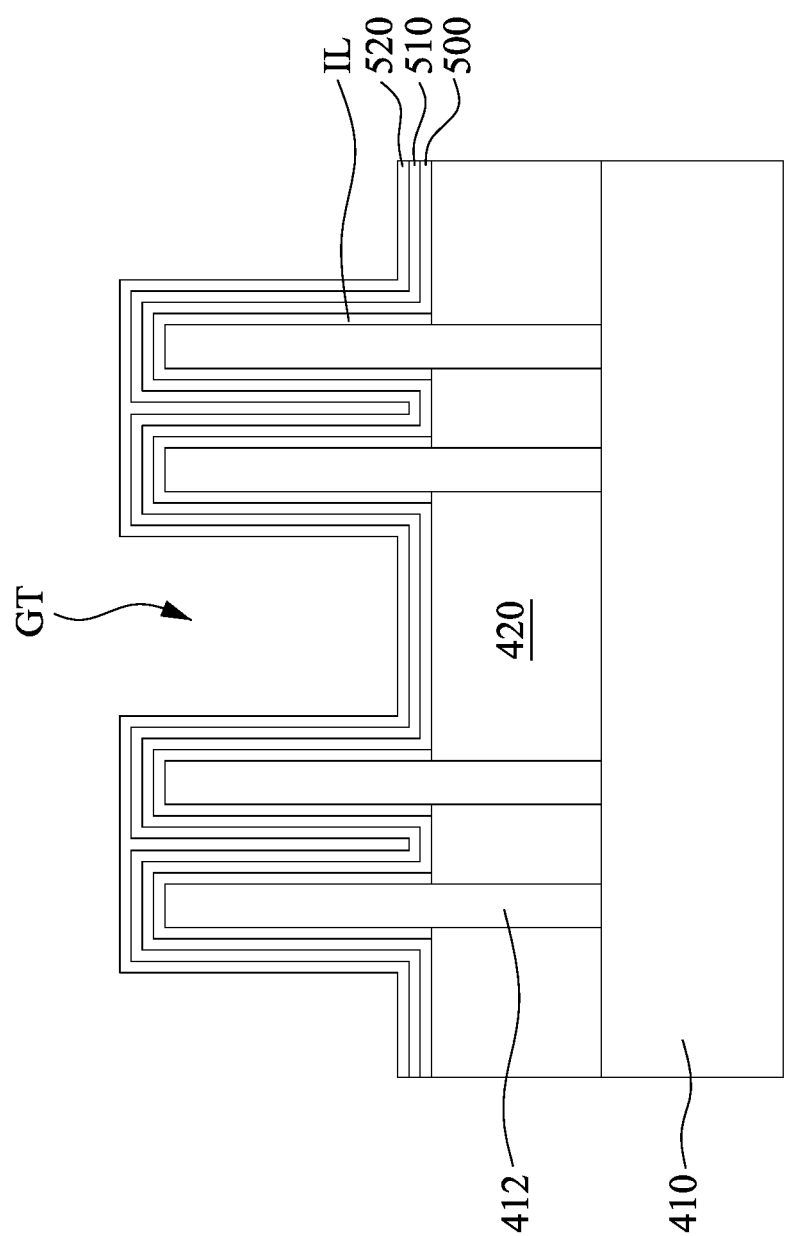

Reference is made to FIGS. 38A to 38B. FIG. 38A is a cross-sectional view taken the same cut as FIG. 37B. FIG. 38B is a cross-sectional view taken along the same cut as FIG. 37C. A high-k dielectric layer 500, a first work functional metal layer 510, and a second work functional metal layer 520 are deposited over the structure of FIGS. 37B-37C. The first and second work functional metal layers 510 and 520 may include work function metals to provide a suitable work function for the conductive metal. In some embodiments, a work function metal of the second work functional metal layer 520 is different from a work function metal of the first work functional metal layer 510. In some embodiments, one layer of silicon oxide (e.g., interfacial layer IL) may be formed over the exposed portion of the substrate 410 by thermal oxidation process prior to the deposition of these layers.

Figure 39A:
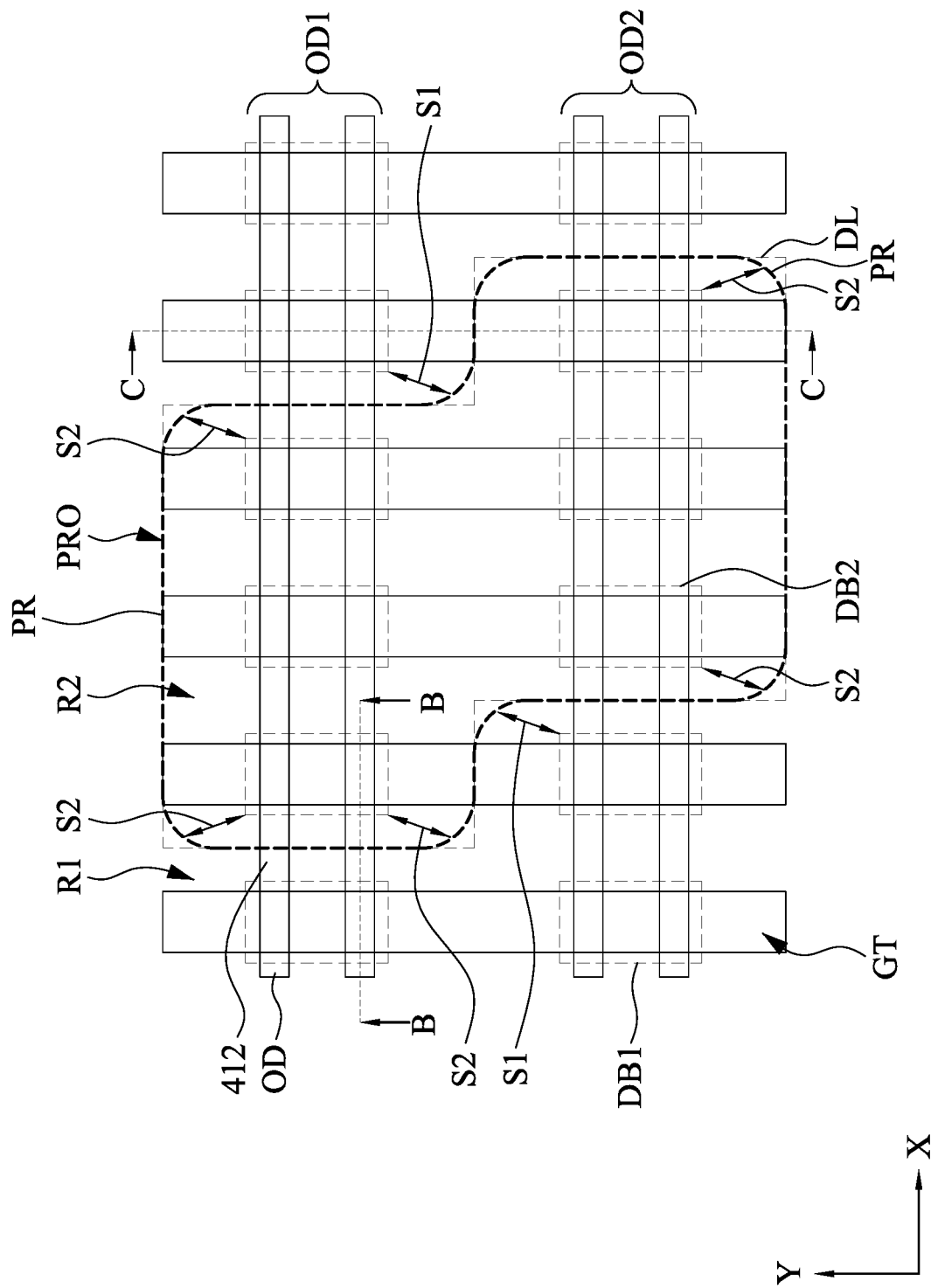
Figure 39B:
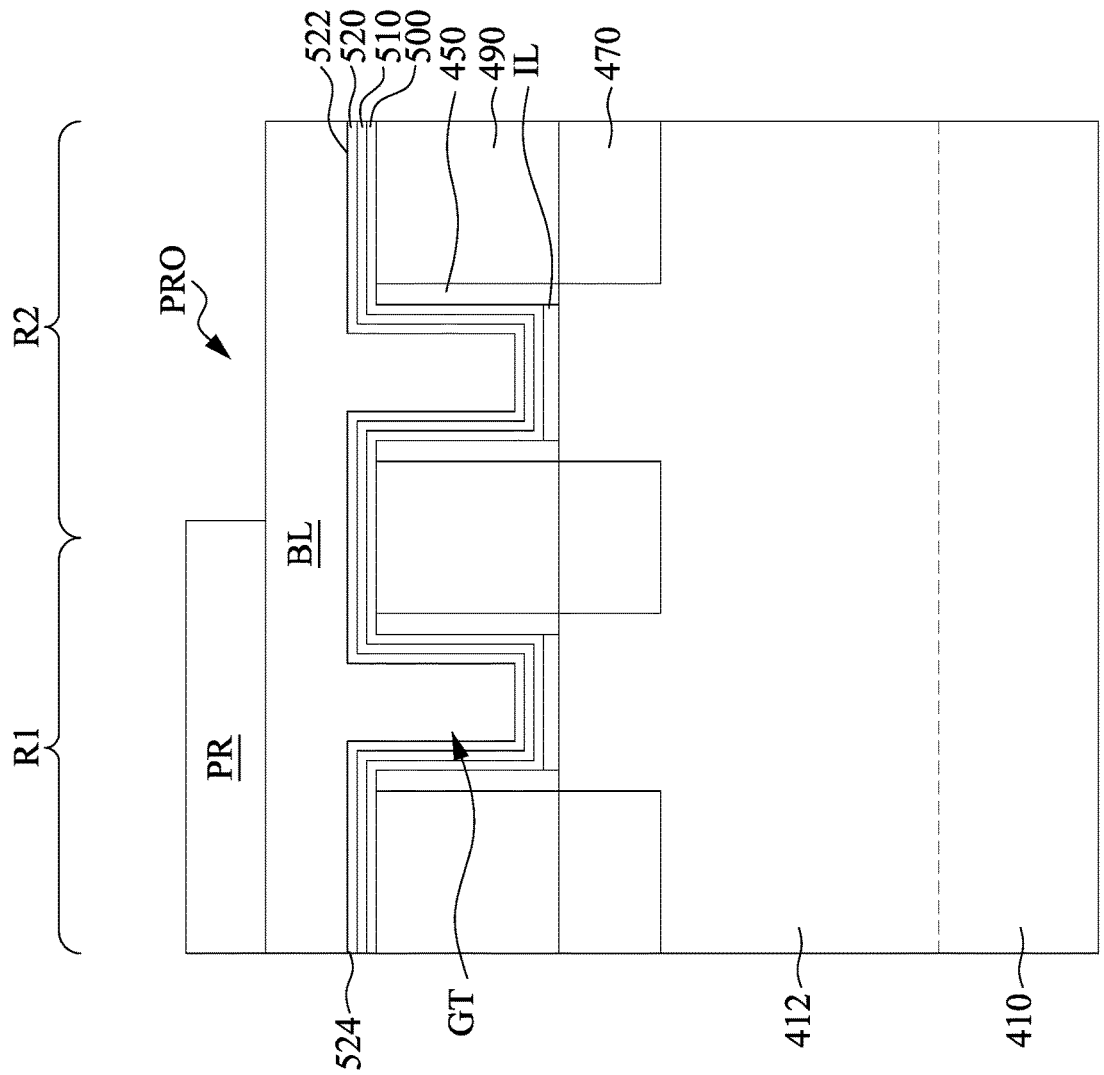
Figure 39C:
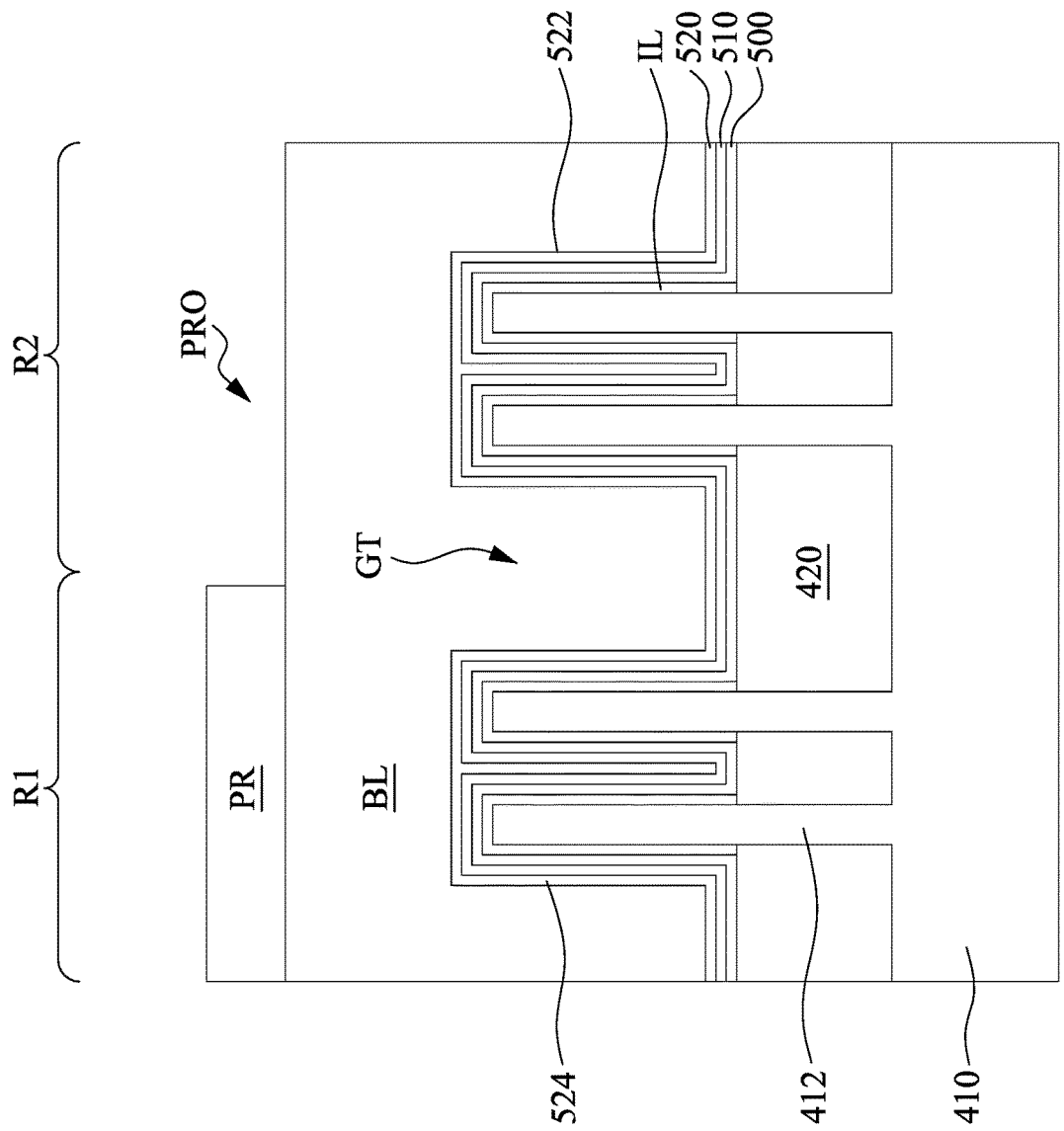

Reference is made to FIGS. 39A to 39C. FIG. 39B is a cross-sectional view taken along line B-B in FIG. 39A. FIG. 39C is a cross-sectional view taken along line B-B in FIG. 39A. A photoresist layer PR is formed over the second work functional metal layer 520 by photolithography process. The photoresist layer PR may cover a portion 524 of the second work functional metal layer 520, and have an opening PRO to exposing a portion 522 of the second work functional metal layer 520. In some embodiments, prior to forming the photoresist layer PR, a bottom anti-reflection coating (BARC) layer BL is formed over the second work functional metal layer 520. The BARC layer BL may fill the gate trench GT and provide a planar top surface for coating the photoresist layer PR.

In FIG. 39A, a dashed line DL may indicate a boundary between regions R1 and R2, in which the devices to be formed over the region R1 has a threshold voltage different from that the devices to be formed over the region R2. In the present embodiments, the devices to be formed over the region R1 may include the second work functional metal layer 520, while devices to be formed over the region R2 may not include the second work functional metal layer 520. The opening PRO of the photoresist layer PR may expose the region R2, such that the second work functional metal layer 520 over the region R2 can be removed by subsequent etching process, while the second work function metal layer 520 over the region R1 remains substantially intact during this etching process.

Figure 39D:
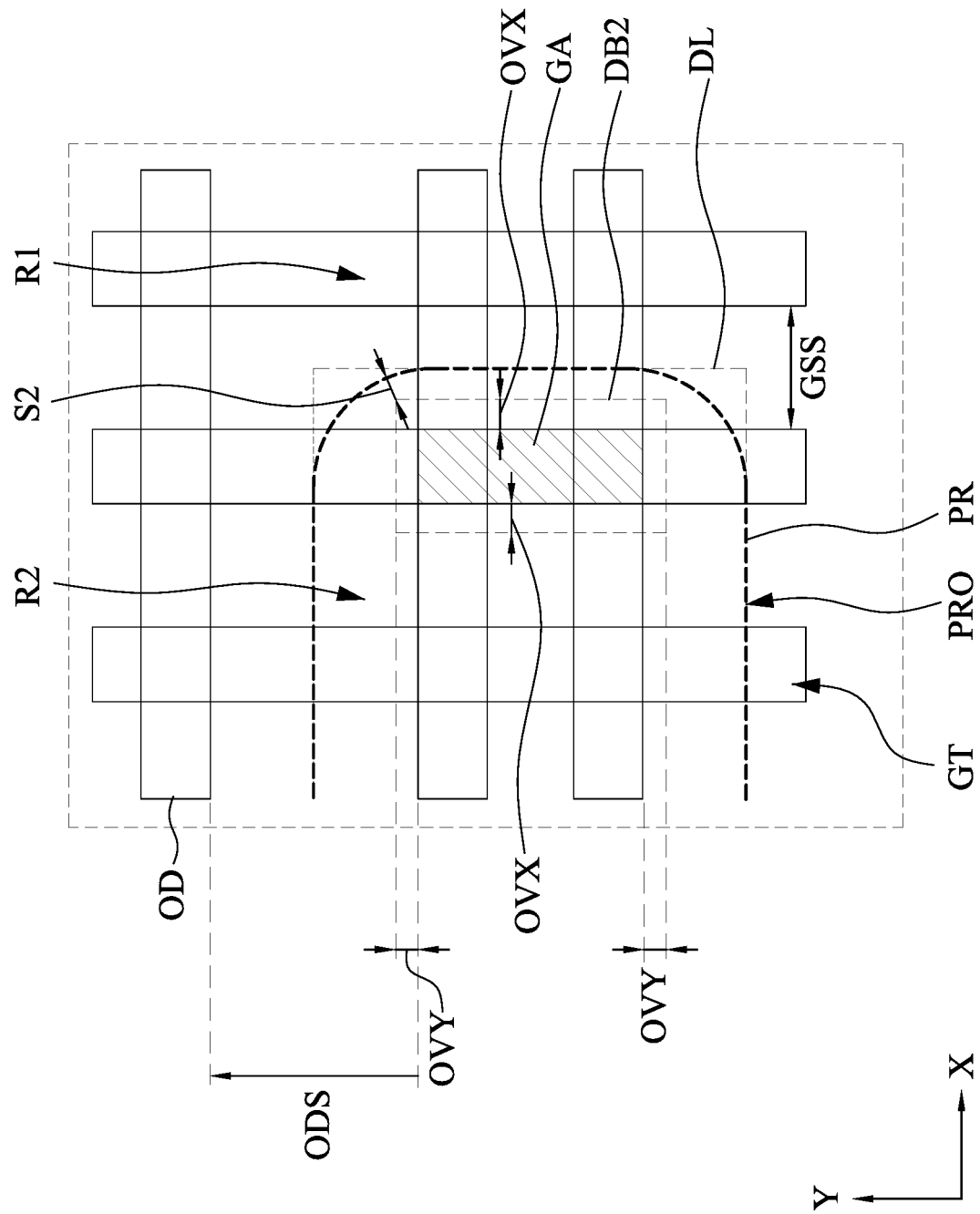

FIG. 39D is an enlarged view of a portion of FIG. 39A. In FIGS. 39A and 39D, dashed blocks DB1 and DB2 are depicted for indicating regions of gate structures of devices to be formed (e.g., the hatch block GA in FIG. 39D) with consideration of overlay error. The hatch block GA in FIG. 39D may indicate a region of gate structure of device to be formed. For example, an overlay error OVX is between sidewalls of the dashed blocks DB1/DB2 and hatch block GA along the direction X, and an overlay error OVY is between sidewalls of the dashed blocks DB1/DB2 and hatch block GA along the direction Y. The overlay errors OVX and OVY may be several nanometers. In some embodiments, the overlay errors OVX and OVY are substantially the same. In the figure, the dashed blocks DB1 are within the region R1, and the dashed blocks DB2 are within the region R2. In the depicted embodiments, each region of gate structures (indicated by dashed blocks DB1/DB2) overlays two active regions OD1/OD2, thereby enlarging effective area. In some other embodiments, each region of gate structures (indicated by dashed blocks DB1/DB2) may overlay one active region OD1/OD2 or more than two active regions OD1/OD2.

As illustrated previously, the photolithography may use an optical system with low pass filter, the light pattern may blur, such that the opening PRO of the photoresist layer PR may have rounding corners after the post baking process. In FIGS. 39A and 39D, a distance S2 is between the dashed block DB2 and the sidewall of the photoresist layer PR at the corner near the corresponding dashed block DB2. In FIG. 39A, a distance S1 is between the dashed block DB1 and the sidewall of the photoresist layer PR at the corner near the corresponding dashed block DB1. For clear illustration, it is indicated that the gate trenches GT over the regions R1 and R2 may have a distance GSS therebetween, and the active regions OD (e.g., the semiconductor fins 412) over the regions R1 and R2 have a distance ODS therebetween.

Considering the overlay error (e.g., indicated by the dashed blocks DB1/DB2) and the rounding corners of the photoresist layer PR, as device sizes scale down (e.g., the distance GSS and/or the distance ODS decreases), the distances S1 and S2 may shrink, such that the dashed blocks DB2 may not be entirely exposed by the opening PRO of the photoresist layer PR, and the dashed blocks DB1 may not be entirely covered by the photoresist layer PR, which in turn may cause gate structures at the corners of the photoresist opening PRO to have undesired work function metal compositions.

Figure 40A:
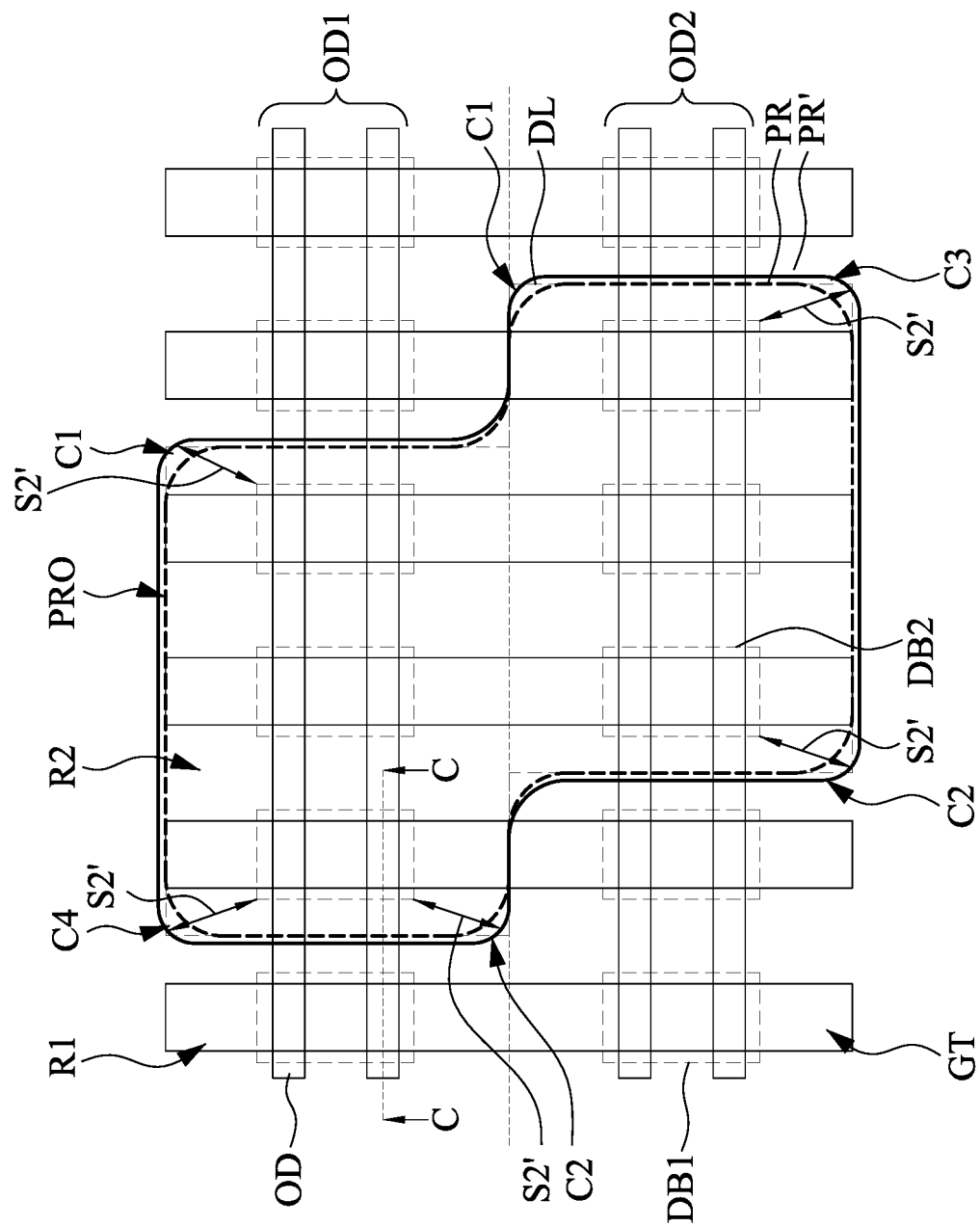
Figure 40B:
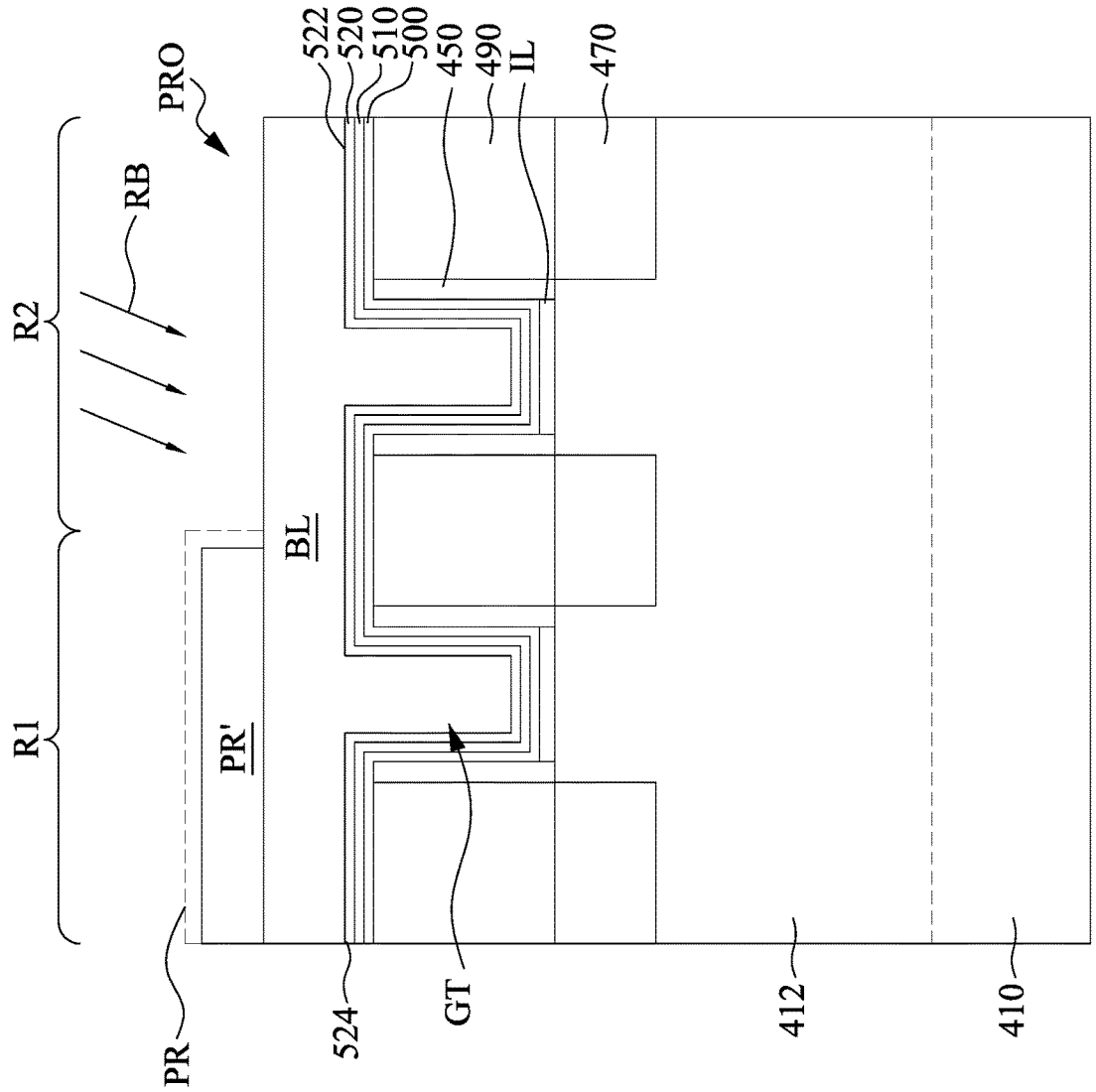
Figure 40C:
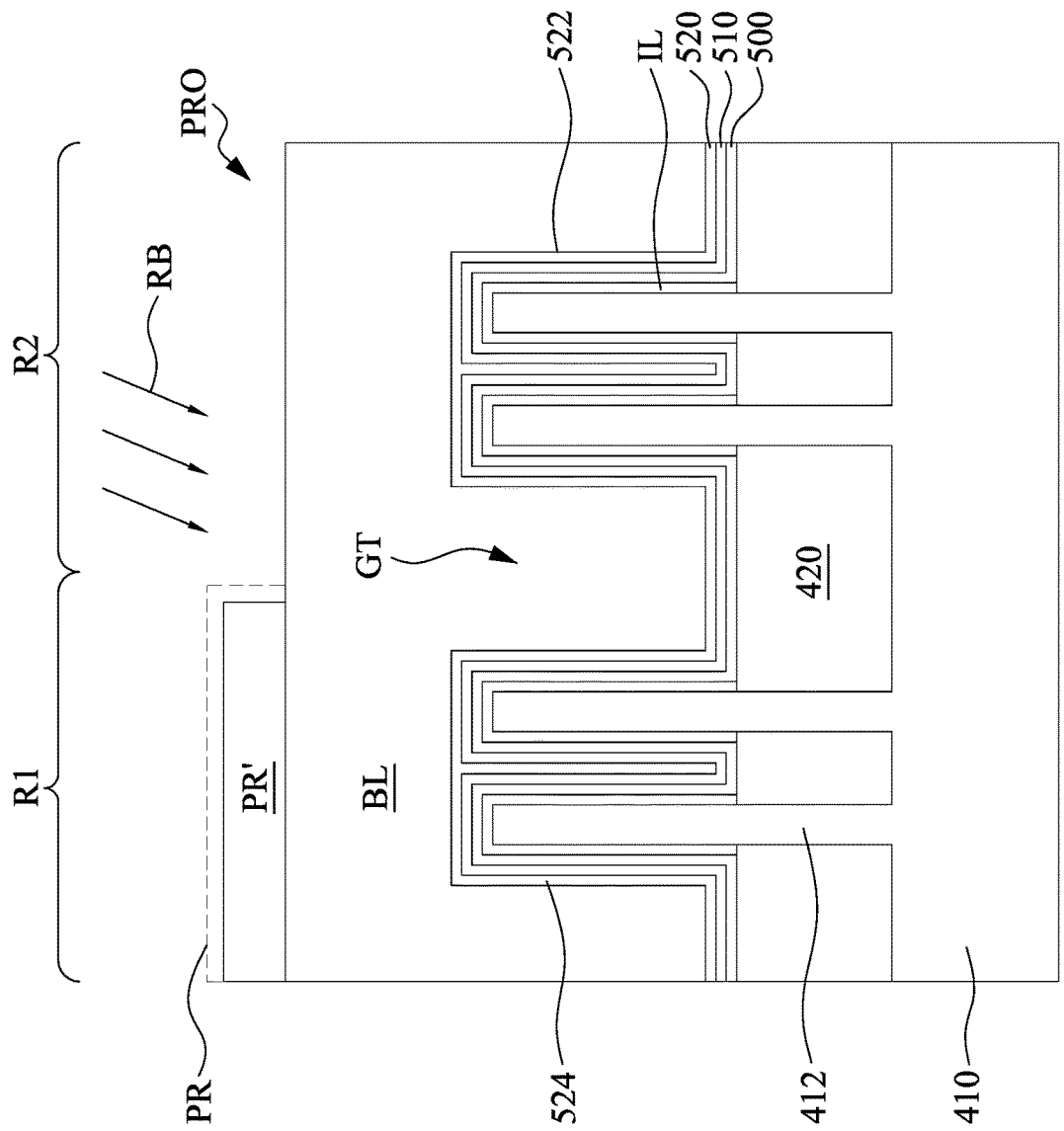

In some embodiments of the present disclosure, referring to FIG. 40A-40C, a directional treatment is performed to modify the photoresist layer PR, thereby hardening the photoresist layer PR and enlarging the distances S2, which in turn will prevent the gate structures at the corners from having undesired work function metal compositions. Reference is made to FIGS. 40A to 40C. FIG. 40B is a cross-sectional view taken along line B-B in FIG. 40A. FIG. 40C is a cross-sectional view taken along line B-B in FIG. 40A. As illustrated previously, the directional treatment may use the beam RB to bombard exposed surfaces of the photoresist layer PR, thereby compresses the photoresist layer PR, which in turn will harden the photoresist layer PR. In some embodiments, the directional treatment may also sputter off a portion of photoresist layer PR adjacent to the opening PRO. By compressing and sputtering the photoresist layer PR, a portion of the photoresist layer PR adjacent to the opening PRO and a top surface of the photoresist layer PR may be removed during the directional treatment. As illustrated previously, the directional treatment may include four ion bombardment processes along four different directions BD1, BD1', BD2, BD2', such that the beam RB may hit four corners of the photoresist opening PRO (e.g., corners C1-C4). During the directional treatment, ions are moved along a direction non-perpendicular to a longitudinal direction of the active region OD and a longitudinal direction of the gate trench GT. After the directional treatment, the remaining portion of the photoresist layer PR is referred to as photoresist layer PR'. Since a number of C-C bonds in the modified photoresist layer PR' is greater than that in the original photoresist layer PR, the modified photoresist layer PR' is more resistant to subsequent etching process (e.g., etching the BARC layer BL) than the photoresist layer PR. Also, the edge of the photoresist opening PRO may be pushed away from the center of the photoresist opening PRO.

Figure 40D:
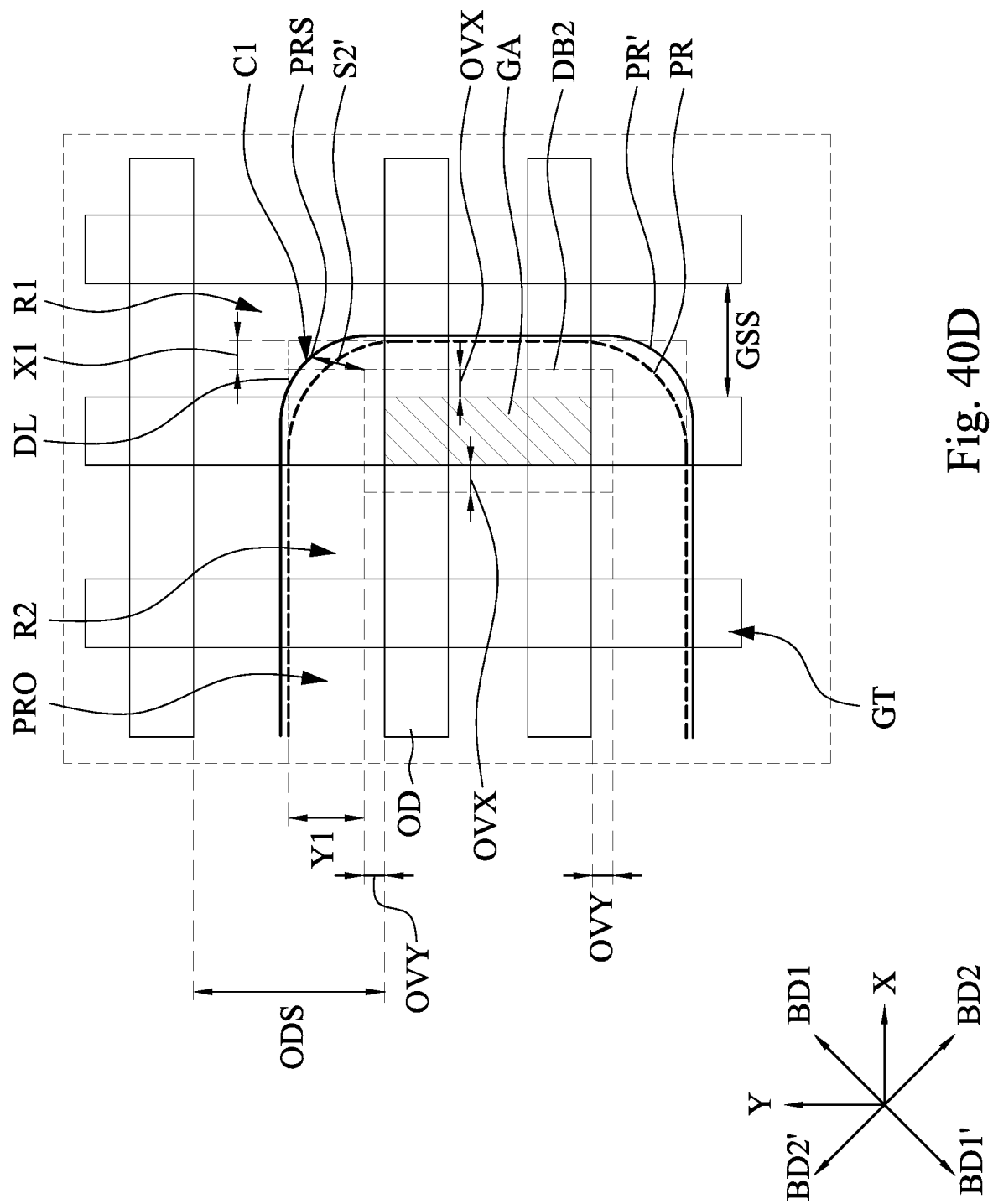

FIG. 40D is an enlarged view of a portion of FIG. 40A. In some embodiments, the corner sidewall PRS of the photoresist layer PR/PR' may be curved and have a radius of curvature (also referred to as R) at corners C1-C4, in which the whole circle having this curvature can be read as turn $2\pi$ over the length $2\pi R$ when viewed from above. In some embodiments, by the directional treatment, the radius of curvature (i.e., R) of the corner sidewall PRS of the photoresist layer PR is reduced. That is, the radius of curvature (i.e., R) of the corner sidewall PRS of the modified photoresist PR' is less than the radius of curvature (i.e., R) of the original photoresist layer PR at corners. In some embodiments, the radius of curvature (i.e., R) of the corner sidewall PRS of the modified photoresist layer PR' may be less than a square root of $X1^2+Y1^2$, in which X1 is equal to half the distance GSS minus the overly error OVX, and Y1 is equal to half the distance ODS minus the overly error OVY. That is, the radius of curvature (i.e., R) of the sidewall PRS of the modified photoresist layer PR' is less than a square root of $(GSS/2-OVX)^2+(ODS/2-OVY)^2$. For example, in some embodiments, the radius of curvature (i.e., R) of the sidewall PRS of the modified photoresist layer PR' at corners is less than a value in a range from about 15 nanometers to about 30 nanometers, such as about 20 nanometers.

By designing the sidewall PRS of the modified photoresist layer PR' with the radius of curvature (i.e., R) at corners, a distance between a dashed block DB2 and the sidewall of the photoresist opening PRO at the corner near the corresponding dashed block DB2 is increased from S2 (FIG. 39D) to S2' (FIG. 40D). Therefore, the corner sidewalls PRS of the modified photoresist layer PR' may be pushed away from the dashed block DB2, which allows for completely removing the target work function metal layer from the dashed block DB2.

In some embodiments, the directional treatment may decrease the distance S1 (referring to FIGS. 39A) between the dashed block DBI and the sidewall of the photoresist opening PRO at the corner near the corresponding dashed block DB1. In some embodiments, the position and the size of the photoresist opening PRO may be adjusted during the lithography process, for compensating the decreasing of the distance S1 resulting from the directional treatment.

Figure 41A:
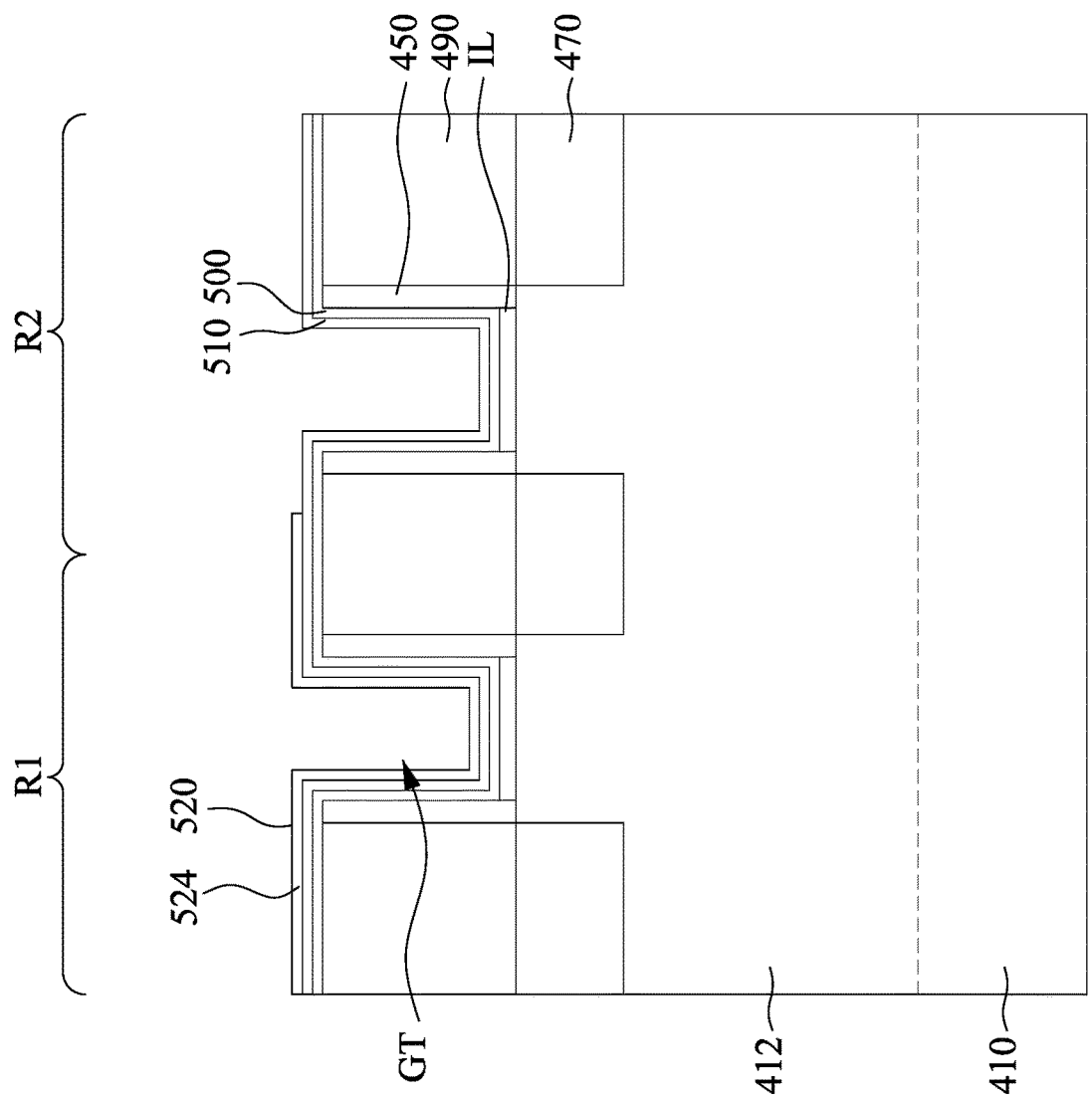
Figure 41B:
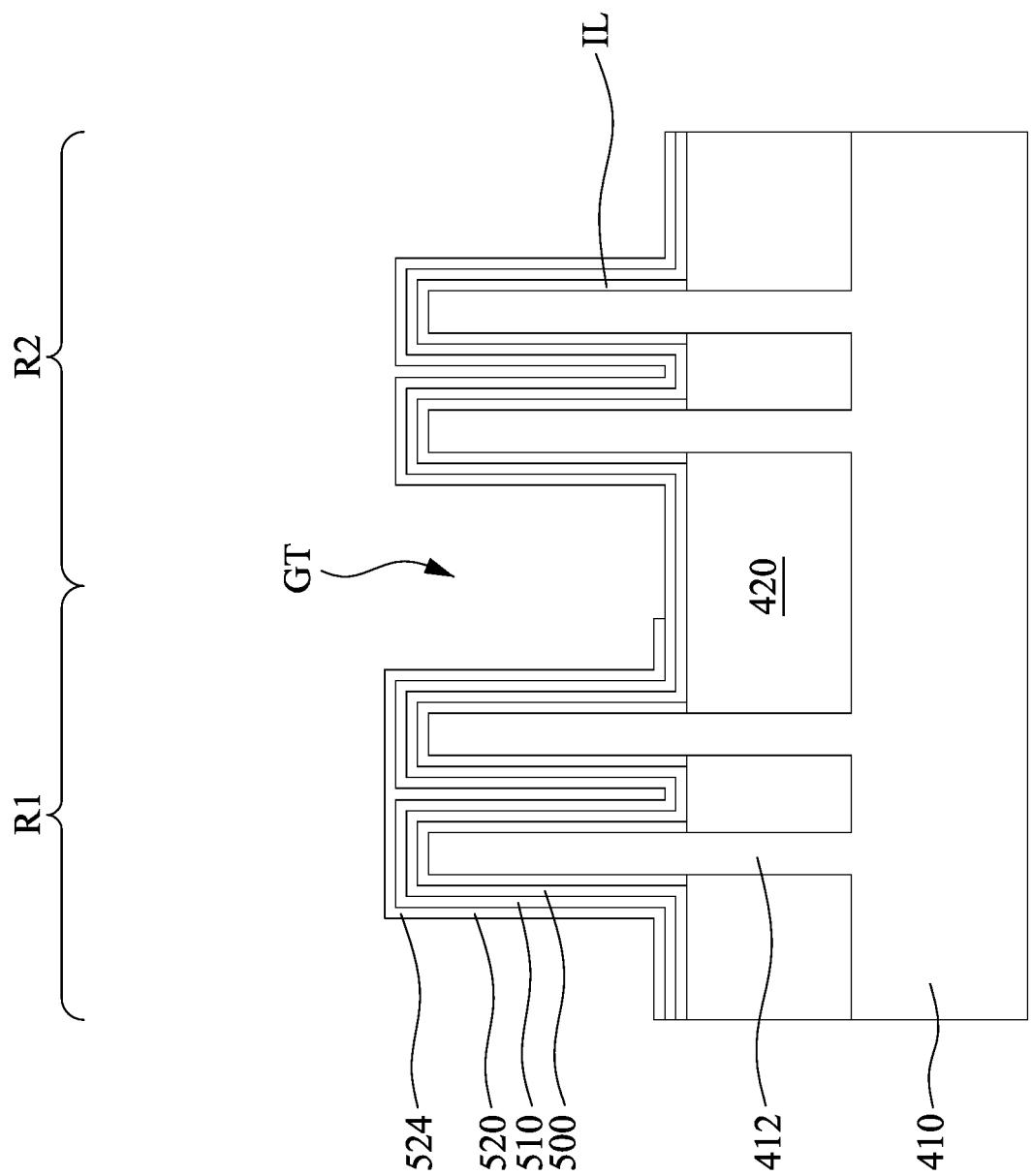

Reference is made to FIGS. 41A and 41B. FIG. 41A is a cross-sectional view taken the same cut as FIG. 40B. FIG. 41B is a cross-sectional view taken along the same cut as FIG. 40C. The second work functional metal layer 520 is etched through the photoresist layer PR', thereby exposing the underlying first work functional metal layer 510. In some embodiments, a first etching process is performed to etch the BARC layer BL (referring to FIG. 30) using the photoresist layer PR' as an etch mask, and then a second etching process is performed to etch the second work functional metal layer 520. As aforementioned, since the number of C-C bonds in the photoresist layer PR' is increased, the first etching process may show an improved etch selectivity between the photoresist layer PR' and the BARC layer BL, and therefore the first etching process is prevented from rounding corners of the pattern to be transferred to the second work functional metal layer 520.

Figure 42A:
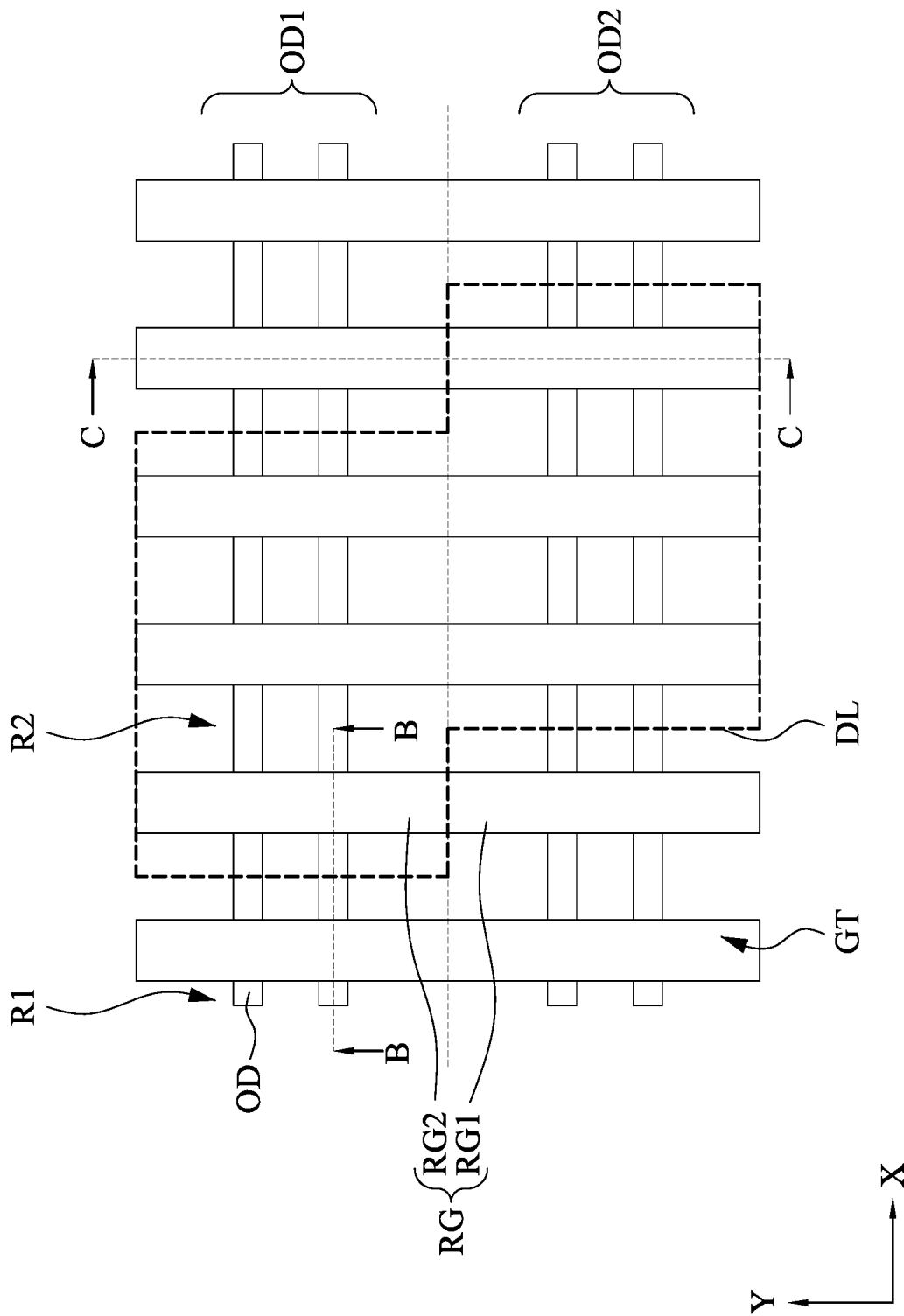
Figure 42B:
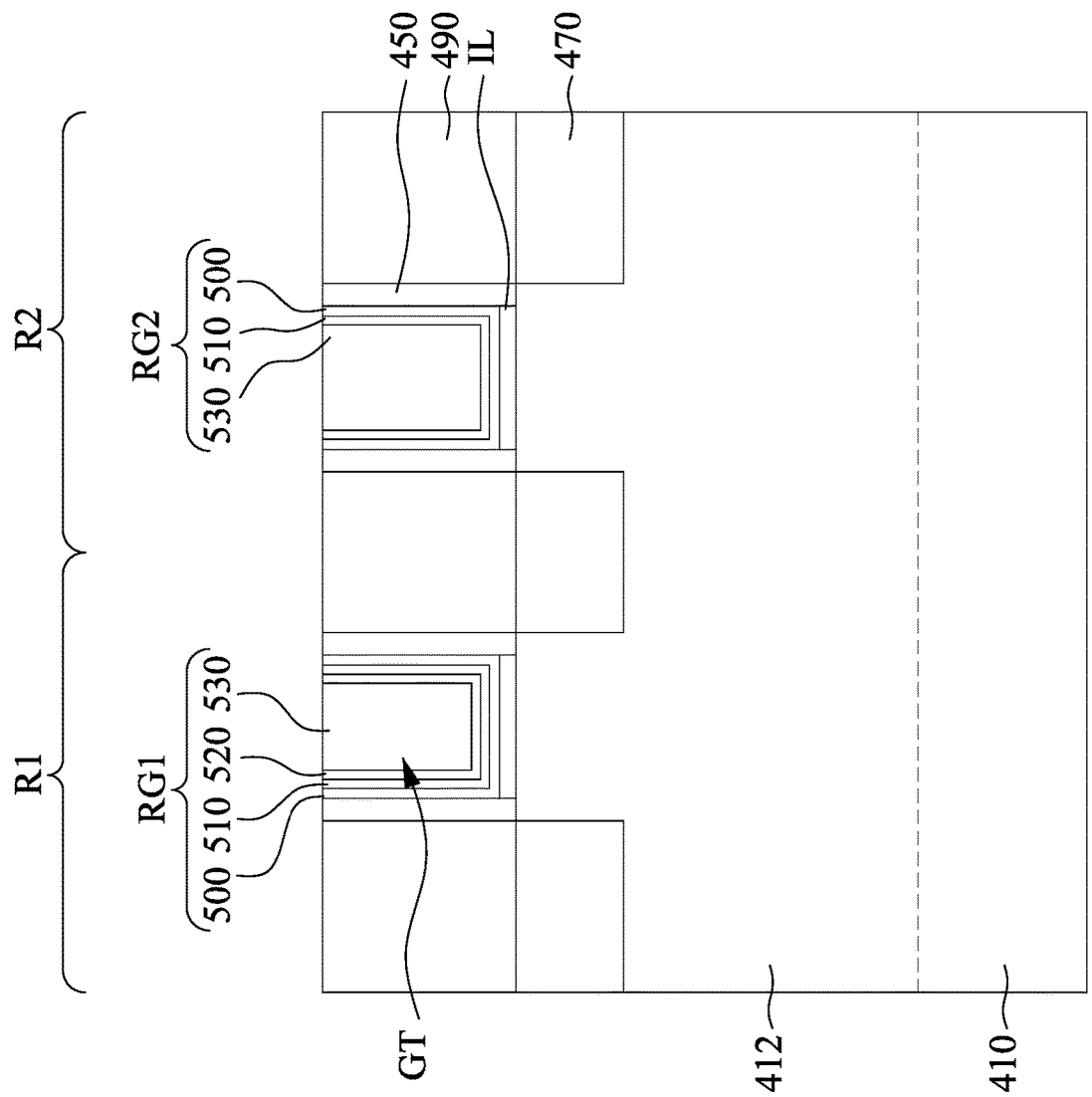
Figure 42C:
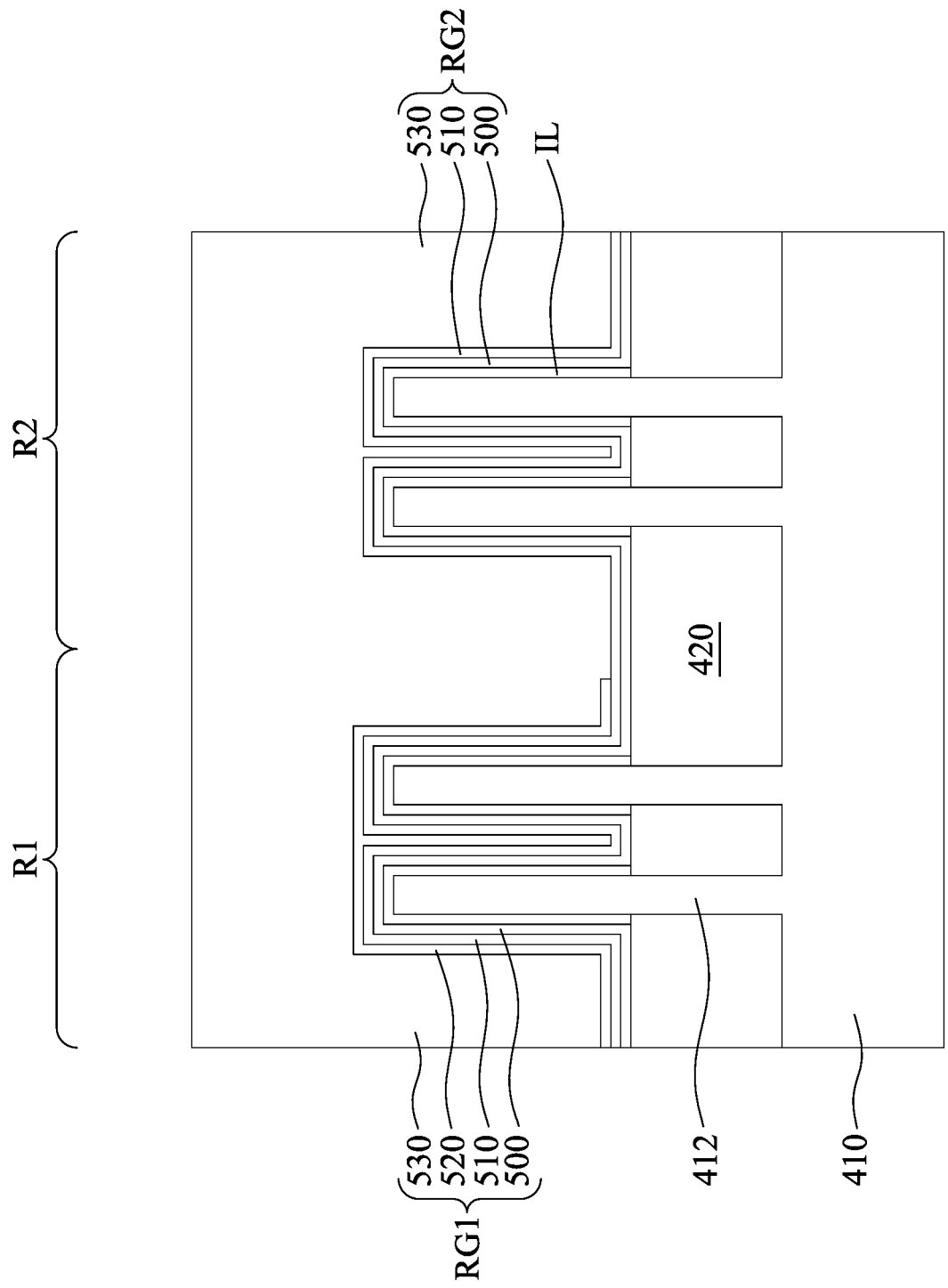

Reference is made to FIGS. 42A to 42C. FIG. 42B is a cross-sectional view taken along line B-B in FIG. 42A. FIG. 42C is a cross-sectional view taken along line B-B in FIG. 42A. The gate trench GT is filled with a fill metal 530, and then a CMP process is performed to remove excess material (e.g., the first and second work functional metal layers 510, 520, and the fill metal 530) external to the gate trenches GT. The remaining portions of the first second work functional metal layer 510, the second work functional metal layer 520', and the fill metal 530 in the gate trenches GT may be referred to as replacement gate structures RG.

In some embodiments, a portion of the replacement gate structures RG over the region R1 may be referred to as gate structures RG1, and a portion of the replacement gate structures RG over the region R2 may be referred to as gate structures RG2. The gate structures RG1 may include the remaining portions of the gate dielectric layer (e.g., the layers IL and 500), the first second work functional metal layer 510, the second work functional metal layer 520', and the fill metal 530. The gate structures RG2 may include the remaining portions of the gate dielectric layer (e.g., the layers IL and 500), the first second work functional metal layer 510, and the fill metal 530.

Figure 43A:
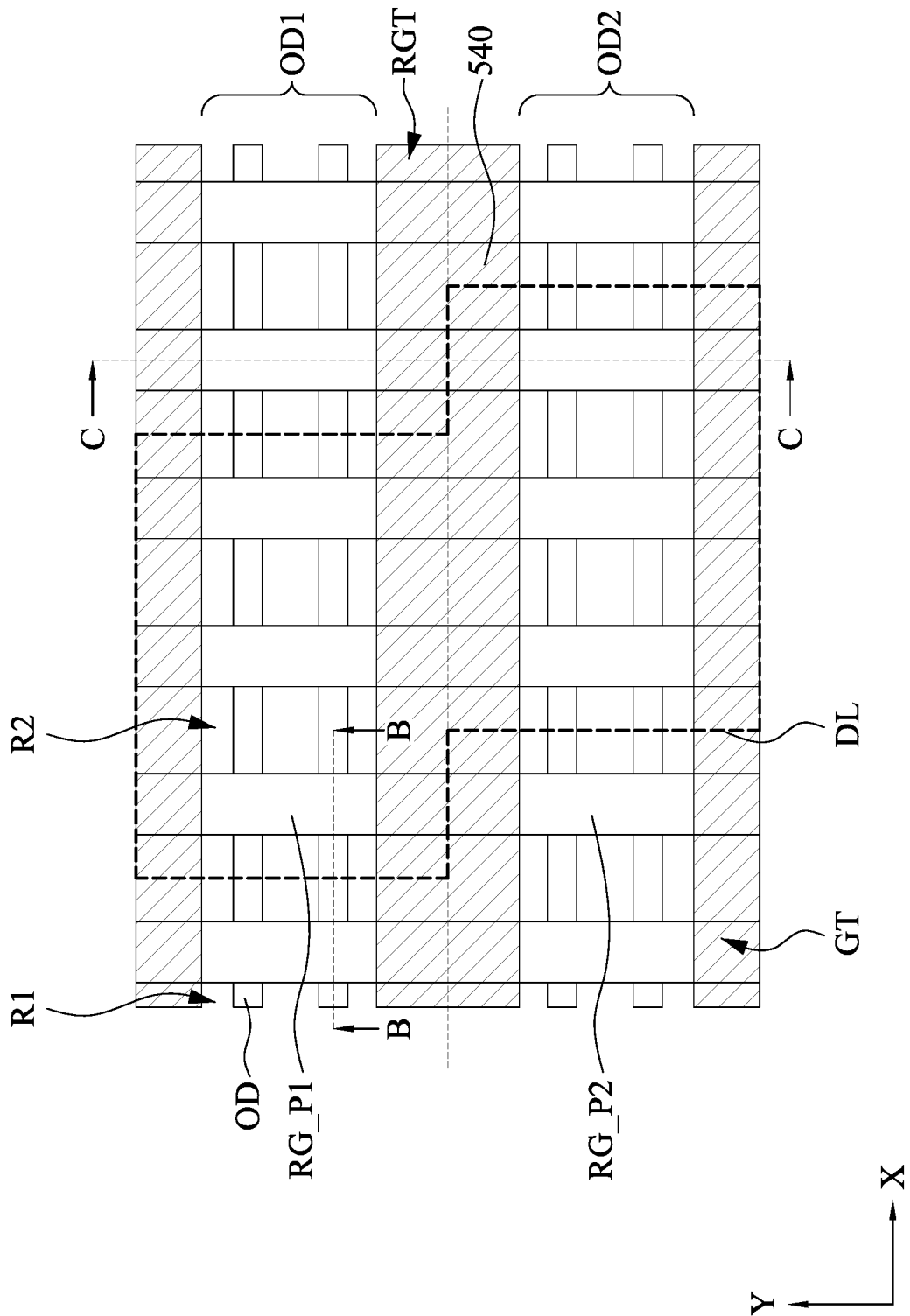
Figure 43B:
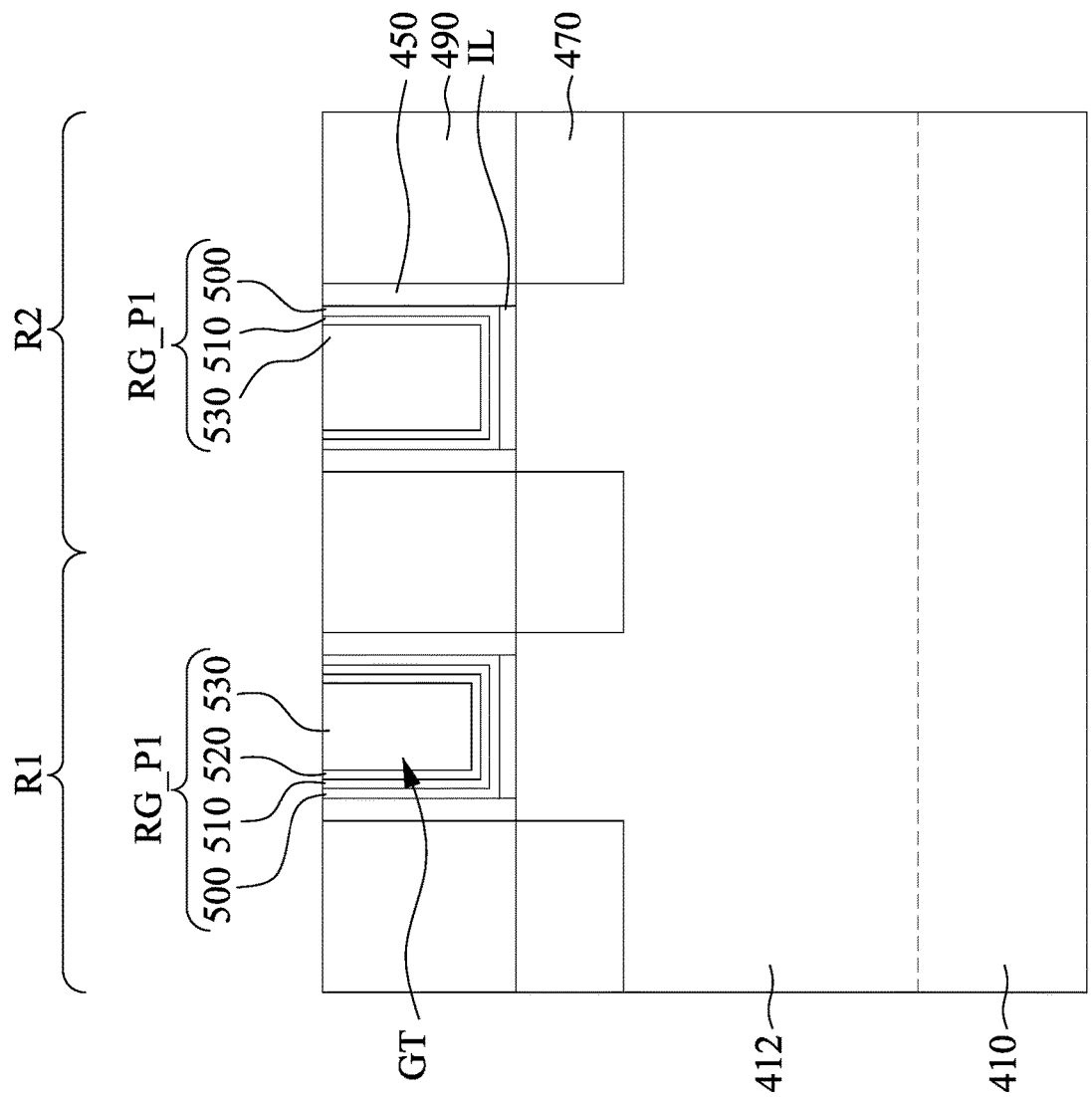
Figure 43C:
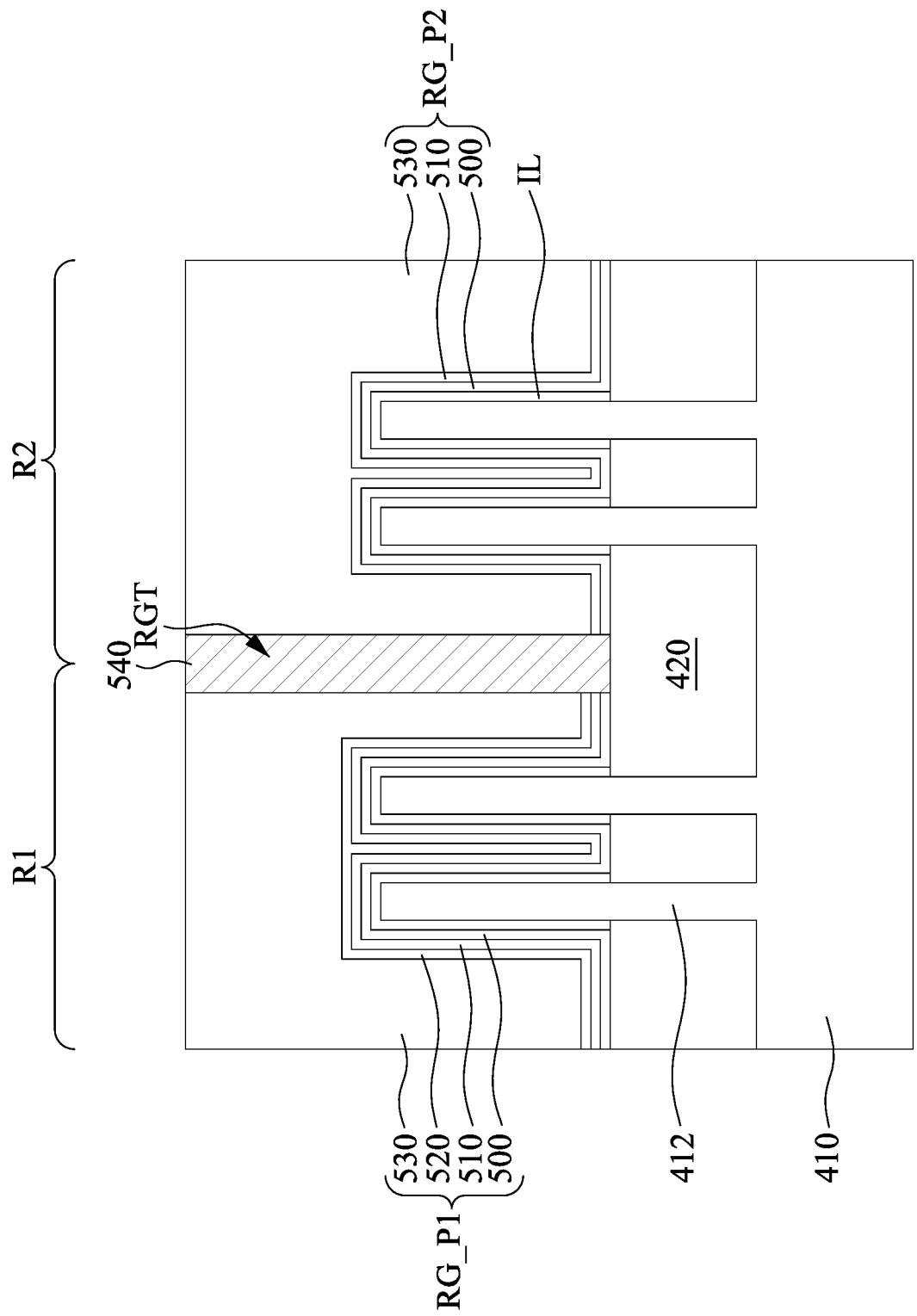

Reference is made to FIGS. 43A to 43C. FIG. 43B is a cross-sectional view taken along line B-B in FIG. 43A. FIG. 43C is a cross-sectional view taken along line B-B in FIG. 43A. A dielectric structure 540 is formed to separate (or called "cut") the replacement gate structures RG into plural portions. For example, one of the replacement gate structures RG is separated into separated gate structures RG_P1 and RG_P2 by the dielectric structure 540, in which the gate structures RG_P1 and RG_P2 are respectively over active regions OD1 and OD2. The dielectric structure 540 may include one or more dielectric materials, such as silicon nitride, silicon oxide, silicon oxynitride, fluoride-doped silicate glass (FSG), a low-k dielectric material, and/or other suitable insulating material. In some embodiments, a portion of the dielectric structure 540 in physical contact with the replacement gate structures RG_P1/RG_P2 includes a dielectric material that does not react with the metal materials of the replacement gate structures RG_P1/RG_P2. For example, that portion of the dielectric structure 540 includes silicon nitride in some embodiment. Formation of the dielectric structure 540 include etching a single continuous gate structure RG to form a cut metal gate (CMG) trench RGT that breaks the single continuous gate structure RG into separate replacement gate structures RG_P1/RG_P2, and filling the CMP trench RGT with a suitable dielectric material. A CMP process may be performed to remove a portion of the dielectric material higher than top surfaces of the replacement gate structures RG_P1/RG_P2, and the remaining dielectric material forms the dielectric structure 540. Other details of the present embodiments are similar to those illustrated in FIG. 20A-33B, and therefore not repeated herein.

Figure 44A:
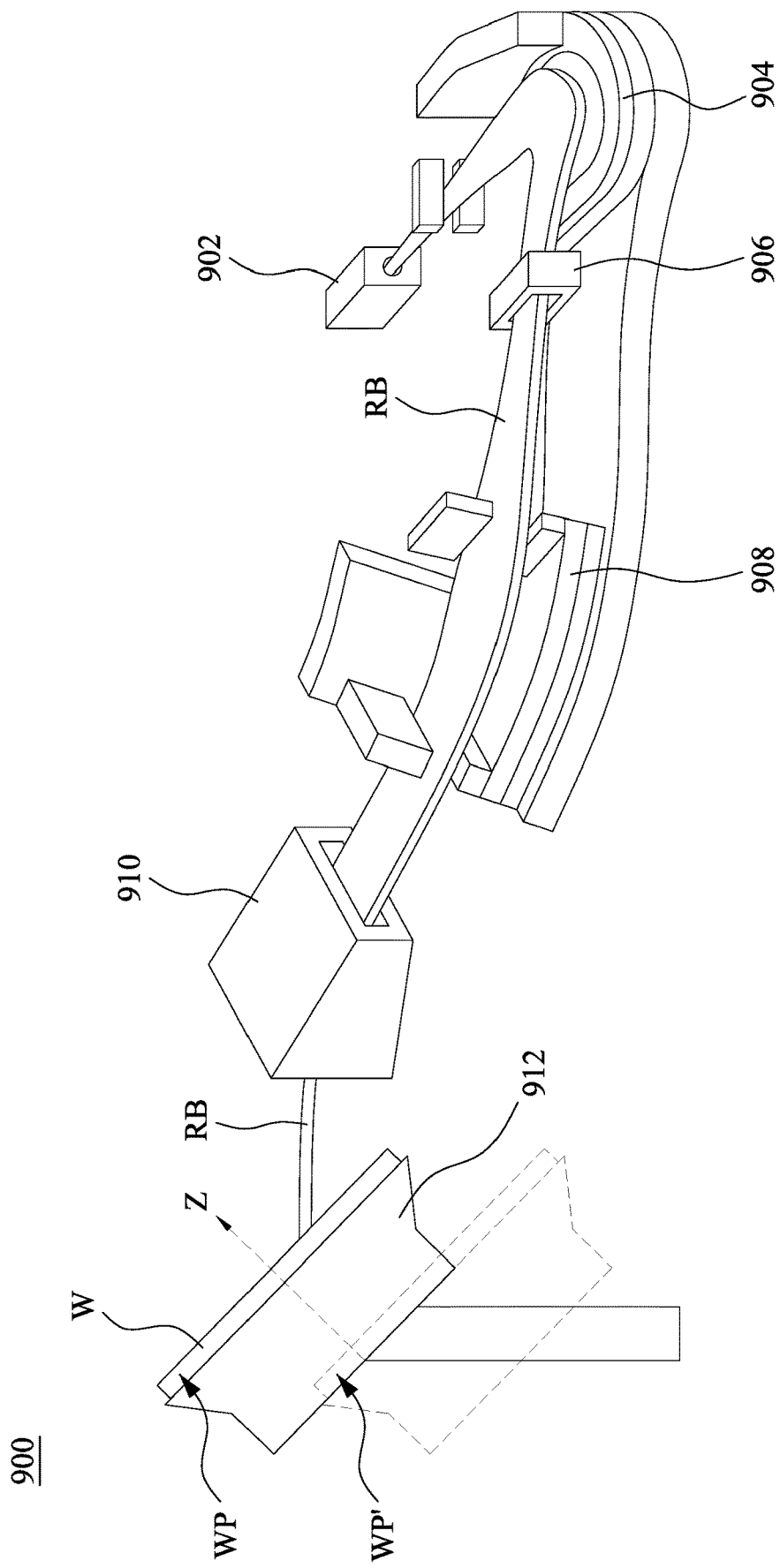

FIGS. 44A-44D illustrates a semiconductor fabrication tool 900 according to some embodiments of the present disclosure. Referring to FIG. 44A, the semiconductor fabrication tool 900 includes an ion source 902, an ion selection magnet 904, an ion selection aperture 906, a beam bending magnet 908, and a filter 910 arranged from an upstream to a downstream direction in ion production. In some embodiments, the ion source 902 provides suitable gas species (e.g., Ar, Si, etc.) for generating initial ion beam RB. The magnets 904 and 908 may accelerate and purify the beam and reshape the ion beam RB into a ribbon ion beam RB. For example, the ion beam RB can be formed by the extraction electrodes and focused at the ion selection aperture 906 located downstream from the ion selection magnet 904. The ion selection magnet 904 may be a 90° mass analysis magnet. The ion beam RB is then directed and shaped by downstream beam bending magnet 908, and then hit a major surface of the wafer W. In some embodiments, the filter 910 can neutralize the ions in the ion beam RB, such that the beam RB hit on the surface of the wafer W may include neutral atoms (e.g., Ar). This makes the treatment using the beam RB is more like a physical bombardment treatment (which may not leave the atoms in the photoresist material), rather than a chemical treatment (which may implant atoms into the photoresist material).

Figure 44B:
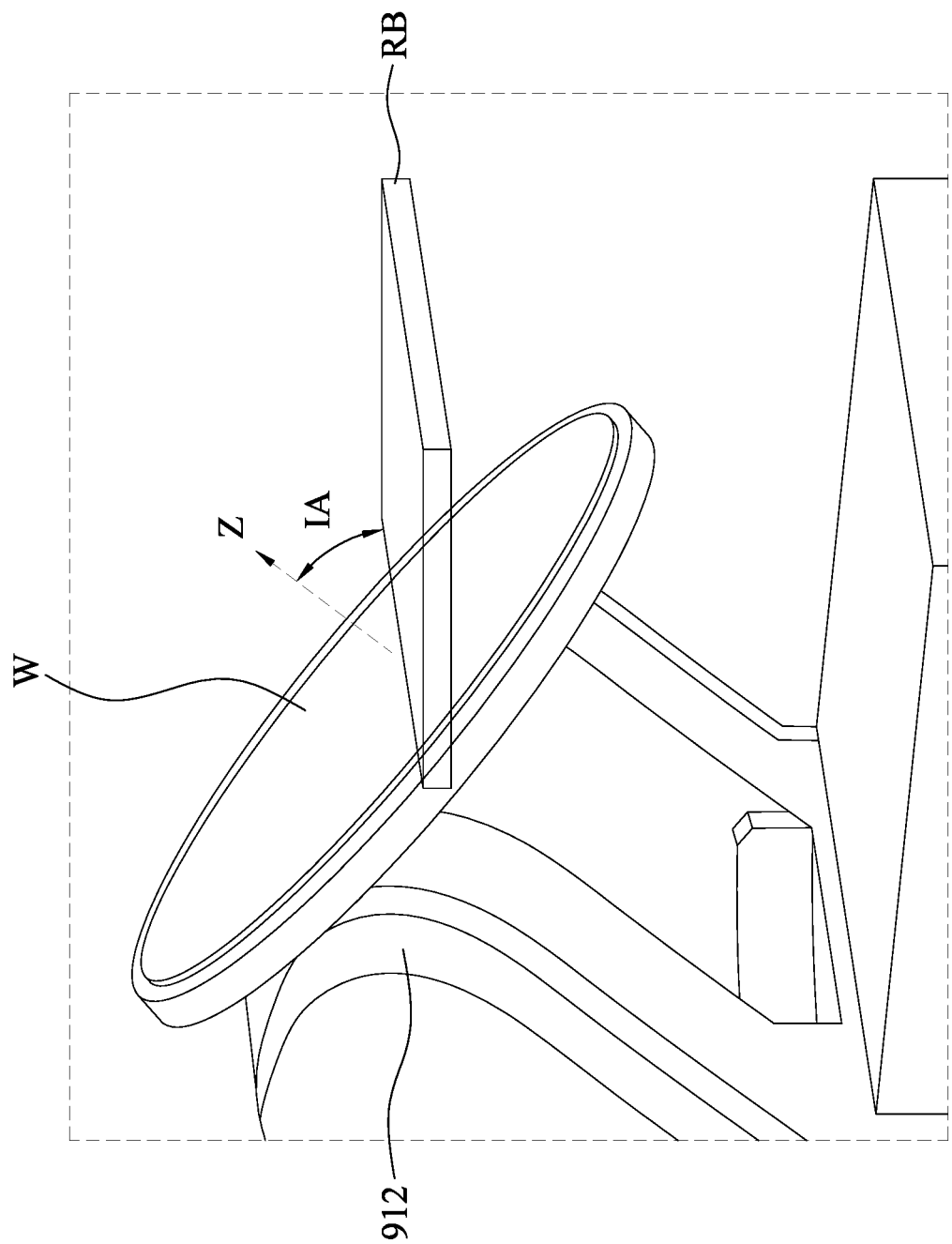

Referring to FIG. 44A and 44B, the beam RB may be controlled to incident onto the wafer W with an incident angle IA about a direction Z normal to the major surface of the wafer W (circular surface if the wafer is circular), which is sustainingly parallel with the X-Y plane (referring FIG. 14-17). As aforementioned, the incident angle IA may be in a range from about 0 degree to about 80 degrees, for example about 0 degree to about 60 degrees, depending on the limitation of the semiconductor fabrication tool 900.

The semiconductor fabrication tool 900 may further include a wafer stage 912 capable of moving the wafer W up and down and rotating the wafer W in a clockwise or counterclockwise direction. As shown in FIGS. 44A and 44C, the wafer stage 912 can move the wafer W between position WP and WP' in a translation motion. By the movement of the wafer stage 912, chips of the wafer W (e.g., aforementioned substrate 410) can be scanned up and down with respect to the ribbon beam RB. Furthermore, the wafer W can be rotated about an Z direction normal to the major surface of the wafer W, which is sustainingly parallel with the X-Y plane, such that the beam direction can be changed with respect to the direction X when view from above.

As show in FIGS. 44B and 44D, a beam direction with the incident angle IA about the direction Z may have a vector component (indicated as the direction BD) on the surface of the wafer W (e.g., X-Y vector component on the X-Y plane), and the X-Y vector component (indicated as the direction BD in FIG. 44D) may have an angle AG with respect to the direction X. The angle AG can be adjusted by the rotational control of the wafer stage 912. Through the rotational control of the wafer stage 912, the ribbon beam RB can be incident on the surface of the wafer W along various direction (e.g., directions BD1, BD1', BD2, BD2' in FIGS. 14-17).

Figure 45B:
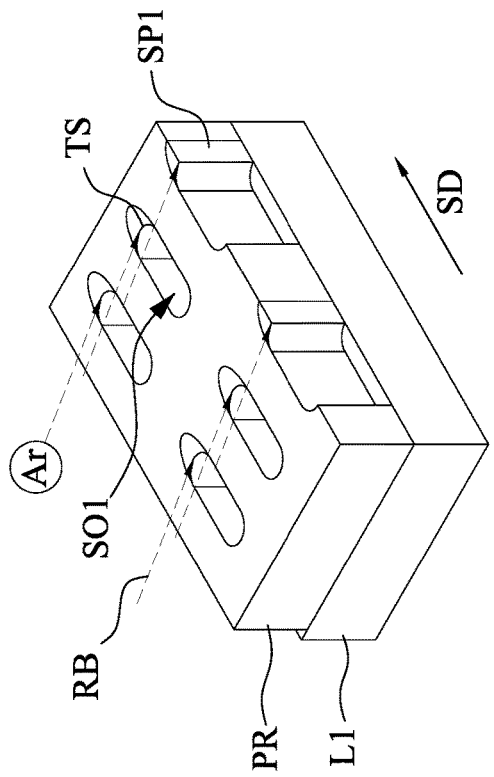
FIGS. 45A-47 illustrating an example shadowing effect during a directional treatment according to some embodiments of the present disclosure.
Figure 45A:
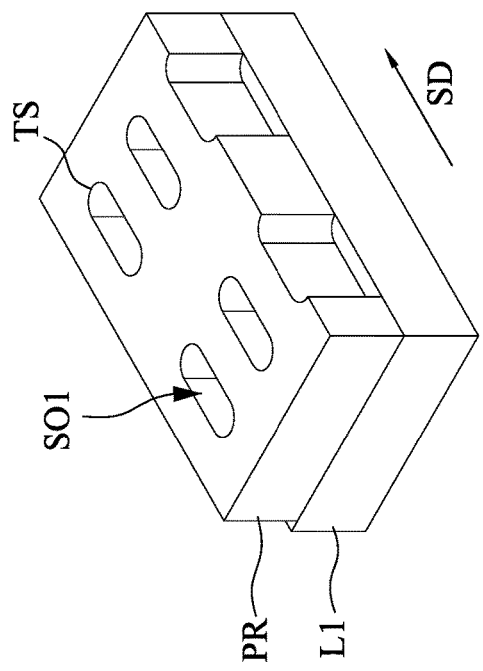

FIGS. 45A-47 illustrate an example shadowing effect during a directional treatment according to some embodiments of the present disclosure. FIGS. 45A-45C show a directional treatment according to some embodiments of the present disclosure. Referring to FIG. 45A, a photoresist layer PR having plural slot openings SO1 is formed over a layer L1 by a lithography process. The layer L1 may be a hard mask layer, BARC layer, or other suitable layers. In some embodiments, the slot openings SO1 have an elongated profile extending along a direction SD, in which a length of the slot openings SO1 along the direction SD is greater than a width of the slot openings SO1 along a direction orthogonal to the direction SD.

Figure 45C:
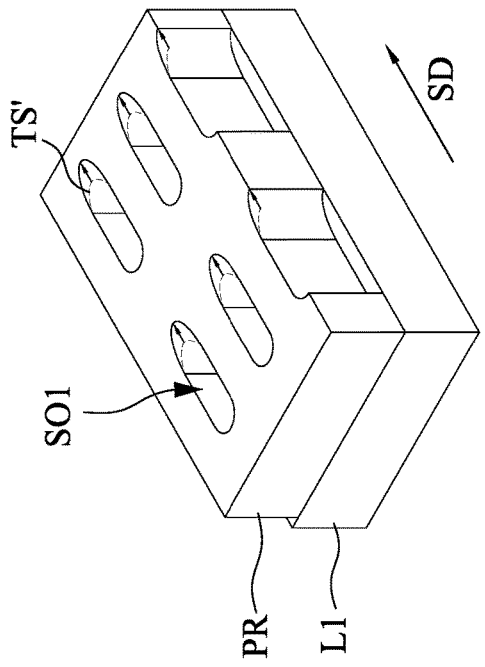

Referring to FIG. 45B, a directional treatment is performed to the photoresist layer PR. The directional treatment may be a directional ion bombardment process, performed using a beam RB with suitable species (e.g., Ar, Si, etc.). The beam RB is controlled to incident onto target sidewalls TS of the slot openings SO1 along the extending direction SD of the slot openings SO1 when viewed from above. As illustrated previously, the directional ion bombardment process may sputter off a portion of the photoresist layer PR (e.g., the portion SP1 of the photoresist layer PR), and pushing the target sidewalls TS away from a center of the slot openings SO1. The result is shown in FIG. 45C. In FIG. 45C, the arrows in FIG. 45C indicate shifts between positions of the target sidewalls TS of the slot openings SO1 (referring to FIG. 45B) before the directional ion bombardment process and positions of the corresponding sidewalls of the slot openings SO1 (referred to as sidewalls TS') after the directional ion bombardment process. The shifts indicated by the arrows may be referred to as push amount in FIG. 46B later. As shown in FIG. 45C, a length of the slot opening SO1 along the direction SD is increased by the directional ion bombardment process.

Figure 46A:
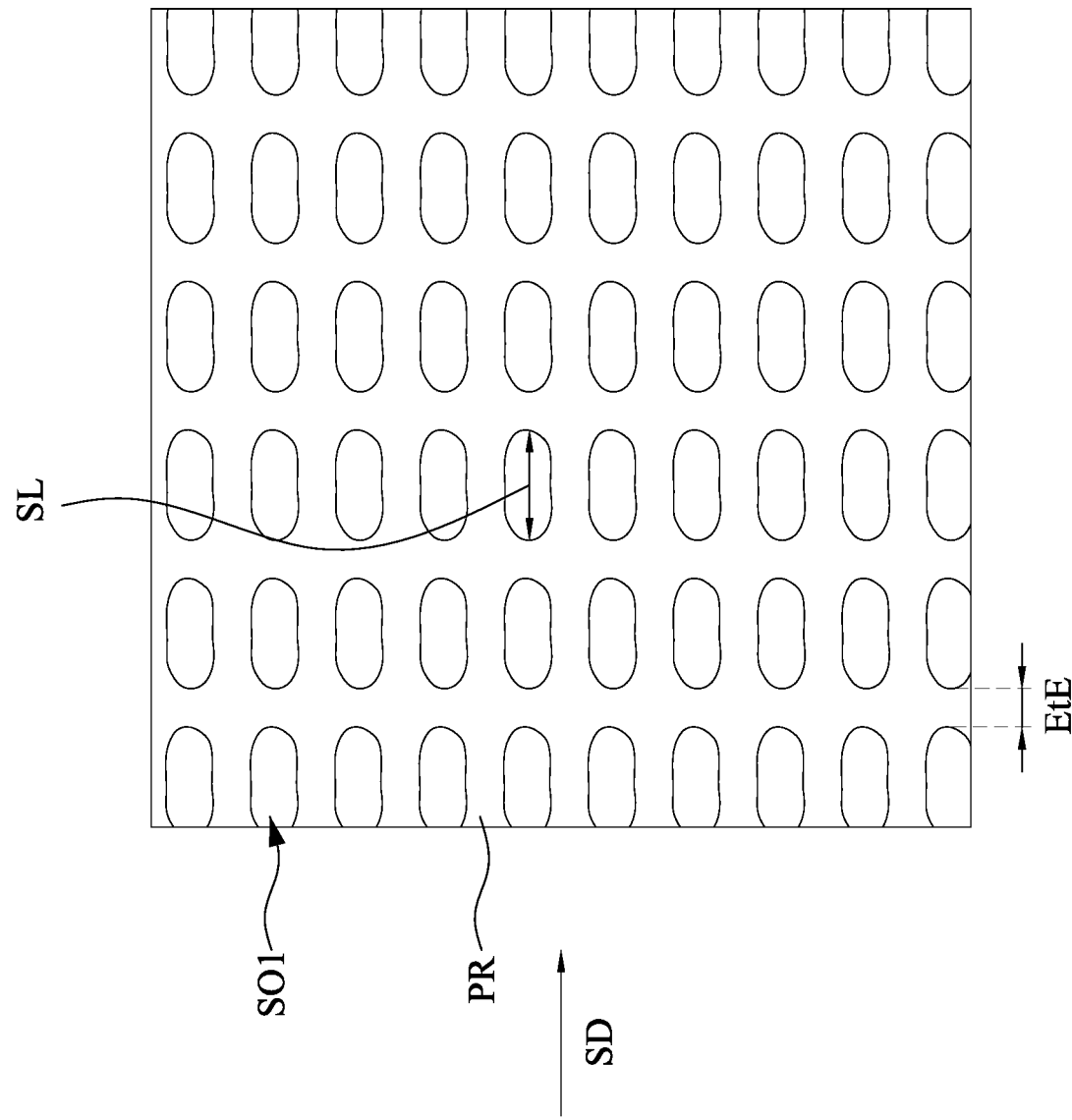
Figure 46B:
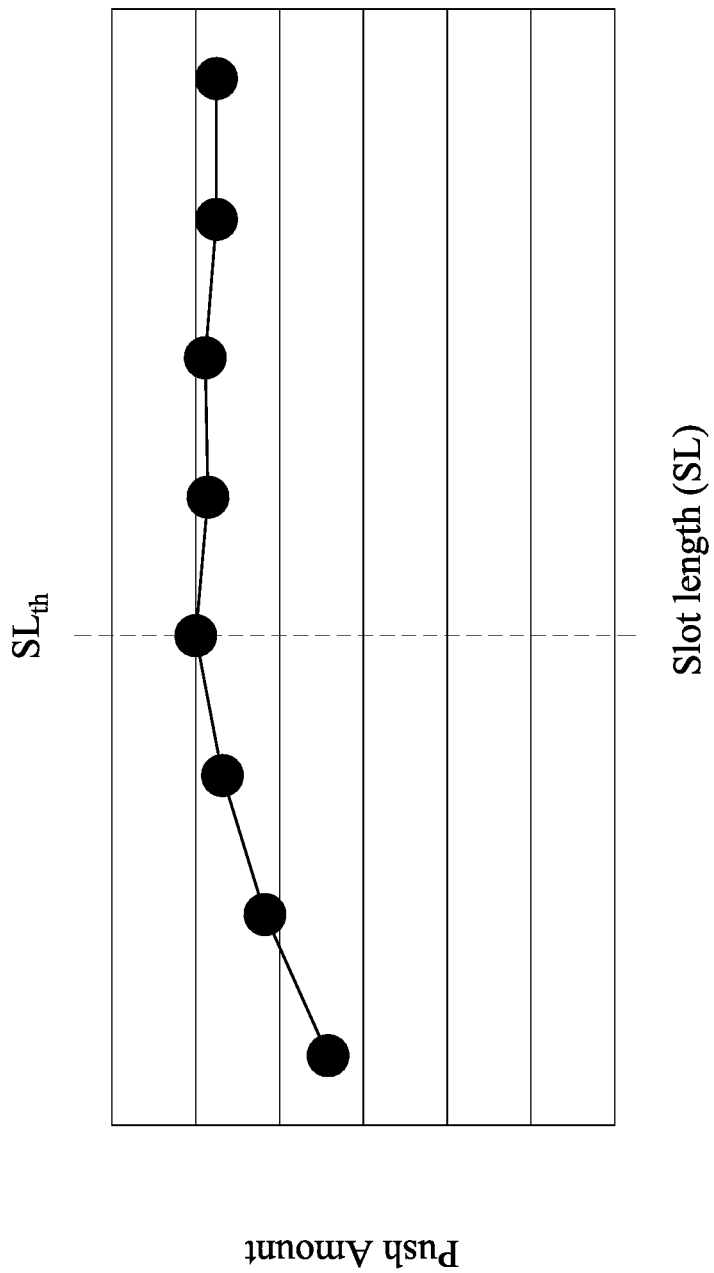

FIGS. 46A and 46B show example shadowing effect during the directional treatment. FIG. 46A is a top view of the photoresist layer PR according to some embodiments of the present disclosure. Referring to FIG. 46A, each of the slot openings SO1 have a slot length SL along the direction SD, and a distance between two slot openings SO1 along the direction SD is referred to as end-to-end distance EtE. FIG. 46B is a graph illustrating the pushing amounts by the directional treatment on slot openings SO1 having different slot lengths SL according to some embodiments of the present disclosure. In FIG. 46B, the slot length SL is shown on the horizontal axis, and the pushing amount is shown on the vertical axis. As mentioned above, the pushing amount indicates the shift between positions of the sidewalls of the slot openings SO1 before and after the directional ion bombardment process and positions. In FIG. 46B, if the directional treatment is performed on a slot opening SO1 having a slot length SL equal to or greater than a threshold value $SL_{th}$, the pushing amount may keep substantially the same. In FIG. 46B, if the directional treatment is performed on a slot opening SO1 having a slot length SL less than the threshold value $SL_{th}$, the pushing amount may decrease, which may result in longer end-to-end distance EtE. This is because of a shadowing effect resulting from size reduction of slot openings SO1.

Figure 47:
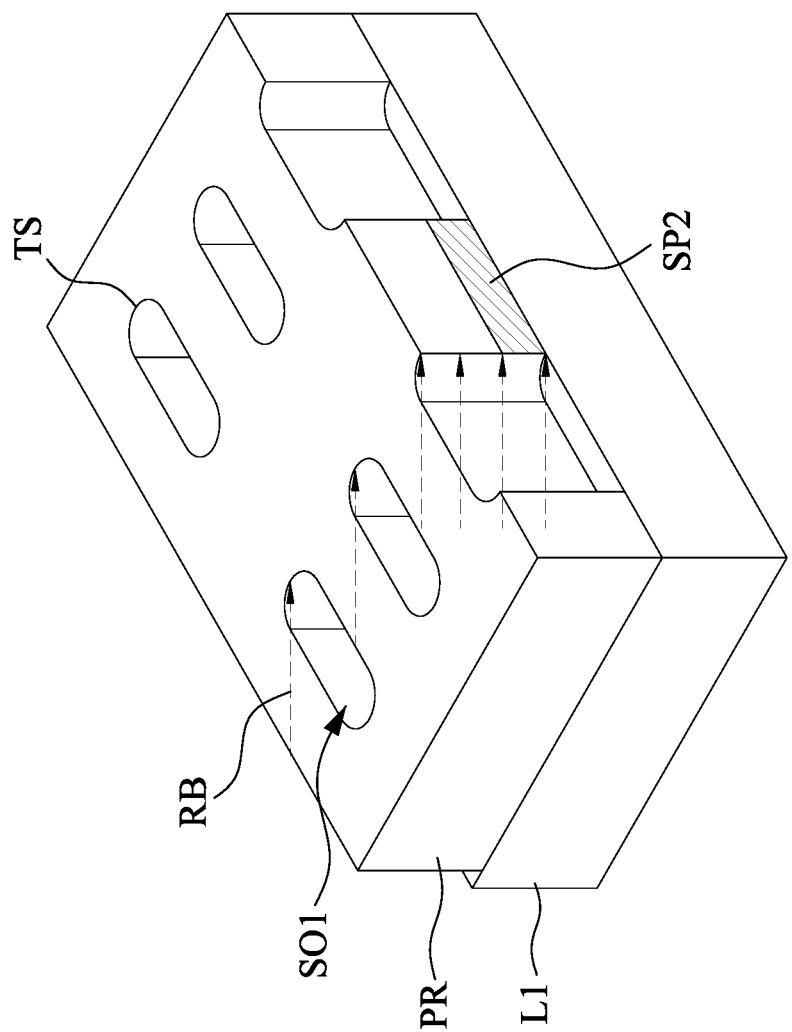

Referring to FIG. 47, in some embodiments, during the directional treatment (referring to FIG. 45B), if the slot length SL (referring to FIG. 46A) is not long enough, a lower portion SP2 of the slot openings SO1 near the target sidewalls TS may be shaded by other portions of the photoresist layer PR from the beam RB. As a result, the lower portion SP2 of the slot openings SO1 may not be bombarded by the beam RB. This may be one root cause of experimental results in FIG. 46B, where a push amount of a slot opening SO1 with a small slot length SL would be less than a push amount of a slot opening SO1 with a large slot length SL.

Based on the above discussions, it can be seen that the present disclosure offers advantages. It is understood that other embodiments may offer additional advantages, and not all advantages are necessarily disclosed herein, and that no particular advantage is required for all embodiments. One advantage is that a directional treatment hardens the photoresist layer, thereby improving etch selectivity between the photoresist layer and underlying layers. Another advantage is that the directional treatment sharpening corners of openings in the photoresist layer, thereby reducing corner rounding in the photoresist layer. By hardening the photoresist layer and reducing corner rounding in the photoresist layer, the pattern corner rounding in the underlying layer (e.g., hard mask layer, BARC layer, etc.) etched using the modified photoresist layer as an etch mask can be reduced. Therefore, the corners of the underlying layer may be sharper and less rounded during AEI. Still another advantage is that the pattern corner rounding can be reduced without degrading the lithography window.

According to some embodiments of the present disclosure, a method for forming a semiconductor device is provided. The method includes coating a photoresist film over a target layer; performing a lithography process to pattern the photoresist film into a photoresist layer; performing a directional ion bombardment process to the photoresist layer, such that a carbon atomic concentration in the photoresist layer is increased; and etching the target layer using the photoresist layer as an etch mask.

According to some embodiments of the present disclosure, a method for forming a semiconductor device is provided. The method includes coating a photoresist film over a target layer; performing a lithography process to pattern the photoresist film into a photoresist layer, wherein the photoresist layer has an opening, and the opening of the photoresist layer at least has first sidewall, a second sidewall non-parallel with the first sidewall, and a first corner connecting the first and second sidewalls; performing a first directional ion bombardment process to the first corner of the photoresist layer along a first direction, wherein the first direction is non-perpendicular to both the first and second sidewalls of the photoresist; and after the first directional ion bombardment process is complete, patterning the target layer using the photoresist layer as a patterning mask.

According to some embodiments of the present disclosure, a method for forming a semiconductor device is provided. The method includes forming a dummy gate structure over an active region in a semiconductor substrate; forming source/drain features on opposite sides of the dummy gate structure; etching the dummy gate structure to form a gate trench between the source/drain features; depositing a first work functional metal layer into the gate trench, and a second work function metal layer over the first work function metal layer; forming a coating layer over the second work functional metal layer, and a patterned photoresist layer over the coating layer; performing a directional ion bombardment process on the patterned photoresist layer, the directional ion bombardment process sharpens a first corner of an opening in the patterned photoresist layer; patterning the coating layer using the photoresist layer having the sharpened corner as a patterning mask; performing an etching process to remove a first portion of the second work functional metal layer exposed by the patterned coating layer, while leaving a second portion of the second work functional metal layer under the patterned coating layer; removing the patterning coating layer after the etching process is complete; and filling the gate trench with a gate metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dummy gate structure over an active region in a semiconductor substrate;
    forming source/drain features on opposite sides of the dummy gate structure;
    etching the dummy gate structure to form a gate trench between the source/drain features;
    depositing a first work functional metal layer into the gate trench, and a second work function metal layer over the first work function metal layer;
    forming a coating layer over the second work functional metal layer, and a patterned photoresist layer over the coating layer;
    after depositing the first and second work functional metal layers and after forming the coating layer and the patterned photoresist layer, performing a directional ion bombardment process on the patterned photoresist layer, wherein the directional ion bombardment process is performed along a direction tilted with respect to normal direction of the semiconductor substrate, and the directional ion bombardment process sharpens a first corner of an opening in the patterned photoresist layer from a top view;
    after the directional ion bombardment process, patterning the coating layer using the patterned photoresist layer having the sharpened corner as a patterning mask;
    performing an etching process to remove a first portion of the second work functional metal layer exposed by the patterned coating layer, while leaving a second portion of the second work functional metal layer under the patterned coating layer;
    removing the patterning coating layer after the etching process is complete; and
    filling the gate trench with a gate metal.

2. The method of claim 1, wherein the direction of the directional ion bombardment process is non-perpendicular to a longitudinal direction of the active region and a longitudinal direction of the gate trench from the top view.

3. The method of claim 1, wherein after the etching process is complete, the first work functional metal layer is exposed.

4. The method of claim 1, wherein filling the gate trench is performed such that the gate metal is in contact with the second portion of the second work functional metal layer and the first work functional metal layer.

5. The method of claim 1, wherein performing the directional ion bombardment process comprises:
    directing an Argon beam to the first corner of the opening in the patterned photoresist layer.

6. The method of claim 5, further comprising:
    after directing the Argon beam to the first corner of the opening in the patterned photoresist layer, directing the Argon beam to a second corner of the opening in the patterned photoresist layer.

7. The method of claim 1, wherein the directional ion bombardment process causes an increase in a carbon atomic concentration in the patterned photoresist layer.

8. The method of claim 1, wherein the directional ion bombardment process causes a decrease in an oxygen atomic concentration in the patterned photoresist layer.

9. The method of claim 1, wherein the directional ion bombardment process causes an increase in a number of Carbon-Carbon bonds in the patterned photoresist layer.

10. A method, comprising:
    forming a dummy gate structure over an active region in a semiconductor substrate;
    forming source/drain features on opposite sides of the dummy gate structure;
    etching the dummy gate structure to form a gate trench between the source/drain features;
    depositing a first work functional metal layer into the gate trench, and a second work function metal layer over the first work function metal layer;
    forming a coating layer over the second work functional metal layer, and a patterned photoresist layer over the coating layer, wherein the patterned photoresist layer has a first sidewall extending substantially along a longitudinal direction of the active region, a second sidewall extending substantially along a longitudinal direction of the gate trench, and a corner connected between the first sidewall and the second sidewall from a top view;

after depositing the first and second work functional metal layers and after forming the coating layer and the patterned photoresist layer, performing a directional ion bombardment process on the patterned photoresist layer, wherein the directional ion bombardment process is performed along a direction tilted with respect to a normal direction of the semiconductor substrate, and the directional ion bombardment process sharpens the corner of an opening of the patterned photoresist layer from the top view;

after the directional ion bombardment process, patterning the coating layer using the patterned photoresist layer having the sharpened corner as a patterning mask;

performing an etching process to remove a first portion of the second work functional metal layer exposed by the patterned coating layer, while leaving a second portion of the second work functional metal layer under the patterned coating layer;

removing the patterned coating layer after the etching process is complete; and filling the gate trench with a gate metal.

11. The method of claim 10, wherein the longitudinal direction of the active region is perpendicular to the longitudinal direction of the gate trench.

12. The method of claim 10, wherein filling the gate trench with the gate metal is performed such that the gate metal is in contact with the first work functional metal layer and the second work functional metal layer.

13. The method of claim 10, wherein performing the directional ion bombardment process comprises:
directing an Argon beam to the corner of the opening of the patterned photoresist layer.

14. A method, comprising:
forming a dummy gate structure over an active region in a semiconductor substrate;
forming source/drain features on opposite sides of the dummy gate structure;
etching the dummy gate structure to form a gate trench between the source/drain features;
depositing a first work functional metal layer into the gate trench, and a second work function metal layer over the first work function metal layer;
forming a coating layer over the second work functional metal layer, and a patterned photoresist layer over the coating layer;
after depositing the first and second work functional metal layers and after forming the coating layer and the patterned photoresist layer, performing a first directional ion bombardment process on the patterned photoresist layer, wherein the first directional ion bombardment process is performed along a direction tilted with respect to a normal direction of the semiconductor substrate, an angle between the direction of the first directional ion bombardment process and the normal direction of the semiconductor substrate is greater than zero degree and less than or equal to 80 degrees, and the first directional ion bombardment process sharpens a first corner of an opening in the patterned photoresist layer from a top view;

after the first directional ion bombardment process, patterning the coating layer using the patterned photoresist layer having the sharpened first corner as a patterning mask;

performing an etching process to remove a first portion of the second work functional metal layer exposed by the patterned coating layer, while leaving a second portion of the second work functional metal layer under the patterned coating layer;

removing the patterned coating layer after the etching process is complete; and filling the gate trench with a gate metal.

15. The method of claim 14, wherein the first directional ion bombardment process uses ions moving along a direction non-perpendicular to a longitudinal direction of the active region and a longitudinal direction of the gate trench from the top view.

16. The method of claim 14, further comprises:
performing a second directional ion bombardment process on the patterned photoresist layer, wherein the second directional ion bombardment process sharpens a second corner of the opening in the patterned photoresist layer from the top view.

17. The method of claim 16, wherein the second directional ion bombardment process is performed along a direction tilted with respect to the normal direction of the semiconductor substrate, and an angle between the direction of the second directional ion bombardment process and the normal direction of the semiconductor substrate is greater than zero degree and less than or equal to 80 degrees.

18. The method of claim 14, wherein an angle between the direction of the first directional ion bombardment process and a longitudinal direction of the active region is in a range from about 40 degrees to about 50 degrees from the top view.

19. The method of claim 14, wherein the first directional ion bombardment process causes a decrease in an oxygen atomic concentration in the patterned photoresist layer.

20. The method of claim 14, wherein the first directional ion bombardment process causes an increase in a number of Carbon-Carbon bonds in the patterned photoresist layer.

* * * * *